(12) United States Patent
Kashima et al.

(10) Patent No.: US 9,349,918 B2
(45) Date of Patent: May 24, 2016

(54) LIGHT EMITTING ELEMENT AND METHOD FOR MANUFACTURING SAME

(75) Inventors: Yukio Kashima, Tokyo (JP); Eriko Matsuura, Tokyo (JP); Hiromi Nishihara, Shizuoka (JP); Takaharu Tashiro, Shizuoka (JP); Takafumi Ookawa, Shizuoka (JP); Hideki Hirayama, Saitama (JP); Sachie Fujikawa, Saitama (JP); Sung Won Youn, Ibaraki (JP); Hideki Takagi, Ibaraki (JP); Ryuichiro Kamimura, Shizuoka (JP); Yamato Osada, Shizuoka (JP)

(73) Assignees: MARUBUN CORPORATION, Tokyo (JP); TOSHIBA KIKAI KABUSHIKI KAISHA, Tokyo (JP); RIKEN, Saitama (JP); ULVAC, INC., Kanagawa (JP)

( * ) Notice: Subject to any disclaimer, the term of this patent is extended or adjusted under 35 U.S.C. 154(b) by 0 days.

(21) Appl. No.: 14/232,517

(22) PCT Filed: May 25, 2012

(86) PCT No.: PCT/JP2012/064251
§ 371 (c)(1),
(2), (4) Date: Jan. 13, 2014

(87) PCT Pub. No.: WO2013/008556
PCT Pub. Date: Jan. 17, 2013

(65) Prior Publication Data
US 2014/0167066 A1 Jun. 19, 2014

(30) Foreign Application Priority Data
Jul. 12, 2011 (JP) ................. 2011-154276

(51) Int. Cl.
*H01L 29/15* (2006.01)
*H01L 33/32* (2010.01)
(Continued)

(52) U.S. Cl.
CPC ............... *H01L 33/32* (2013.01); *H01L 22/12* (2013.01); *H01L 33/20* (2013.01); *H01L 33/44* (2013.01); *H01L 2933/0083* (2013.01)

(58) Field of Classification Search
None
See application file for complete search history.

(56) References Cited

U.S. PATENT DOCUMENTS 5,337,328 A * 8/1994 Lang ..................... H01S 5/1032
372/102
5,955,749 A 9/1999 Joannopoulos et al.
(Continued)

FOREIGN PATENT DOCUMENTS

DE 102009057780 6/2011
EP 1526583 4/2005
(Continued)

OTHER PUBLICATIONS

International search report for International application No. PCT/JP2015/071453, dated Sep. 29, 2015 (8 pages).
(Continued)

*Primary Examiner* — Benjamin Sandvik
*Assistant Examiner* — Herve Assouman
(74) *Attorney, Agent, or Firm* — Hamre, Schumann, Mueller & Larson, P.C.

(57) ABSTRACT

A semiconductor light emitting element including, in a light extraction layer thereof, a photonic crystal periodic structure including two systems (structures) with different refractive indices. An interface between the two systems (structures) satisfies Bragg scattering conditions, and the photonic crystal periodic structure has a photonic band gap.

13 Claims, 47 Drawing Sheets

(51) Int. Cl.
  *H01L 33/20* (2010.01)
  *H01L 21/66* (2006.01)
  *H01L 33/44* (2010.01)

(56) References Cited

U.S. PATENT DOCUMENTS

| | | | |
|---|---|---|---|
| 7,520,742 B2 | 4/2009 | Motowaki et al. | |
| 8,419,995 B2 | 4/2013 | Yoneda et al. | |
| 8,703,837 B2 | 4/2014 | Kawaguchi | |
| 9,005,502 B2 | 4/2015 | Chiba et al. | |
| 9,073,102 B2 | 7/2015 | Yoshida | |
| 9,263,549 B2 | 2/2016 | Rodder et al. | |
| 2002/0167013 A1 | 11/2002 | Iwasaki et al. | |
| 2004/0016936 A1 | 1/2004 | Tanaka et al. | |
| 2004/0113166 A1* | 6/2004 | Tadatomo et al. | 257/98 |
| 2004/0114652 A1 | 6/2004 | Yoshikawa | |
| 2004/0206962 A1 | 10/2004 | Erchak et al. | |
| 2004/0252509 A1 | 12/2004 | Lin | |
| 2004/0264903 A1* | 12/2004 | Dridi | B82Y 20/00 385/129 |
| 2006/0043400 A1* | 3/2006 | Erchak | H01L 33/20 257/98 |
| 2006/0255341 A1 | 11/2006 | Pinnington et al. | |
| 2006/0284187 A1 | 12/2006 | Wierer et al. | |
| 2007/0081253 A1 | 4/2007 | Yamauchi | |
| 2007/0177644 A1* | 8/2007 | Corzine | H01L 33/20 372/44.01 |
| 2007/0257269 A1 | 11/2007 | Cho et al. | |
| 2008/0024053 A1 | 1/2008 | Fujimoto et al. | |
| 2008/0061304 A1* | 3/2008 | Huang | H01L 33/44 257/79 |
| 2008/0258160 A1* | 10/2008 | Do | H01L 33/508 257/98 |
| 2009/0184334 A1 | 7/2009 | Lee et al. | |
| 2010/0140643 A1 | 6/2010 | Cho et al. | |
| 2010/0237372 A1* | 9/2010 | Kim et al. | 257/98 |
| 2011/0068676 A1* | 3/2011 | Jeon | H01L 33/50 313/483 |
| 2012/0027038 A1 | 2/2012 | Noda et al. | |
| 2012/0112165 A1 | 5/2012 | Charlton et al. | |
| 2012/0224147 A1 | 9/2012 | Tomiyama et al. | |
| 2012/0228653 A1 | 9/2012 | Ishida et al. | |
| 2012/0247950 A1 | 10/2012 | Kaida et al. | |
| 2012/0261642 A1 | 10/2012 | Bergenek et al. | |
| 2013/0037820 A1 | 2/2013 | Tsukihara et al. | |
| 2013/0043500 A1 | 2/2013 | Orita | |
| 2013/0222770 A1 | 8/2013 | Tomiyama | |
| 2013/0320301 A1 | 12/2013 | Seo et al. | |
| 2013/0328013 A1 | 12/2013 | Inazu et al. | |
| 2014/0057377 A1 | 2/2014 | Kamimura et al. | |
| 2014/0084317 A1 | 3/2014 | Lee et al. | |
| 2014/0151733 A1 | 6/2014 | Koike et al. | |
| 2014/0167066 A1 | 6/2014 | Kashima et al. | |
| 2015/0044417 A1 | 2/2015 | Koike | |
| 2015/0214448 A1 | 7/2015 | Lee et al. | |

FOREIGN PATENT DOCUMENTS

| | | |
|---|---|---|
| EP | 2690650 | 1/2014 |
| EP | 2827361 | 1/2015 |
| EP | 2942818 | 11/2015 |
| JP | 2007109689 | 4/2004 |
| JP | 2004200209 | 7/2004 |
| JP | 2005012160 | 1/2005 |
| JP | 2006-523953 | 10/2006 |
| JP | 2006276388 | 10/2006 |
| JP | 2007-036186 | 2/2007 |
| JP | 2007-294789 | 11/2007 |
| JP | 2007-305998 | 11/2007 |
| JP | 2008030235 | 2/2008 |
| JP | 2008-053425 | 3/2008 |
| JP | 2008-098526 | 4/2008 |
| JP | 2008117922 | 5/2008 |
| JP | 2008538658 | 10/2008 |
| JP | 2008-311317 | 12/2008 |
| JP | 2008311317 | 12/2008 |
| JP | 2009-033180 | 2/2009 |
| JP | 4329374 | 9/2009 |
| JP | 2010-074090 | 4/2010 |
| JP | 2010135798 | 6/2010 |
| JP | 4610863 | 10/2010 |
| JP | 2011-086853 | 4/2011 |
| JP | 2011228513 | 11/2011 |
| JP | 2012186414 | 9/2012 |
| JP | 2013009002 | 1/2013 |
| JP | 5315513 | 10/2013 |
| JP | 2014068010 | 4/2014 |
| KR | 20090001903 | 1/2009 |
| KR | 20110131212 | 12/2011 |
| KR | 20120117892 | 10/2012 |
| KR | 20130055015 | 5/2013 |
| KR | 20140133607 | 11/2014 |
| WO | 2008041161 | 4/2008 |
| WO | 2009148138 | 12/2009 |
| WO | 2011049018 | 4/2011 |
| WO | 2012067080 | 5/2012 |
| WO | 2012127660 | 9/2012 |
| WO | 2013008556 | 1/2013 |
| WO | 2013132993 | 9/2013 |
| WO | 2013137176 | 9/2013 |
| WO | 2015133000 | 9/2015 |

OTHER PUBLICATIONS

Hirayama et al.: "Recent progress and future prospects of ALgaN-based high-efficiency deep-ultraviolet light-emitting Modes"; Japanese Journal of Applied Physics, vol. 53, 2014, pp. 1-10.

Shinji Matsui: "Current Nano-imprint processing technologies"; Monthly Display, 2005, vol. 11, No. 5, pp. 82-89.

Nakamatsu et al.: "Bilayer Resist Method for Room-Temperature Nanoimprint Lithography"; Japanese Journal of Applied Physics, 2004, vol. 43, No. 6B, pp. 4050-4053.

Korean Office Action for Korean application No. 2015-7005308, dated Oct. 21, 2015 (6 pages).

Office Action issued Jun. 1, 2015 in corresponding Korean Application (6 pages).

T. Nakashima et al.: "Improvement of the light extraction efficiency in 350-nm-emission UV-LED," Proceedings of the [[6]]60th Lecture Presentation in Spring of the Japan Society of Applied Physics, 2013, 29p-G21-10, 2 pages total (English translation provided).

Crest Research Area of the Strategic Basic Research Programs: "Light/Photon Science and Technology toward Creation of New Function," Report of Termination of Research for Research Subject: "Research of 230-350mm Band in AlGaN-based Deep Ultraviolet High-Efficiency Light Emitting Device," Research period: Oct. 2007 to Mar. 2013, 53 pages total (Partial EnglishTranslation provided).

Japan Society for the Promotion of Science "Wide-gap semiconductor/electronic device, No. 162 committee," The 74th Workshop Document: Development of DUVLED by UV Craftory, Co., Ltd., dated Apr. 22, 2011.

Xie et al., "Optimization design and fabrication of photonic crystal waveguides based on SOI using 248 nm deep UV lithography," Proceedings of SPIE, 2004, vol. 5280, pp. 798-804.

Supplementary European Search Report issued Jan. 23, 2015 in corresponding European patent application No. 12811528, 4 pages total.

Delbeke et al., "Rigorous electromagnetic analysis of dipole emission in periodically corrugated layers: the grating-assisted resonant-cavity light-emitting diode," J. Opt. Soc. Am. A, 2002, vol. 19, No. 5, pp. 871-880.

Gourley et al., "Optical properties of two-dimensional photonic lattices fabricated as honeycomb nanostructures in compound semiconductors," Applied Physics Letters, 1994, vol. 64, No. 6, pp. 687-689.

Extended European Search Report issued in the corresponding European Patent Application No. 14841324.8 dated Oct. 23, 2015 (6 pages).

* cited by examiner

Fig. 2E
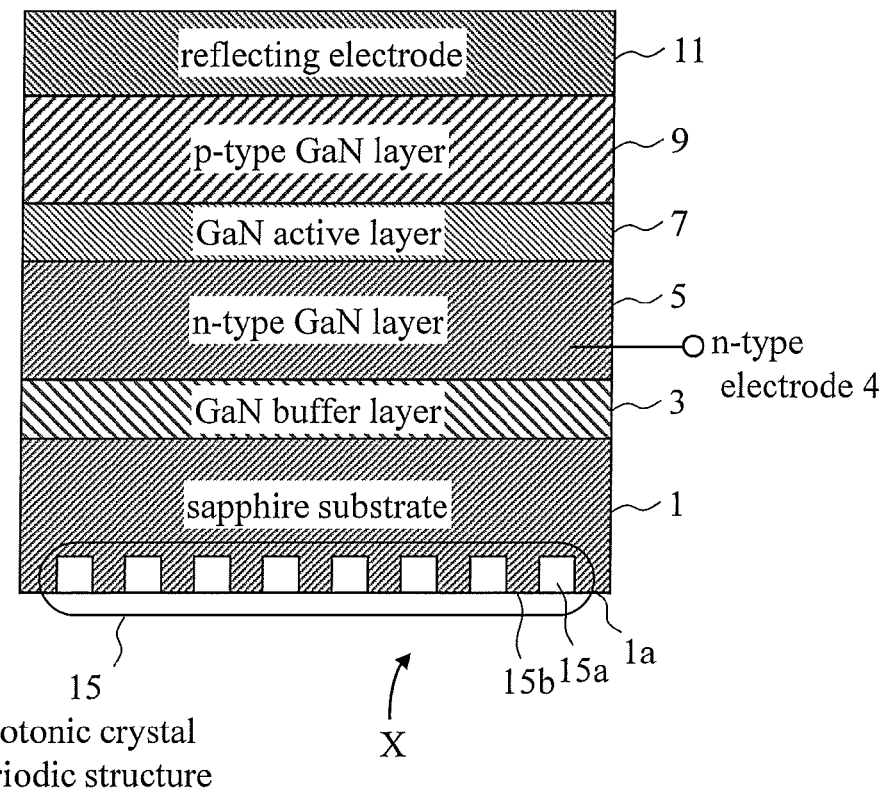
(a)
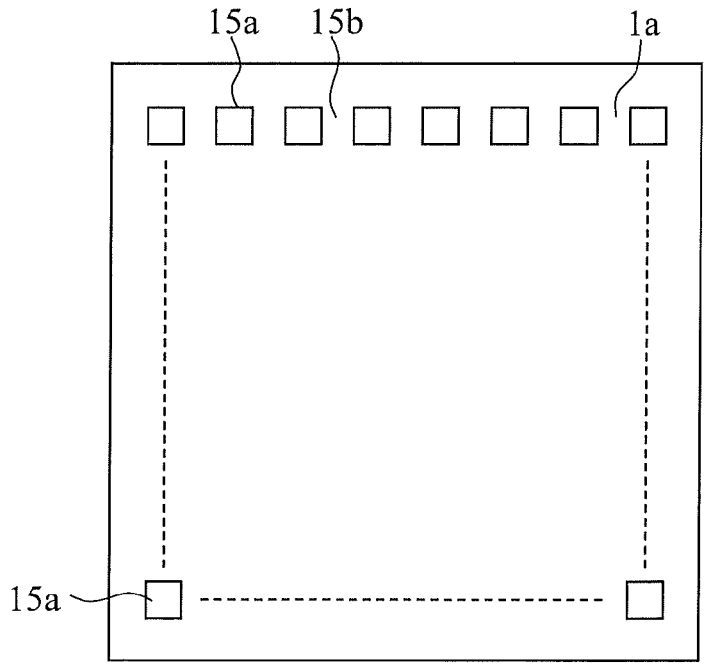
(b)

The area ratio of the circle V to the rhomboid W on the right is $2\pi/3^{0.5}*(R/a)^2$. Provided that the refractive index of each hole is $n_1$, and the refractive index of sapphire is $n_2$, $R/a=0.4$, $n_1=1.0, n_2=1.82$, the average refractive index $n_{av}$ can be represented by the following equation.

$n_{av}{}^2 = n_2{}^2 + (n_1{}^2 - n_2{}^2)*\text{area ratio}$
$= 1.82^2 + (1^2 - 1.82^2)*0.58 = 1.97$
$\therefore n_{av} = 1.40$ Fig. 18
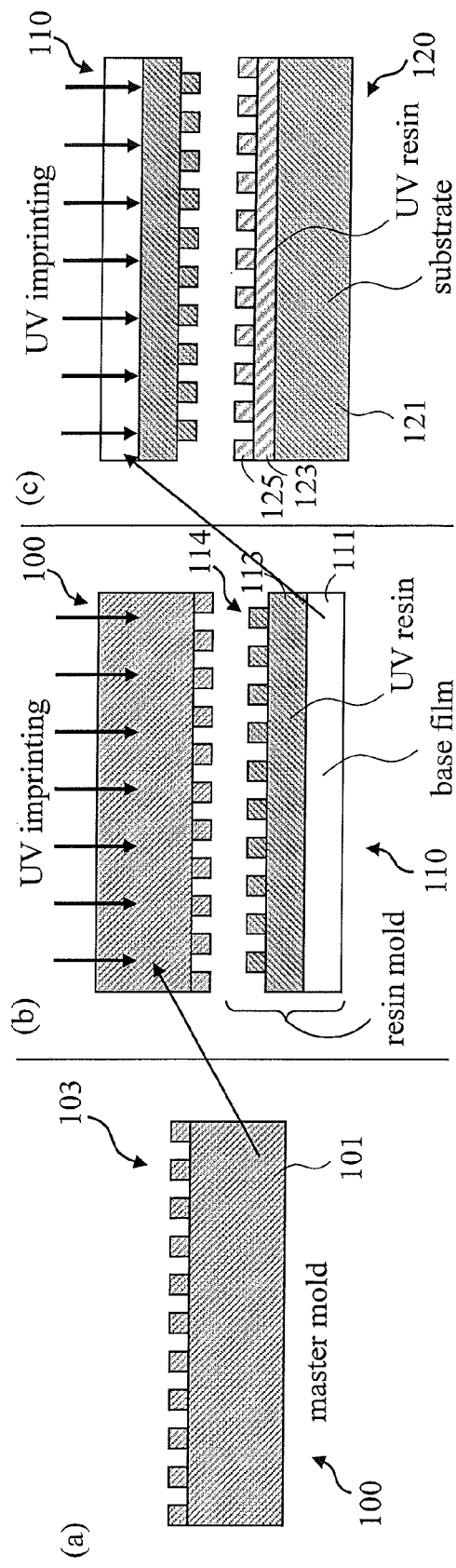
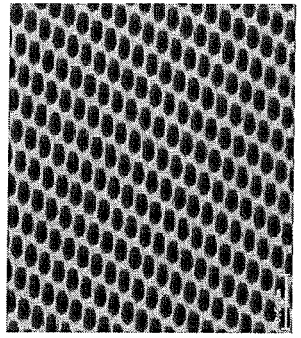
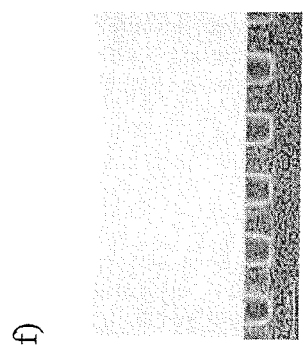
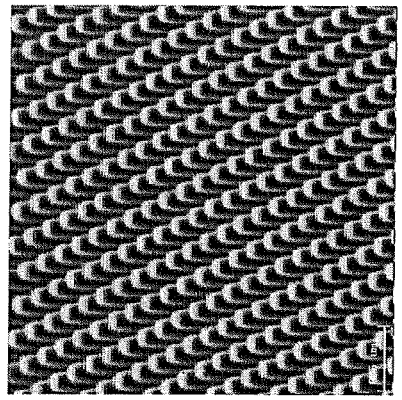
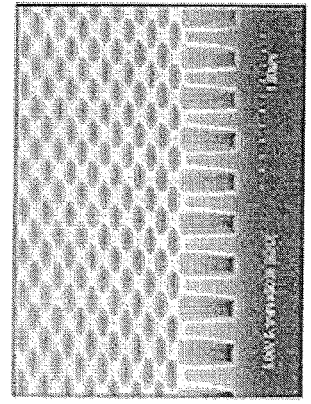

Fig. 20
mold pattern: R/a=0.3  diameter / period / depth = 155nm/263nm/361nm
targeted depth: 160nm @ aspect ratio 1.0
(a) nanoimprinted
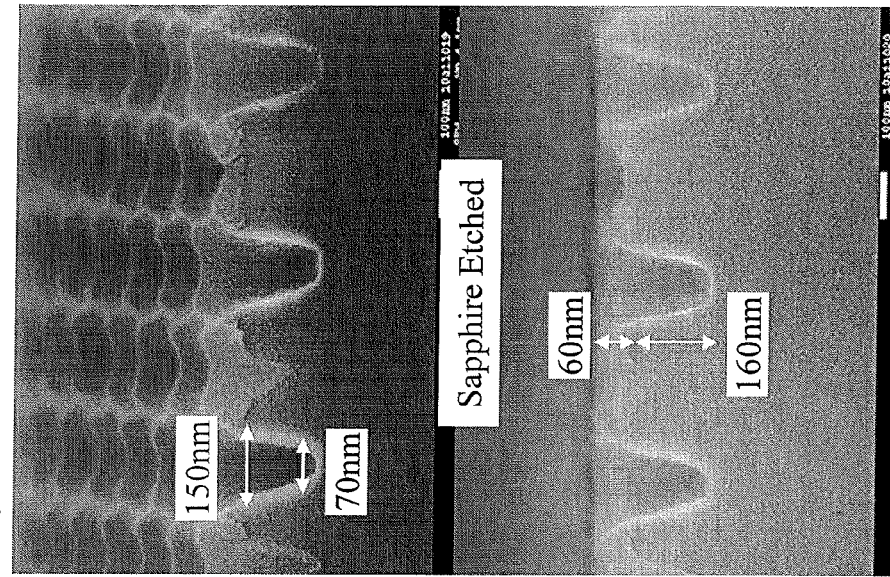
(b) dry etched
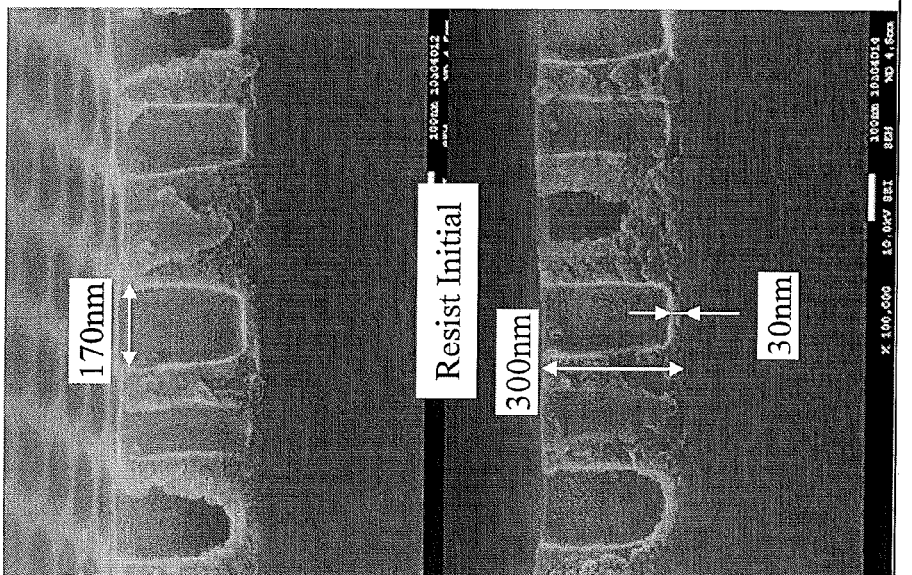

Fig. 26
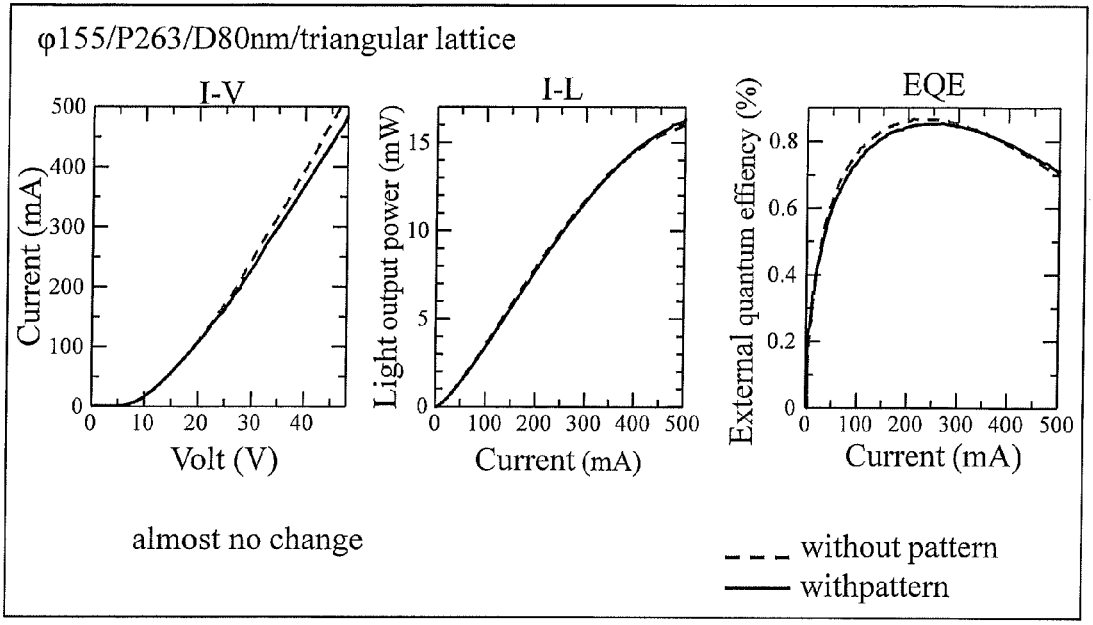
(a)
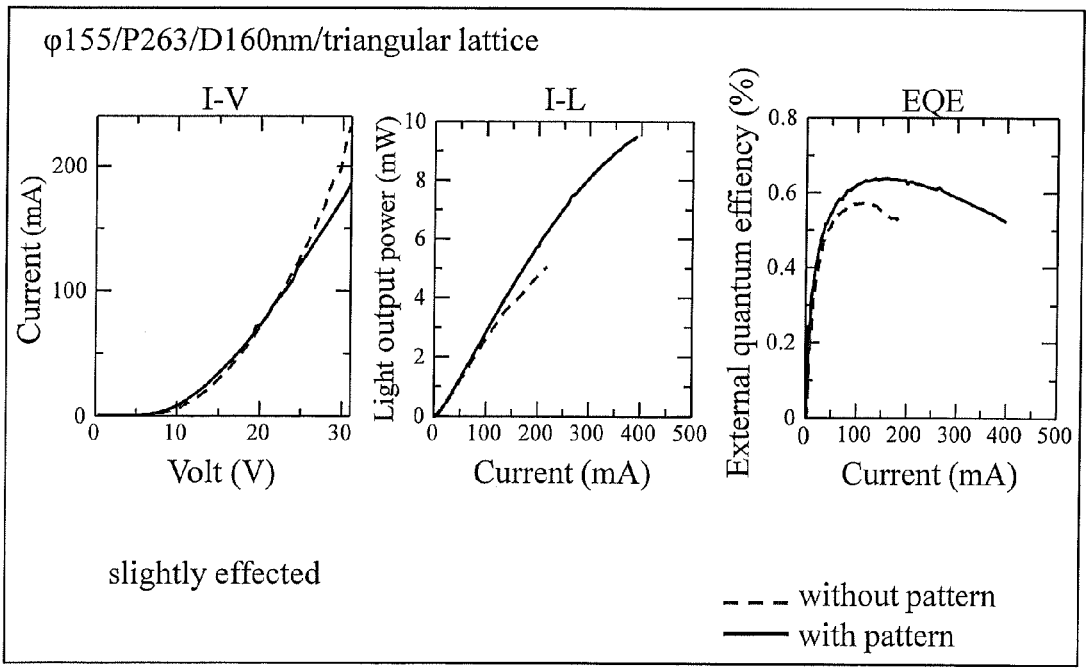
(b)

Fig. 27
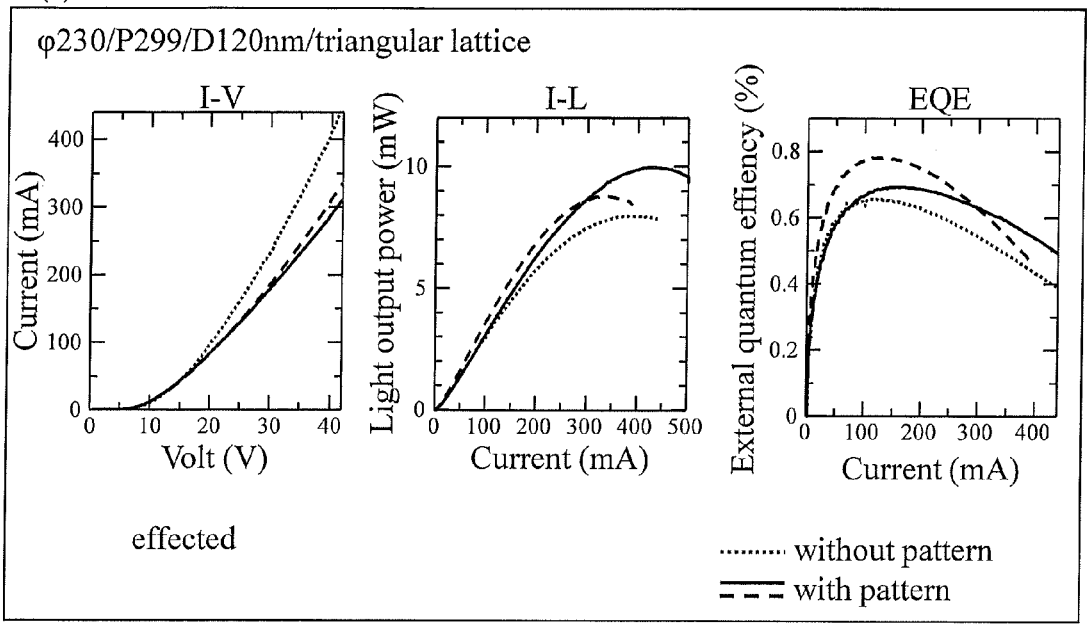
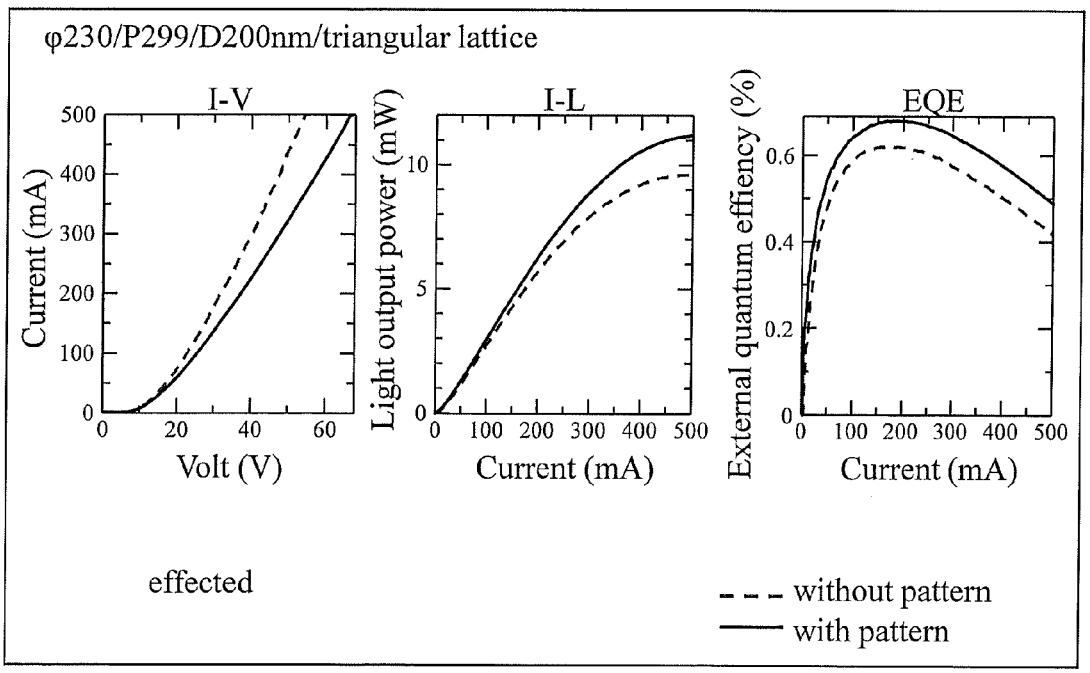

Fig. 29A

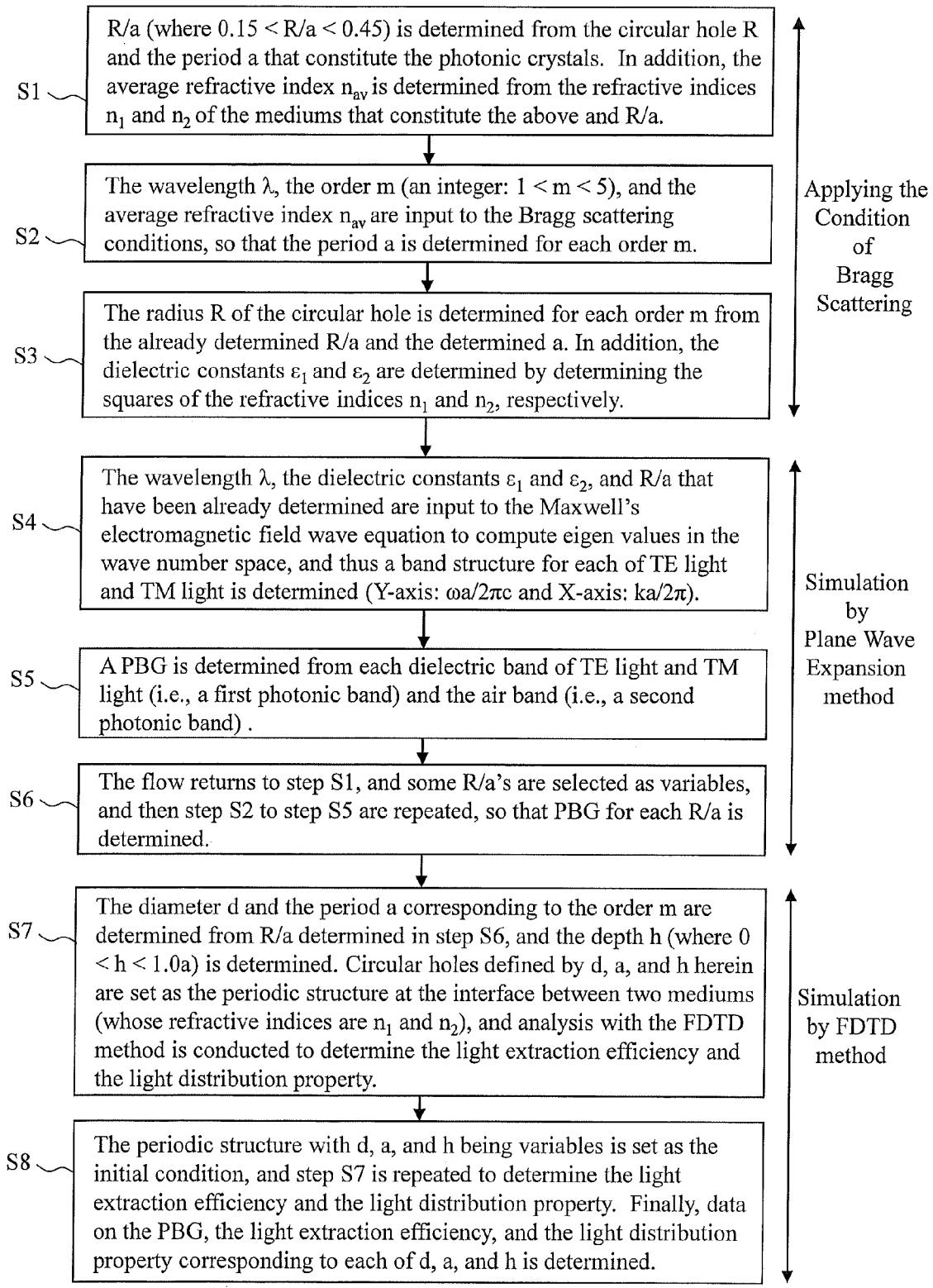

S1: R/a (where 0.15 < R/a < 0.45) is determined from the circular hole R and the period a that constitute the photonic crystals. In addition, the average refractive index $n_{av}$ is determined from the refractive indices $n_1$ and $n_2$ of the mediums that constitute the above and R/a.

S2: The wavelength $\lambda$, the order m (an integer: 1 < m < 5), and the average refractive index $n_{av}$ are input to the Bragg scattering conditions, so that the period a is determined for each order m.

S3: The radius R of the circular hole is determined for each order m from the already determined R/a and the determined a. In addition, the dielectric constants $\varepsilon_1$ and $\varepsilon_2$ are determined by determining the squares of the refractive indices $n_1$ and $n_2$, respectively.

{Applying the Condition of Bragg Scattering}

S4: The wavelength $\lambda$, the dielectric constants $\varepsilon_1$ and $\varepsilon_2$, and R/a that have been already determined are input to the Maxwell's electromagnetic field wave equation to compute eigen values in the wave number space, and thus a band structure for each of TE light and TM light is determined (Y-axis: $\omega a/2\pi c$ and X-axis: $ka/2\pi$).

S5: A PBG is determined from each dielectric band of TE light and TM light (i.e., a first photonic band) and the air band (i.e., a second photonic band).

S6: The flow returns to step S1, and some R/a's are selected as variables, and then step S2 to step S5 are repeated, so that PBG for each R/a is determined.

{Simulation by Plane Wave Expansion method}

S7: The diameter d and the period a corresponding to the order m are determined from R/a determined in step S6, and the depth h (where 0 < h < 1.0a) is determined. Circular holes defined by d, a, and h herein are set as the periodic structure at the interface between two mediums (whose refractive indices are $n_1$ and $n_2$), and analysis with the FDTD method is conducted to determine the light extraction efficiency and the light distribution property.

S8: The periodic structure with d, a, and h being variables is set as the initial condition, and step S7 is repeated to determine the light extraction efficiency and the light distribution property. Finally, data on the PBG, the light extraction efficiency, and the light distribution property corresponding to each of d, a, and h is determined.

{Simulation by FDTD method}

LIGHT EMITTING ELEMENT AND METHOD FOR MANUFACTURING SAME

TECHNICAL FIELD

The present invention relates to a light emitting element and a method for manufacturing the same. In particular, the present invention relates to increasing the performance of LED.

BACKGROUND ART

Among light emitting elements, LED (Light Emitting Diode) elements have been put into practical use as light emitting elements with high luminance and low power consumption.

For example, a LED that is a semiconductor light emitting element formed using a nitride semiconductor (hereinafter exemplarily indicated by "GaN") is expected to be used as a light source for illumination, replacing a fluorescent light. The development of such LED has been advanced with the aim of increasing lumen/watt (i.e., luminous efficacy) in terms of performance, and reducing the cost/lumen in terms of cost. Light that is emitted through recombination of holes and electrons in the active layer is released to the air from GaN. However, since the refractive index of GaN is as high as about 2.5 as compared to the refractive index of the air that is 1.0, approximately a little less than 70% of light would be confined in the semiconductor due to total reflection at the interface between GaN and the air, and finally, the light would change to heat and thus disappear. Thus, finding how to extract light from GaN to the outside is a significant object to be achieved to improve the performance and reduce the cost.

Meanwhile, high-intensity LEDs that emit deep ultraviolet rays with a wavelength of 220 to 350 nm are expected to be applied to a wide range of fields such as sterilization/water purification, various medical fields, high-density optical recording, high-color-rendering LED illumination, and a high-speed degradation process for pollutants. However, the external quantum efficiency of deep ultraviolet LEDs so far has been about several % at the highest, which is significantly low even when it is compared with the external quantum efficiency of blue LEDs that is several ten %. Thus, the deep ultraviolet LEDs have been difficult to be put into practical use.

The external quantum efficiency (EQE) of a LED is determined by the product of the internal quantum efficiency (IQE), the electron injection efficiency (EIE), and the light extraction efficiency (LEE) (i.e., represented by the equation: EQE=IQE×EIE×LEE). Thus, an improvement in light extraction efficiency, as well as improvements in internal quantum efficiency and electron injection efficiency, is a factor that significantly contributes to an improvement in external quantum efficiency.

For example, a deep ultraviolet LED element shown in FIG. 1A is formed by sequentially forming an n-type AlGaN layer 5/an AlN buffer layer 3, an active layer including AlGaN/GaN multiple quantum wells (hereinafter exemplarily indicated by an AlGaN active layer) 7, a p-type AlGaN layer 9, and a Ni/Au electrode layer 11 on a sapphire substrate 1. The n-type AlGaN layer 5 has an n-type electrode 4 formed thereon.

Light that is emitted through recombination of holes and electrons in the AlGaN active layer 7 passes through the sapphire substrate 1 as indicated by arrows L1 to L3, and is then released to the air form a rear surface 1a (i.e., a light extraction plane) thereof. Herein, in comparison with the refractive index of the air that is 1.0, the refractive index of sapphire is as high as 1.82. Provided that the incident angle is θi, the critical angle θc at the interface between the rear surface 1a of the sapphire substrate and the air is computed as 33.3° from Thus, light that has entered at an angle above the critical angle θc would be confined within the nitride semiconductor layers 3, 5, and 7 and the sapphire substrate 1 due to total reflection, and would finally change to heat and disappear (L2 and L3). The percentage of light that would disappear through such heat dissipation is as high as 70 to 90%. Thus, finding how to extract light to the outside that would otherwise disappear inside is an object to be achieved to improve the performance.

Meanwhile, a blue LED shown in FIG. 1B is formed by, for example, sequentially forming an n-type electrode 24, an n-type GaN layer 23, an active layer 25 containing GaN or the like, a p-type GaN layer 27, an ITO transparent electrode layer 29, and a $SiO_2$ protective film 31 on a sapphire substrate 21. Light that is emitted from the GaN active layer 25 is output in the upward and downward directions of the $SiO_2$ protective film, but more than 50% of light emitted from the top protective film (the refractive index of which is 1.46 if it contains $SiO_2$, for example) to the air would be totally reflected at an angle above the critical angle, and thus disappear inside. Likewise, there is also a problem in that, at the interface between the bottom n-type GaN layer 23 (which has a refractive index of 2.50) and sapphire substrate 21 (which has a refractive index of 1.78 at a wavelength of 455 nm), approximately a little less than 50% of light emitted from the n-type GaN layer 23 to the sapphire substrate 21 would be totally reflected and thus disappear inside.

In order to solve such problems, for example, in Patent Literature 1 below, ingenuity is exercised by forming holes, which are open in one of semiconductor layers including a p-type nitride semiconductor layer and an active layer in the stacked direction thereof, as a photonic crystal periodic structure with a photonic band gap, and extracting light from above and below the semiconductor layers in the stacked direction thereof while blocking light that propagates through a waveguide that is parallel with the semiconductor layers.

In addition, in Patent Literature 2, ingenuity is exercised by forming a photonic crystal periodic structure, which has periods that are set to ¼ to 4 times the wavelength of light emitted from an active layer, on the rear surface of a sapphire substrate, and extracting light to the air from the rear surface of the sapphire substrate while controlling total reflection.

In Patent Literature 3, ingenuity is exercised by forming a photonic crystal periodic structure with a photonic band as holes in an active layer, and extracting light from above and below the active layer while blocking light that propagates through a waveguide that is parallel with the active layer and semiconductor layers above and below it.

In Patent Literature 4, ingenuity is exercised by forming, after creating a predetermined LED structure, a photonic crystal periodic structure with a photonic band in an n-type semiconductor layer from which a sapphire substrate has been removed, and extracting light from the n-type semiconductor layer.

Further, in Patent Literature 5, a protrusion periodic structure (i.e., a moth-eye structure) that is less than or equal to ⅓ of the light emission wavelength is formed at the interface between a sapphire substrate and a nitride semiconductor layer, so that total reflection at the interface is suppressed, and light is extracted from the rear surface of the substrate.

In Patent Literature 6, ingenuity is exercised by forming holes, which penetrate through an ITO transparent electrode, a p-type semiconductor layer, an active layer, and an n-type semiconductor layer, as a photonic crystal periodic structure with a photonic band gap, and extracting light from above and below the layers in a direction perpendicular to the layers while blocking light that propagates through a waveguide that is parallel with the layers.

Further, in Non Patent Literature 1, ingenuity is exercised by forming a periodic structure with a moth-eye structure on the rear surface of a sapphire substrate, and extracting light while suppressing total reflection from the rear surface of the sapphire substrate.

CITATION LIST

Patent Literature

Patent Literature 1: JP 4610863 B
Patent Literature 2: JP 4329374 B
Patent Literature 3: JP 2008-311317 A
Patent Literature 4: JP 2006-523953 A
Patent Literature 5: JP 2010-74090 A
Patent Literature 6: JP 2011-86853 A Non Patent Literature Non Patent Literature 1: Japan Society for the Promotion of Science "Wide-Gap Semiconductor/Electronic Device, No. 162 Committee," The 74th Workshop Document: Development of DUVLED by UV Craftory, Co., Ltd.

SUMMARY OF INVENTION

However, with regard to the photonic crystal periodic structure or the moth-eye periodic structure in Patent Literature 1 to 6 and Non Patent Literature 1, there is no disclosure about a specific rule or method that can find out an optimum parameter for the periodic structure to maximize the light extraction efficiency.

In addition, when each document is individually seen, in Patent Literature 1, 3, and 6, a photonic crystal periodic structure is formed by perpendicularly forming holes in the n-type nitride semiconductor layer, the nitride semiconductor active layer, and the p-type nitride semiconductor layer or only in the active layer. The nitride semiconductor has problems in that it has high resistance, and thus, as the holes opened in the nitride semiconductor become larger, the resistance will be higher, and consequently, the internal quantum efficiency will decrease, which in turn could decrease the external quantum efficiency and also decrease the luminance. In addition, it is not that any periodic structure with a photonic band gap will maximize the light extraction efficiency, and there is no disclosure about a specific structure parameter for the periodic structure.

Further, in Patent Literature 2, since a periodic structure is formed on the rear surface of the sapphire substrate, a decrease in internal quantum efficiency is small. However, since a periodic structure without a photonic band gap is used, the light extraction efficiency is lower than that of an element with a periodic structure with a photonic band gap, which is problematic.

When the structure of Patent Literature 5 is applied to a deep ultraviolet LED, and crystals of the nitride semiconductor layer are grown into a protrusion structure on the sapphire surface, abnormal nuclear growth would occur, which could decrease the internal quantum efficiency. In addition, although light emitted from the active layer propagates toward the protrusion periodic structure on the sapphire surface, since the structure herein is a moth-eye structure that suppresses Fresnel reflection, it differs from a structure of increasing the light transmissivity by suppressing total reflection. Further, there are not even advantages such that the front surface luminance will increase due to complex light refraction effects that would be seen when photonic crystals with a photonic band gap are used.

Further, in Non Patent Literature 1, since a periodic structure is formed on the rear surface of the sapphire substrate, a decrease in internal quantum efficiency can be suppressed. However, the periodic structure is a moth-eye structure and has properties of not increasing the light transmissivity by suppressing total reflection of light, but suppressing Fresnel reflection. Further, such properties would not be able to increase the front surface luminance.

In Patent Literature 4, a photonic crystal periodic structure with a photonic band gap is formed on the rear surface of an n-type nitride semiconductor layer. The rear surface of the layer has a N (nitrogen)-rich composition than Ga and thus is fragile as a structure. Thus, planarization of such a surface is difficult to perform, and thus, it would be difficult to form a photonic crystal periodic structure for which high accuracy is required on the surface, and the light extraction efficiency could decrease. Further, such a structure is just a periodic structure with a photonic band gap, and is not adapted to maximize the light extraction efficiency. Further, although a nanoimprinting device is used for lithography to obtain the periodic structure, it would be difficult to, if a resin mold is not used, perform transfer that can sufficiently accommodate warping of the substrate or minute protrusions. This is because, when crystals of a nitride semiconductor layer are grown on a sapphire substrate, if the substrate is returned to the room temperature after the crystal growth conducted at a high temperature close to 1000° C., warping of the substrate by about 100 μm would be generated on the 4-inch sapphire substrate due to the difference in thermal expansion coefficient between the sapphire substrate and the nitride semiconductor. Thus, even when the sapphire substrate is peeled off after the crystal growth of the n-type nitride semiconductor layer, the active layer, and the p-type nitride semiconductor layer and after attachment of a supporting substrate to the p-type nitride semiconductor layer, the problems of warping of the n-type nitride semiconductor layer or minute protrusions and recesses will not be solved. Consequently, the steps become complex such that microprocessing should be performed after a planarization process.

Usually, in order to conduct microprocessing on the order of nm, a technology called photolithography is used. Typical examples of devices used for photolithography include steppers, aligners, and electron beam drawing systems. Although steppers and aligners can accommodate a large area of 6 to 10 inches, they cannot accommodate warping, which is about 100 μm, of a large substrate. Further, throughput of electron beam drawing systems are not suitable for mass production.

Further, even when a desired periodic structure is formed through processing using dry etching after transfer of an organic resist through nanoimprinting lithography, the shape of the pattern after the etching will not be a periodic structure as designed.

In view of the foregoing problems of the conventional art, it is an object of the present invention to provide a high-intensity semiconductor light emitting element with improved light extraction efficiency than is conventional and consequently with emphasized front surface luminance. It is another object of the present invention to provide a designing method for a photonic crystal periodic structure with a photonic band gap that allows an increase in luminance. It is further another object of the present invention to provide a manufacturing method for forming a periodic structure as designed at a desired portion through processing.

The present invention provides a LED element with a photonic crystal structure, in particular, and provides an element in which both external quantum efficiency and luminance directivity are improved with an increase in light extraction efficiency, and a manufacturing method therefor.

According to the present invention, protrusion/recess portions including two-dimensional photonic crystals with a period that is equal to the wavelength of light in a medium are formed through processing on the rear surface of a sapphire substrate, at the interface between the front surface of a sapphire substrate and a GaN layer, or on a protective film, whereby a band structure is formed for light at the interface, and an energy region (i.e., a photonic band gap) through which light cannot propagate is generated.

Light with a wavelength in the photonic band gap cannot propagate through a plane in which the periodic structure is formed, and propagates only in a direction that is perpendicular to the plane. Thus, light that has been emitted from the active layer and arrived at the rear surface of the sapphire substrate, the interface between the front surface of the sapphire substrate and the GaN layer, or the protective film is released to the air without being totally reflected by the interface with the air.

The present invention provides a semiconductor light emitting element including, in a light extraction layer thereof, a photonic crystal periodic structure including two structures with different refractive indices. An interface between the two structures satisfies Bragg scattering conditions, and the photonic crystal periodic structure has a photonic band gap.

In particular, when a photonic crystal periodic structure with which the maximum photonic band gap is provided is selected, the light extraction efficiency improves, and consequently, the front surface luminance can be emphasized.

As the structure of the semiconductor light emitting element, the light extraction layer is preferably formed not in the GaN-based crystalline layer but in one of a substrate made of sapphire or the like or a protective film made of $SiO_2$ or the like.

Further, according to the present invention, the semiconductor light-emitting element with the photonic crystal periodic structure includes a light extraction plane on the rear surface of the substrate, an MN buffer layer provided on the substrate, an n-type AlGaN layer provided thereon, an active layer provided thereon, and a p-type AlGaN layer provided thereon. The light extraction plane satisfies the Bragg scattering conditions and has a photonic band gap, and the photonic band gap preferably becomes maximum.

Alternatively, the semiconductor light emitting element with the aforementioned photonic crystal periodic structure includes a light extraction plane on the front surface of a substrate, an n-type GaN layer provided on the substrate, an active layer provided thereon, a p-type GaN layer provided thereon, a transparent electrode layer provided thereon, and a protective film, which is a light extraction plane, provided thereon. The light extraction plane satisfies the Bragg scattering conditions and has a photonic band gap, and the photonic band gap preferably becomes maximum.

In the aforementioned structure, the reason that the photonic band gap becomes maximum is as follows. The Bragg scattering conditions (where $m\lambda/n_{av}=2a$, m denotes the order, $\lambda$ denotes the wavelength of light in a vacuum, $n_{av}$ denotes the average refractive index, and a denotes the period) are satisfied, and Maxwell's electromagnetic field wave equations $\Sigma\in^{-1}(G-G')|k+G||k+G'|E(G')=\omega^2/c^2 E(G')$ and $\Sigma\in^{-1}(G-G')(k+G)*(k+G')H(G')=\omega^2/c^2 H(G)$ (where $\in^{-1}$ denotes an inverse number of a dielectric constant, G denotes a reciprocal lattice vector, $\omega$ denotes frequency, c denotes light velocity, and k denotes a wave number vector) are determined by expanding a plane wave output from the photonic crystal periodic structure by an electric field E and a magnetic field H.

When eigen values of the above equations are solved, a band structure that represents the dispersion relation between the frequency $\omega$ and the wave number vector k is obtained for each of TE (Transversal Electric) light and TM (Transversal Magnetic) light. A parameter group (i.e., the period a and the diameter d) that satisfies a relationship in which the difference between the maximum value $\omega_1 a/2\pi c$ of each dielectric band (i.e., the first photonic band) of the TE and TM light and the minimum value $\omega_2 a/2\pi c$ of the air band (i.e., the second photonic band), that is, the value of the photonic band gap=$\omega_2 a/2\pi c - \omega_1 a/2\pi c$ becomes maximum is determined, and a periodic structure is designed based on this. Such numerical value is analyzed with a FDTD method (a finite-difference time-domain method) to confirm the optimum value of the depth h of the periodic structure, luminance improvement rate, and whether the light distribution property is good or not.

Next, a master die for nanoimprinting is created. A resin mold is created to accommodate warping of a substrate, and a pattern is transferred to a resist on the substrate using the resin mold. Inversion between the pattern on the substrate and the pattern of the master die is avoided. After the nanoimprinting, the substrate is etched through ICP dry etching. In this case, since the selectivity between the etching gas and resist would greatly change depending on the material of the portion to be processed, it may be difficult to control the shape and size of the protrusions/recesses as initially designed in some cases.

Thus, it would be essential to grasp the etching bias of the material of the portion to be processed into protrusions/recesses and the resist or select an adequate resist. Herein, a die is created based on the period a, the diameter d, and the depth h determined with the aforementioned designing method, and then a resin mold is obtained from the die, and a pattern is transferred to a resist on the substrate through nanoimprinting, and then the substrate is dry-etched, and further, the resist is removed to measure the actual shape. The difference between the measured value and the design value herein is the etching bias value. When a master mold is created again by reflecting the etching bias value, and transfer, dry etching, and resist removal are conducted, a photonic crystal periodic structure as designed is completed on the rear surface of the sapphire substrate, at the interface between the front surface of the sapphire substrate and the GaN layer, or on the protective film (which is called process integration). According to the present invention, protrusion/recess portions including two-dimensional photonic crystals with a period that is equal to the wavelength of light in a medium are formed on the rear surface of the sapphire substrate, at the interface between the front surface of the sapphire substrate and the GaN layer, or on the protective film, whereby a band structure is formed for light at the interface, and an energy region (i.e., a photonic band gap) through which light cannot propagate is provided. Light with a wavelength in the photonic band gap cannot propagate through a plane in which a periodic structure is formed, and propagates only in a direction that is perpendicular to the plane. Thus, light that has been emitted from the active layer and arrived at the rear surface of the sapphire substrate, the interface between the front surface of the sapphire substrate and the GaN layer, or the protective film is released to the air without being totally reflected by the interface with the air. Consequently, the light extraction efficiency improves, which results in increased external quantum efficiency and luminance. In addition, a light emitting element with high front surface luminance is provided.

More specifically, the present invention provides a semiconductor light emitting element including a first conductive GaN layer, an active layer, a second conductive GaN layer, and a substrate or a protective film that is formed on the first conductive GaN layer or the second conductive GaN layer and forms a light extraction layer, wherein a photonic crystal periodic structure, which includes two systems (structures) with different refractive indices, is provided in the light extraction layer, an interface between the two systems (structures) satisfies Bragg scattering conditions, and the photonic crystal periodic structure has a photonic band gap.

Two systems (structures) with different refractive indices include, for example, air and a sapphire substrate, a sapphire substrate and a GaN layer, and air and a $SiO_2$ protective film.

The light extraction layer is preferably one of a substrate of a semiconductor light emitting element or a protective film formed on a surface of the semiconductor light emitting element on a side opposite to the substrate.

The photonic crystal periodic structure is preferably formed in a region of the substrate at a given depth position.

The photonic crystal periodic structure is preferably formed to include holes that are periodically formed on the rear surface of the substrate. It should be noted that the holes may include bottom portions.

Two or more photonic crystal periodic structures may also be formed in regions of a single light extraction layer at a given depth position. Alternatively, one or more photonic crystal periodic structures may be formed in a region of each of the substrate and the protective film, which are two or more light extraction layers, for example, at a given depth position, that is, two or more light extraction layers may be formed.

Examples of the formation of a photonic crystal periodic structure in a single light extraction layer include a semiconductor light emitting element with a face-down (i.e., flip-chip) structure in which the photonic crystal periodic structure is formed on each of the front surface and the rear surface of the sapphire substrate.

Examples of the formation of photonic crystal periodic structures in two or more light extraction layers include a semiconductor light emitting element with a face-up structure in which the photonic crystal periodic structures are formed on both the front surface of the sapphire substrate, which is a light extraction layer, and the front surface of the protective film made of $SiO_2$ or the like.

The photonic crystal periodic structure with the photonic band gap preferably has a photonic crystal periodic structure in which the period a and the diameter d, which are parameters of the structure, are determined by the difference between a dielectric band (a first photonic band) of one of TE light or TM light and an air band (a second photonic band), the dielectric band (the first photonic band) having been determined through computation of eigen values of Maxwell's electromagnetic field wave equations $\Sigma \in^{-1}(G-G')|k+G||k+G'|E(G')=\omega^2/c^2 E(G')$ and $\Sigma \in^{-1}(G-G')(k+G)^*(k+G')H(G')=\omega^2/c^2 H(G)$ (where $\in^{-1}$ denotes an inverse number of a dielectric constant, G denotes a reciprocal lattice vector, ω denotes frequency, c denotes light velocity, and k denotes a wave number vector), the equations having been obtained by expanding a plane wave output from the photonic crystal periodic structure by an electric field E and a magnetic field H. Further, the depth h is determined with a FDTD method.

The method of determining the depth h using the FDTD method includes determining the period a that maximizes the LEE increase rate based on the LEE increase rate of the sidewall portions of the light emitting element, the LEE increase rate of the light extraction plane portion, and the LEE increase rate of both the sidewall portions and the light extraction plane portion, and the value of the depth h is 0.5 or more times the period a.

The photonic crystal periodic structure of the light extraction layer is formed through processing using a nanoimprinting lithography method. Such processing is performed by transferring a pattern via a resin mold. The substrate may also be sapphire.

The semiconductor layer of the semiconductor light emitting element is preferably formed of a nitride semiconductor.

The nanoimprinting lithography method includes the following steps 1) to 3).

1) in creating a master die for nanoimprinting, creating a resin mold to accommodate warping of the substrate, and transferring a pattern of the resin mold to a resist on the substrate, thereby preventing inversion between a pattern on the substrate and a pattern of the master die;

2) after the nanoimprinting, performing etching of the substrate through dry etching, wherein the die is created based on a period a, a diameter d, and a depth h, and the resin mold is obtained from the die, and then the pattern is transferred to the resist on the substrate through nanoimprinting, and further, the substrate is dry-etched and a residue of the resist is removed to measure the actual shape; and 3) creating a master die again by reflecting an etching bias value that is a difference between a measured value of the actual shape and a design value, performing the transfer and the dry etching, and removing a residue of the resist.

The present invention provides a structure parameter computation method for a semiconductor light emitting element, the method being adapted to compute a parameter of a photonic crystal periodic structure, the photonic crystal periodic structure being provided in the semiconductor light emitting element and including two systems (structures) with different refractive indices, an interface between the two systems (structures) satisfying Bragg scattering conditions, and the photonic crystal periodic structure having a photonic band gap, the method comprising:

a first step of determining a dielectric band (a first photonic band) of one of TE light or TM light that has been determined through computation of eigen values of Maxwell's electromagnetic field wave equations $\Sigma \in^{-1}(G-G')|k+G||k+G|E(G')=\omega^2/c^2 E(G')$ and $\Sigma \in^{-1}(G-G')(k+G)^*(k+G')H(G')=\omega^2/c^2 H(G)$ (where $\in^{-1}$ denotes an inverse number of a dielectric constant, G denotes a reciprocal lattice vector, ω denotes frequency, c denotes light velocity, and k denotes a wave number vector), the equations having been obtained by expanding a plane wave output from the photonic crystal periodic structure by an electric field E and a magnetic field H; and a second step of determining the period a and the diameter d that are the parameters of the periodic structure from a difference between the dielectric band (the first photonic band) and the air band (the second photonic band).

The first step preferably includes a step of providing Bragg scattering conditions; inputting a wavelength λ, an order m, and an average refractive index $n_{av}$ into the Bragg scattering conditions to determine the period a for each order m; determining a radius R of a circular hole constituting the period for each order m from radius R/period of the first system that has been already determined and the determined period a, and determining dielectric constants $\in_1$ and $\in_2$ by determining squares of refractive indices $n_1$ and $n_2$; and inputting the determined wavelength λ, dielectric constants $\in_1$ and $\in_2$, and R/a into the Maxwell's electromagnetic field wave equations.

In step S1, R/a (where 0.15<R/a<0.45) is determined from the circular hole R and the period a that constitute the photonic crystals. In addition, the average refractive index $n_{av}$ is determined from the refractive indices $n_1$ and $n_2$ of the mediums that constitute the above and R/a.

The method preferably further includes a third step of determining the depth h using a FDTD method.

Further, the depth h determined in the third step is preferably determined through parameter computation using a value that is 0.5 or more times the period a.

According to the present invention, the light extraction efficiency of the semiconductor light emitting element improves, and thus, the external quantum efficiency and luminance can be increased. Further, the front surface luminance can be increased.

The present specification contains subject matter disclosed in the specification and/or drawings of Japanese Priority Patent Application JP 2011-154276 that forms the basis of the priority claim of the present application.

BRIEF DESCRIPTION OF DRAWINGS

FIG. 2E is a view illustrating a second exemplary structure of a high-intensity semiconductor blue LED in accordance with an embodiment of the present invention.

FIG. 16 is a view obtained by computing the luminance of each analyzed pattern, and converting the increase-decrease rate of luminance for when a photonic crystal pattern is provided as compared to when it is not provided, at an order of m=3, into a graph using the function of R/a.

FIG. 18 is a view illustrating an exemplary manufacturing process for the semiconductor light emitting element (LED) shown in FIG. 1.

FIG. 20 is a view illustrating an exemplary manufacturing process for the semiconductor light emitting element (LED) shown in FIG. 1.

FIG. 26 are views illustrating the measurement results of LED in Example 1.

FIG. 27 are views illustrating the measurement results of LED in Example 2.

FIG. 29A is a flowchart illustrating an exemplary process for when the depth h in step S7 is a variable of the period a (where 0<h<5.0a).

DESCRIPTION OF EMBODIMENTS

Figure 1A:
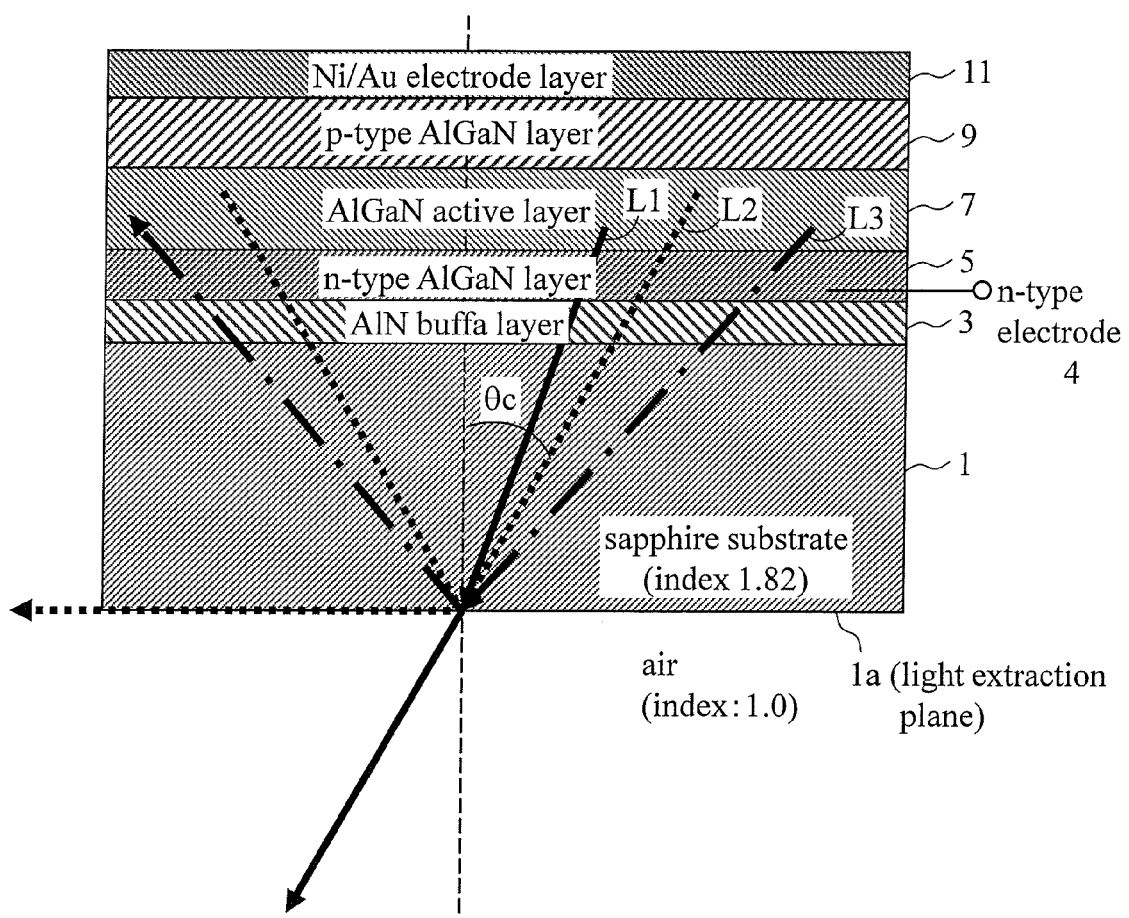
FIG. 1A is a view illustrating an exemplary structure of a deep ultraviolet LED.
Figure 1B:
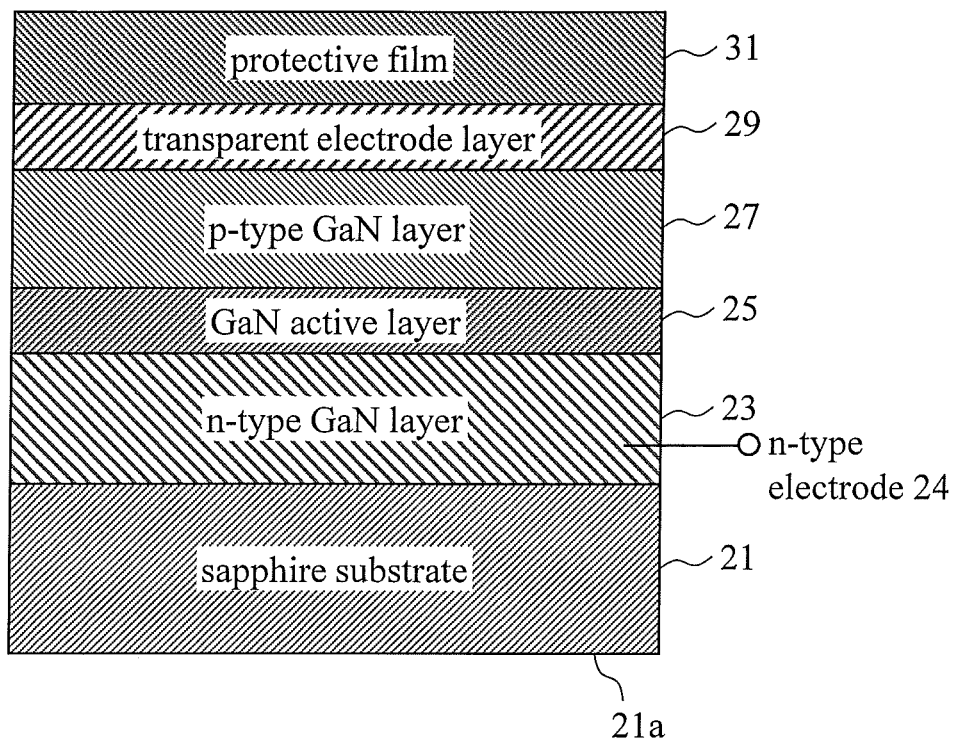
FIG. 1B is a view illustrating an exemplary structure of a blue LED.

Hereinafter, a semiconductor light emitting element in accordance with an embodiment of the present invention will be specifically described, using a deep ultraviolet LED element as an example. The structures in FIGS. 1A and 1B described above are exemplary structures that can be applied to a semiconductor light emitting element in accordance with an embodiment of the present invention. Hereinafter, an example of the structure shown in FIG. 1A will be described. The deep ultraviolet LE element shown in FIG. 1A includes a sapphire substrate (i.e., a substrate) 1, an MN buffer layer (i.e., a buffer layer) 3, an n-type AlGaN layer (i.e., an n-type clad layer) 5, an AlGaN active layer (i.e., an active layer) 7, and a p-type AlGaN layer (i.e., a p-type clad layer) 9. Light from the AlGaN active layer 7 functions as a LED that is extracted from the rear surface of the sapphire substrate 1, and the center wavelength thereof is 280 nm. The structure of the blue LED in FIG. 1B includes a sapphire substrate 21, an n-type GaN layer 23, a p-type GaN layer 27, an ITO transparent electrode layer 29, and an $SiO_2$ protective film 31, and the center wavelength is 455 nm. The n-type AlGaN layer (i.e., the n-type clad layer) 5 has an n-type electrode 4 formed thereon (hereinafter, the same).

Figure 2A:
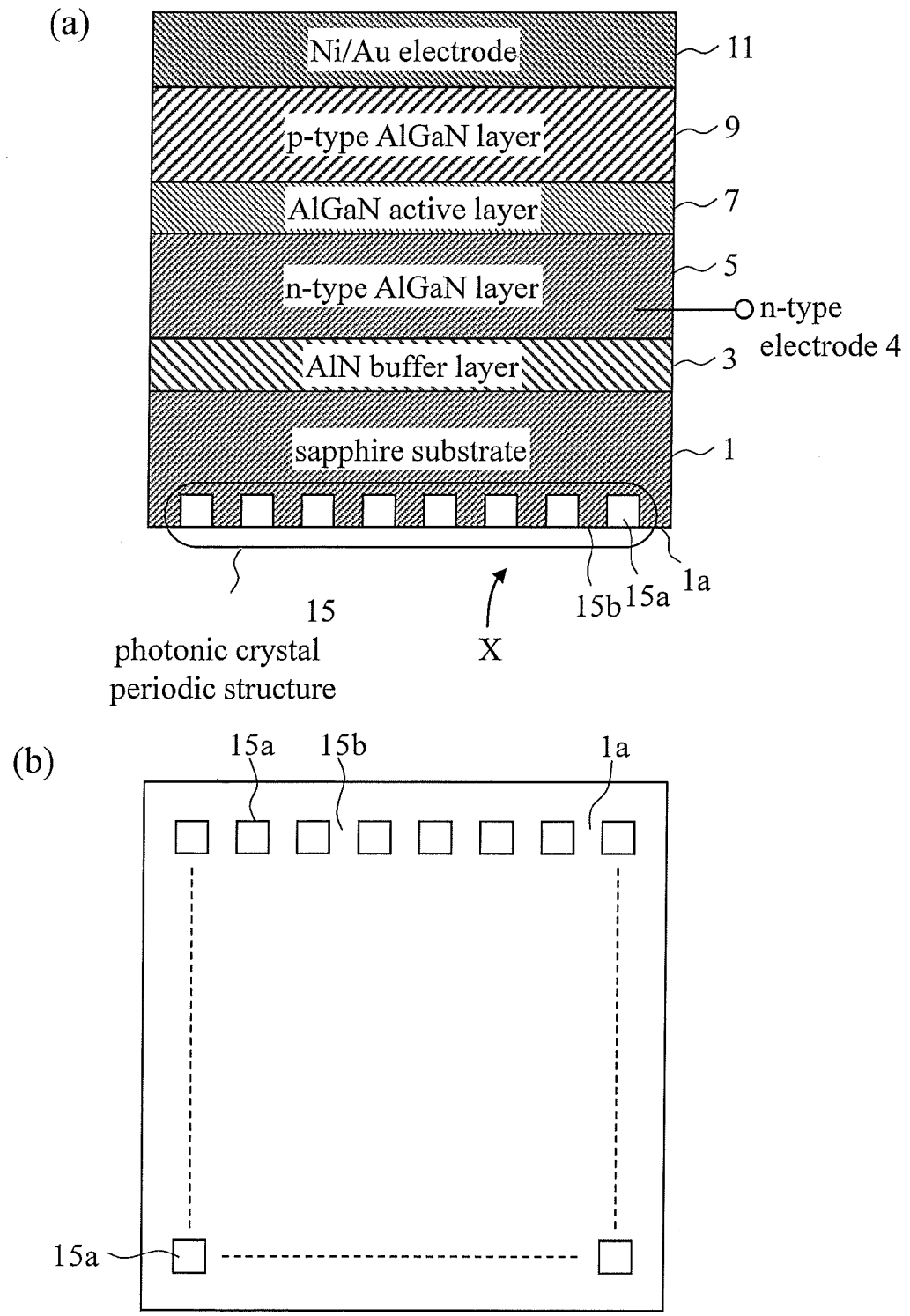
FIG. 2A is a view illustrating a first exemplary structure of a high-intensity semiconductor deep ultraviolet LED in accordance with an embodiment of the present invention.

Hereinafter, exemplary structures of semiconductor light emitting elements in accordance with this embodiment will be described with reference to examples in which an AlGaN active layer and a GaN active layer are used for a deep ultraviolet LED element and a blue LED element, respectively. FIG. 2A is a view illustrating a first exemplary structure of a deep ultraviolet LED element, and is a view corresponding to FIG. 1A. FIG. 2D is a view illustrating a first exemplary structure of a blue LED element, and is a view corresponding to FIG. 1B.

As shown in FIG. 2A(a), a two-dimensional photonic crystal periodic structure 15, for example, is formed on the rear surface (i.e., a light extraction plane) 1a of the sapphire substrate 1. In the photonic crystal periodic structure 15, as also shown in 2A(b), hole portions 15a, which are formed by opening the light extraction plane 1a to a predetermined depth, and the remaining rear surface portion 15b of the substrate, which is the rear surface of the substrate as is, are periodically formed along the X direction and the Y direction on the rear surface 1a of the substrate forming the XY two-dimensional plane (see FIG. 3). The rear surface portion 15b of the substrate may also be formed by removing a portion of the original substrate to a depth that is less than the depth of the hole portions 15a.

Figure 2B:
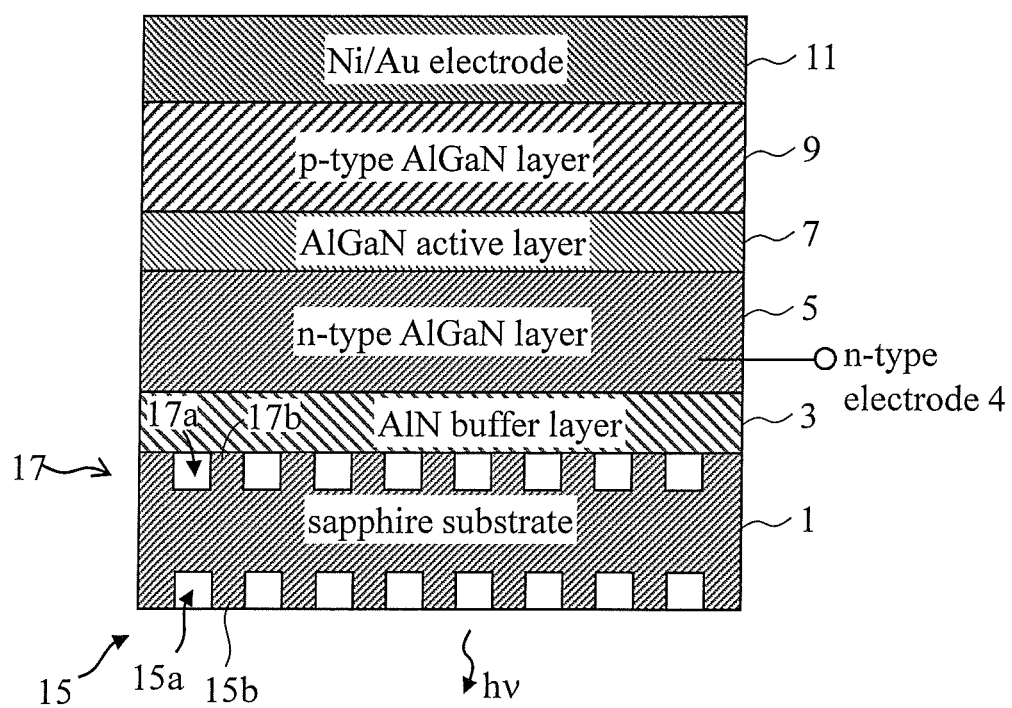
FIG. 2B is a view illustrating a second exemplary structure of a high-intensity semiconductor deep ultraviolet LED in accordance with an embodiment of the present invention.
Figure 2C:
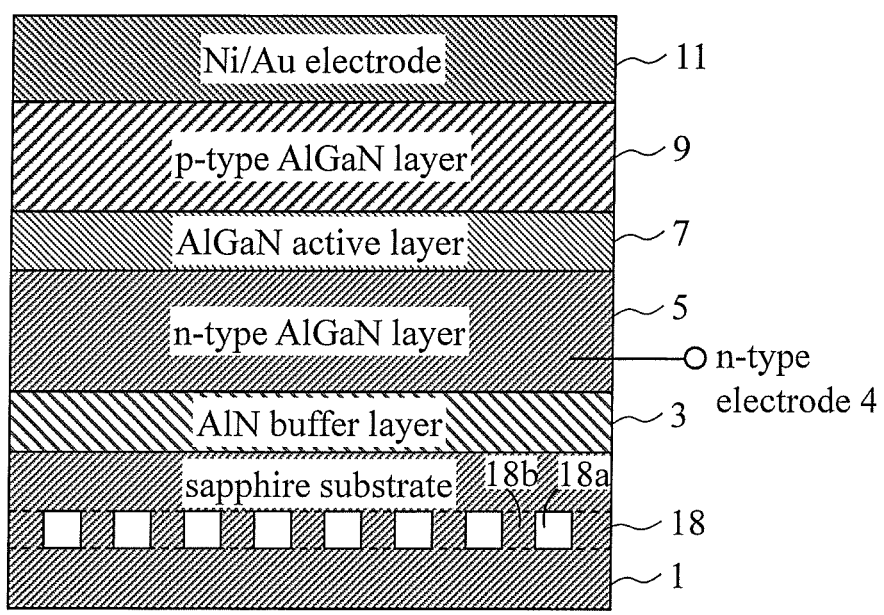
FIG. 2C is a view illustrating a third exemplary structure of a high-intensity semiconductor deep ultraviolet LED in accordance with an embodiment of the present invention.
Figure 2D:
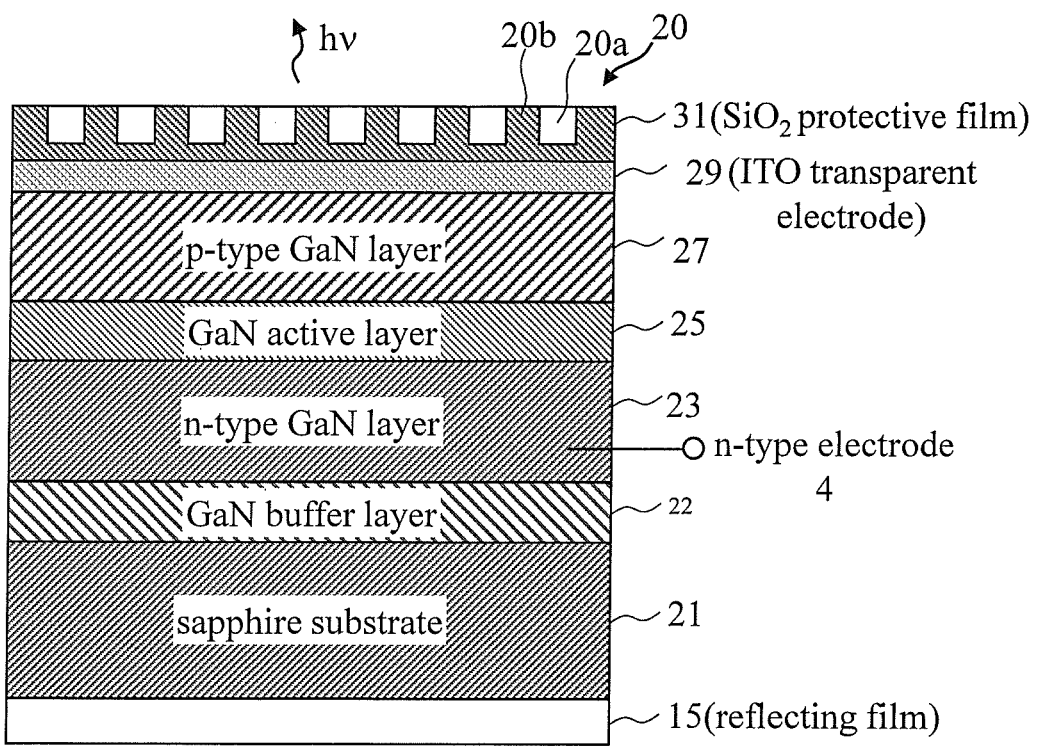
FIG. 2D is a view illustrating a first exemplary structure of a high-intensity semiconductor blue LED in accordance with an embodiment of the present invention.
Figure 2F:
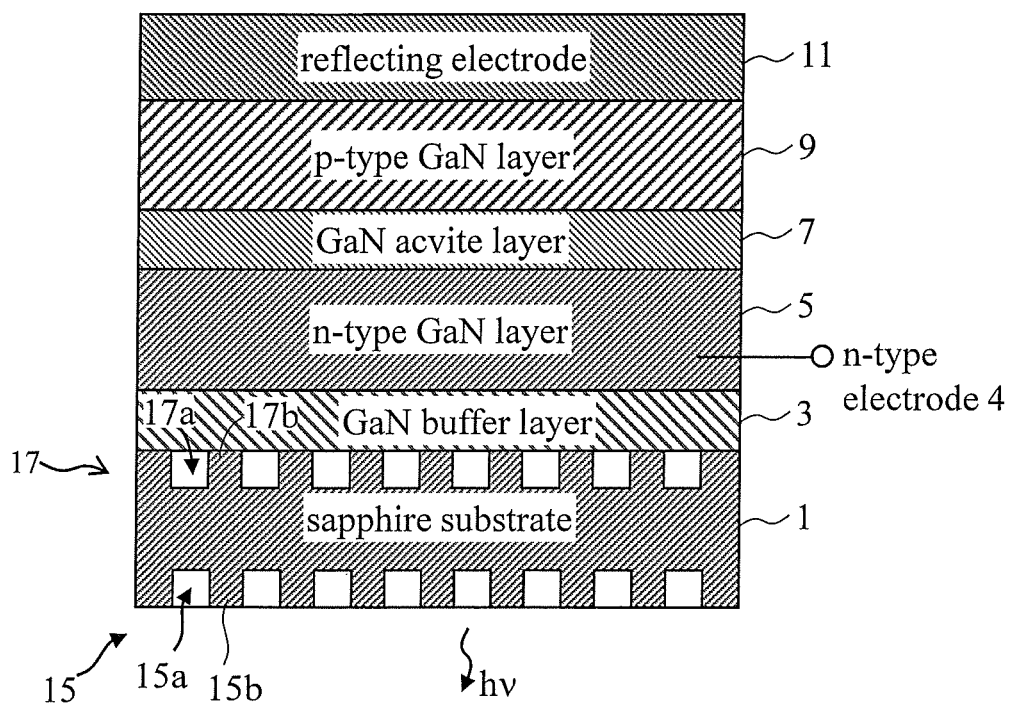
FIG. 2F is a view illustrating a third exemplary structure of a high-intensity semiconductor blue LED in accordance with an embodiment of the present invention.
Figure 3:
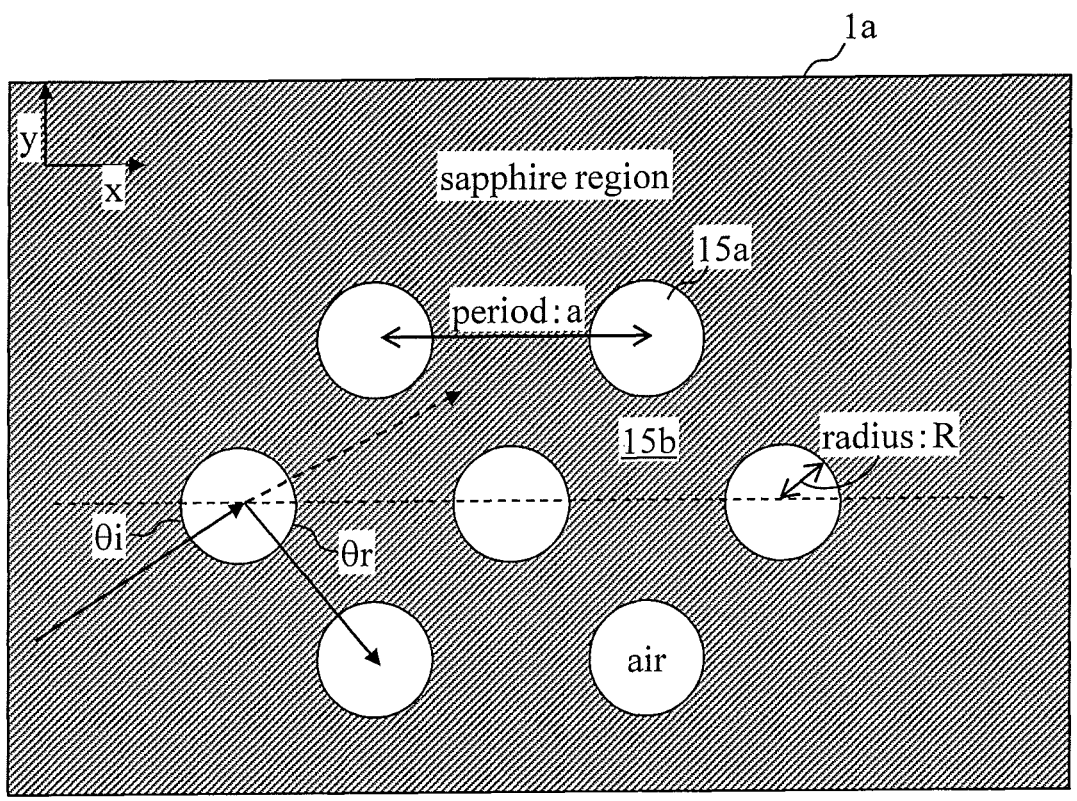
FIG. 3 is a view corresponding to FIG. 2A(b), and is a view illustrating the state of holes 15a and the remaining portion 15b seen from the rear surface of the substrate.

In FIGS. 2 and 3, the holes 15a and the rear surface portion 15b of the substrate, holes 17a and the front surface portion of the substrate, holes 18a and a given depth portion of the substrate, and holes 20a and a $SiO_2$ protective film are adopted as the two systems (structures) with different refractive indices. However, these are only examples, and a combination of structures of other materials may also be used. It should be noted that the hole portions 15a may include bottom portions as shown in FIG. 2A(a), for example. Further, the periodic structure need not be a perfect periodic structure, and furthermore, a region in which the periodic structure is formed need not be entire the XY plane.

FIG. 2B illustrates an example in which, in addition to the first periodic structure 15 shown in FIG. 2A(a), a second periodic structure 17 is formed in the sapphire substrate 1 at a position on the side of the AlN buffer layer 3 that is opposite the periodic structure 15. The second periodic structure 17 is preferably formed by opening holes in the sapphire and embedding the same material as that of the AlN buffer layer in the holes. Alternatively, pillars may be formed in the sapphire.

FIG. 2C illustrates an example in which, instead of the first periodic structure 15 shown in FIG. 2A(a), a third periodic structure 18 is formed in the sapphire substrate 1 on the side of the AlN buffer layer 3 at a given position corresponding to the periodic structure 15. The third periodic structure 18 is preferably formed by embedding a material with a lower refractive index than sapphire. Alternatively, it is also possible to, after forming the third periodic structure 18 on the rear surface of the sapphire substrate 1, attach a layer made of sapphire or another material thereto.

FIG. 2D illustrates an example in which a reflecting film 15 is provided on the rear surface side, and a fourth periodic structure 20, which has holes 20a periodically arranged therein, is provided in the SiO$_2$ protective film 31.

It should be noted that when a face-up structure is employed, it is also possible to use a configuration in which a photonic crystal periodic structure is formed on each of the front surface of the sapphire substrate and the front surface of the SiO$_2$ protective film 31.

FIG. 2E is a view illustrating a structure in which a reflecting electrode 31 is provided instead of the SiO$_2$ protective film 31 and the ITO transparent electrode 29 shown in FIG. 2D, and the photonic crystal periodic structure 15 is formed on the rear surface (i.e., the light extraction plane) 1a of the sapphire substrate 1 instead of the reflecting film 15.

FIG. 2F illustrates an example in which, in addition to the first periodic structure 15 shown in FIG. 2E(a), the second periodic structure 17 is formed in the sapphire substrate 1 at a position on the side of the GaN buffer layer 3 that is opposite the periodic structure 15. The second periodic structure 17 is preferably formed by opening holes in the sapphire 21 and embedding the same material as that of the GaN buffer layer 22 in the holes. Alternatively, pillars may be formed in the sapphire 21.

Hereinafter, an example of photic crystals having a phonic periodic structure on the surface (i.e., the rear surface) of the sapphire substrate (FIG. 2A) will be specifically described with reference to simulation results for parameters of the periodic structure. Even when other structures are used, the functions obtained thereby are similar.

First, for a determined device structure, the characteristics and the like of the structure and the element were determined through simulation. A method used for the present simulation is a method that uses the plane wave expansion method and the FDTD method (finite difference time domain method). In the plane wave expansion method, analyzing the band structure of phonic crystals can theoretically analyze the unique physical properties of the photonic crystals, and further, determining a photonic band gap can easily determine the pattern shape (i.e., diameter, period, and depth) that can maximize the light transmissivity. However, it would be impossible to obtain the intensity of the output light relative to the incident light at the interface of photonic crystals or three-dimensional information on the angular distribution. Thus, using the plane wave expansion method and the three-dimensional FDTD method in combination would be able to optimize the pattern shape in a short time.

For the simulation in accordance with this embodiment, the plane wave expansion method and the FDTD method (finite difference time domain method) are used. In the plane wave expansion method, analyzing the band structure of photonic crystals can theoretically analyze the unique physical properties of the photo crystals, and further, determining the photonic bad gap can easily determine the pattern shape (i.e., diameter, period, and depth) that can maximize the light transmissivity. However, the plane wave expansion method is not able to obtain the intensity of output light relative to the incident light at the interface of photonic crystals or three-dimensional information on the angular distribution. Thus, the plane wave expansion method is used in combination with the three-dimensional FDTD method to enable a computation process for optimizing the pattern shape in a short time.

FIG. 3 is a view corresponding to FIG. 2A(b), and is a view illustrating the two-dimensional arrangement of the holes 15a and the remaining portion 15b of the rear surface of the substrate that are seen from the rear surface of the substrate. As parameters of the periodic structure, it is first necessary to determine the period a between the holes 15a and the radius of each hole 15a.

Figure 4:
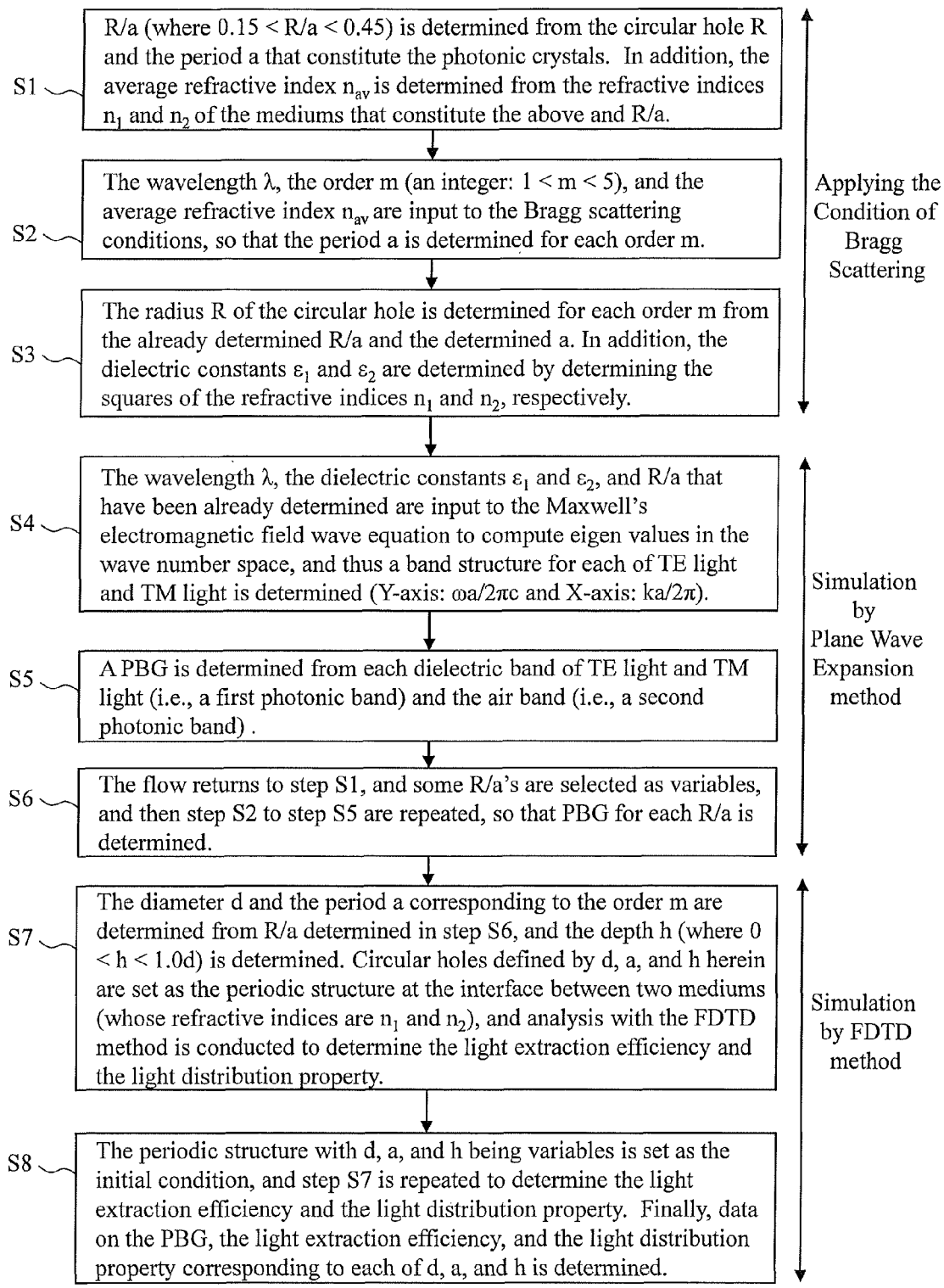
FIG. 4 is a flowchart illustrating an exemplary process for when the depth h in step 7 is a variable of the diameter d (2R) (where 0<h<1.0d).

Next, the simulation method in accordance with this embodiment will be described. FIG. 4 is a flowchart illustrating an exemplary process for when the depth h in step 7 is a variable of the diameter d (2R) (where 0<h<1.0d).

First, the Bragg scattering conditions are provided through step S1 to step S3. In step S1, R/a (where 0.15<R/a<0.45) is determined from the circular hole R and the period a that constitute the photonic crystals. In addition, the average refractive index $n_{av}$ is determined from the refractive indices $n_1$ and $n_2$ of the mediums that constitute the photonic crystals and R/a.

Figure 6:
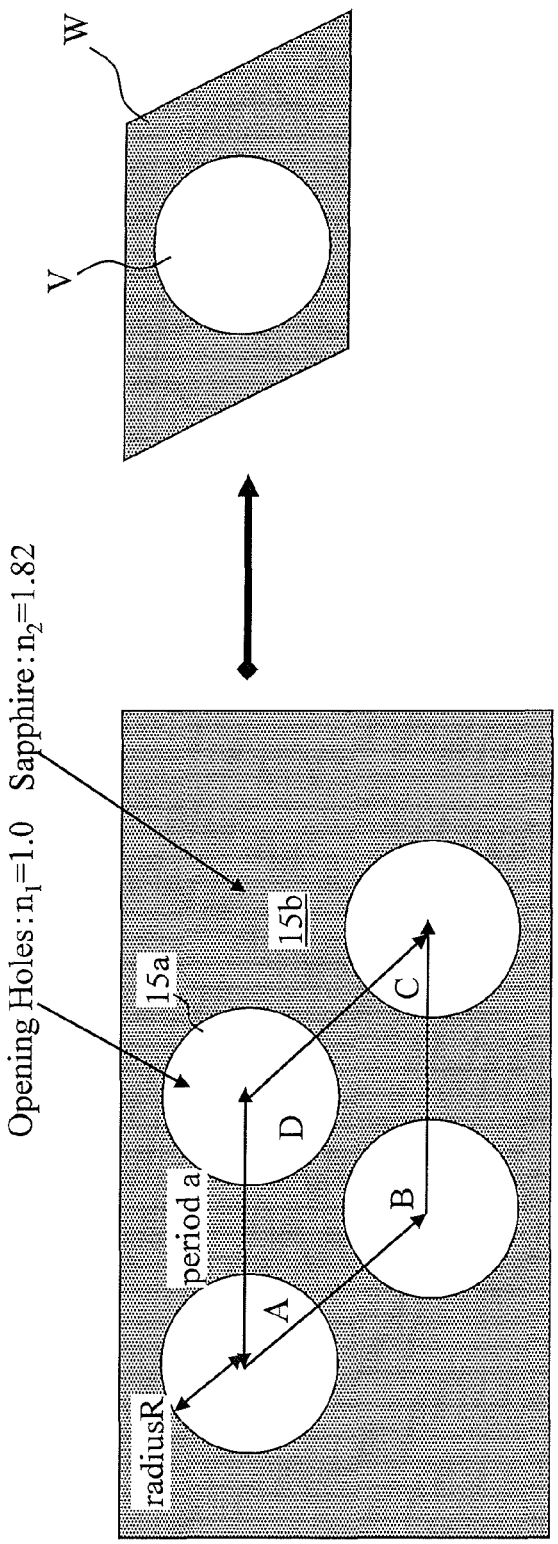
FIG. 6 is a view illustrating exemplary procedures for determining the average refractive index $n_{av}$.

FIG. 6 is a view illustrating exemplary procedures for determining the average refractive index $n_{av}$. The area ratio of the circle V to the rhomboid W on the right is $2\pi c/3^{0.5}*(R/a)^2$. Provided that the refractive index of each hole (i.e., air) is $n_1$ and the refractive index of sapphire is $n_2$, R/a=0.4, n1=1.0, n2=1.82, the average refractive index $n_{av}$ can be represented by the following equation.

$$n_{av}^2 = n_2^2 + (n_1^2 - n_2^2) * \text{area ratio}$$
$$= 1.82^2 + (1^2 - 1.82^2) * 0.58$$
$$= 1.97.$$

Thus, the average refractive index $n_{av}$ is determined as 1.40.

It should be noted that the periodic structure on the left can be actually deformed into a shape in which the rhomboid W contains a single hole V as shown to the right. This is because, combining fans A, B, C, and D on the left can obtain a single complete circle.

Next, in step S2, the wavelength λ, the order m (an integer: 1<m<5), and the average refractive index $n_{av}$ are input to the Bragg scattering conditions, so that the period a is determined for each order m (2, 3, and 4).

The reason that 1<m<5 in the equation of mλ/nav=2a is as follows.

For example, a case is considered where a photonic crystal periodic structure is formed by creating holes on the rear surface of the sapphire substrate 1. Provided that the wavelength is 280 nm, the refractive index of sapphire at 280 nm is 1.82, the refractive index of air is 1.0, and R/a is 0.4, the average refractive index $n_{av}$ is 1.40. When such values and m=2, 3, 4 are sequentially substituted into the Bragg scattering conditions, the following are satisfied.

i) When m=2,

2*280/1.40=2*a

Accordingly, a=199.
ii) When m=3,

3*280/1.40=2*a

Accordingly, a=299.
iii) When m=4,

4*280/1.40=2*a

Accordingly, a=399.

Although the value of m can be increased, this will also increase the value of the period a of photonic crystals. Thus, the order m that is not away from the wavelength 280 nm of ultraviolet rays is used. In order to find out which value of the order m will exhibit the highest light extraction efficiency, m=2 and 3 were computed. Then, the light extraction efficiency was found to be higher when m=3.

In step S3, the radius R of the circular hole is determined for each order m from the already determined R/a and the determined a. In addition, the dielectric constants $\in_1$ and $\in_2$ are determined by determining the squares of the refractive indices $n_1$ and $n_2$, respectively. The relationship between the dielectric constant $\in$ and the refractive index n is determined from $n^2 = \mu \in / \mu_0 \in_0$. Such equation is used to determine $\in_1$ and $\in_2$ by determining the squares of the refractive indices $n_1$ and $n_2$, respectively.

In step S4 to step S6, analysis with the plane wave expansion method is conducted.

First, in step S4, the wavelength $\lambda$, the dielectric constants $\in_1$ and $\in_2$, and R/a that have been already determined are input to the Maxwell's electromagnetic field wave equation to compute eigen values in the wave number space, and thus a band structure for each of TE light and TM light is determined (Y-axis: $\omega a/2\pi c$ and X-axis: $ka/2\pi$). This result is described below with reference to FIG. 7.

Figure 7:
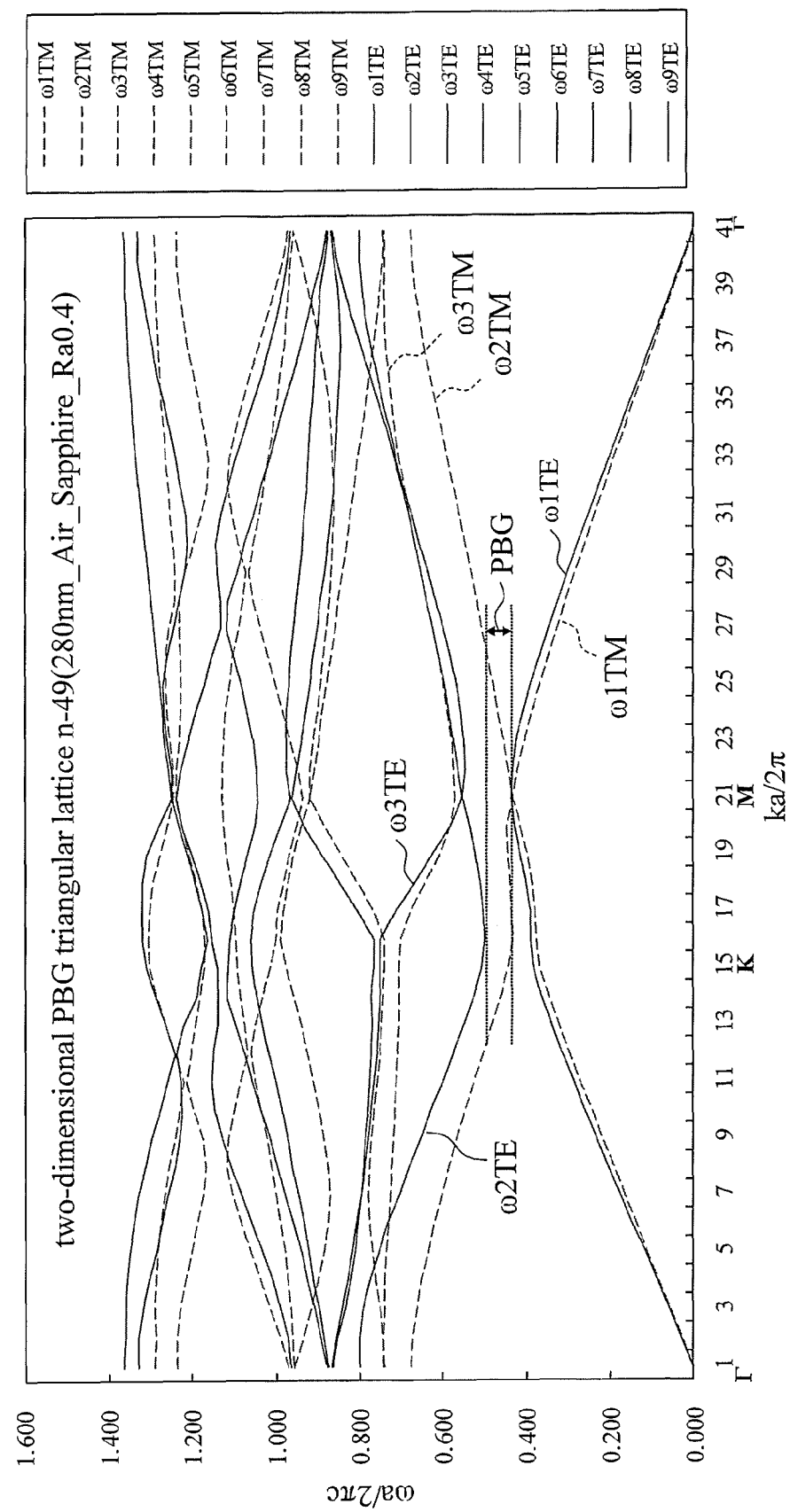
FIG. 7 is a view illustrating examples of computation results of a band structure when R/a=0.4.

In step S5, a PBG (photonic band gap) is determined from each dielectric band of TE light and TM light (i.e., a first photonic band) and the air band (i.e., a second photonic band) with reference to FIG. 7. In step S6, the flow returns to step S1, and some R/a's are selected as variables, and then step S2 to step S5 are repeated, so that some R/a's at which the magnitude of PBG is the maximum are selected, and PBG for each R/a is determined.

Next, analysis with the FDTD method is conducted in steps S7 and S8. First, in step S7, the diameter d and the period a corresponding to the order m are determined from R/a determined in step S6, and the depth h (where 0<h<1.0d) is determined. Circular holes defined by d, a, and h herein are set as the periodic structure at the interface between two mediums (whose refractive indices are $n_1$ and $n_2$), and analysis with the FDTD method is conducted to determine the light extraction efficiency and the light distribution property. For example, when the order m=3, R/a at which the PBG is the maximum is 0.4, and thus, R=120 and d=240. When the depth h (where 0<h<1.0d) is determined, it simply means that the depth is 1.0 times the diameter d. Thus, h=240.

In step S8, the periodic structure with d, a, and h being variables is set as the initial condition, and step S7 is repeated to determine the light extraction efficiency and the light distribution property. Finally, data on the PBG, the light extraction efficiency, and the light distribution property corresponding to each of d, a, and h is determined.

Figure 14:
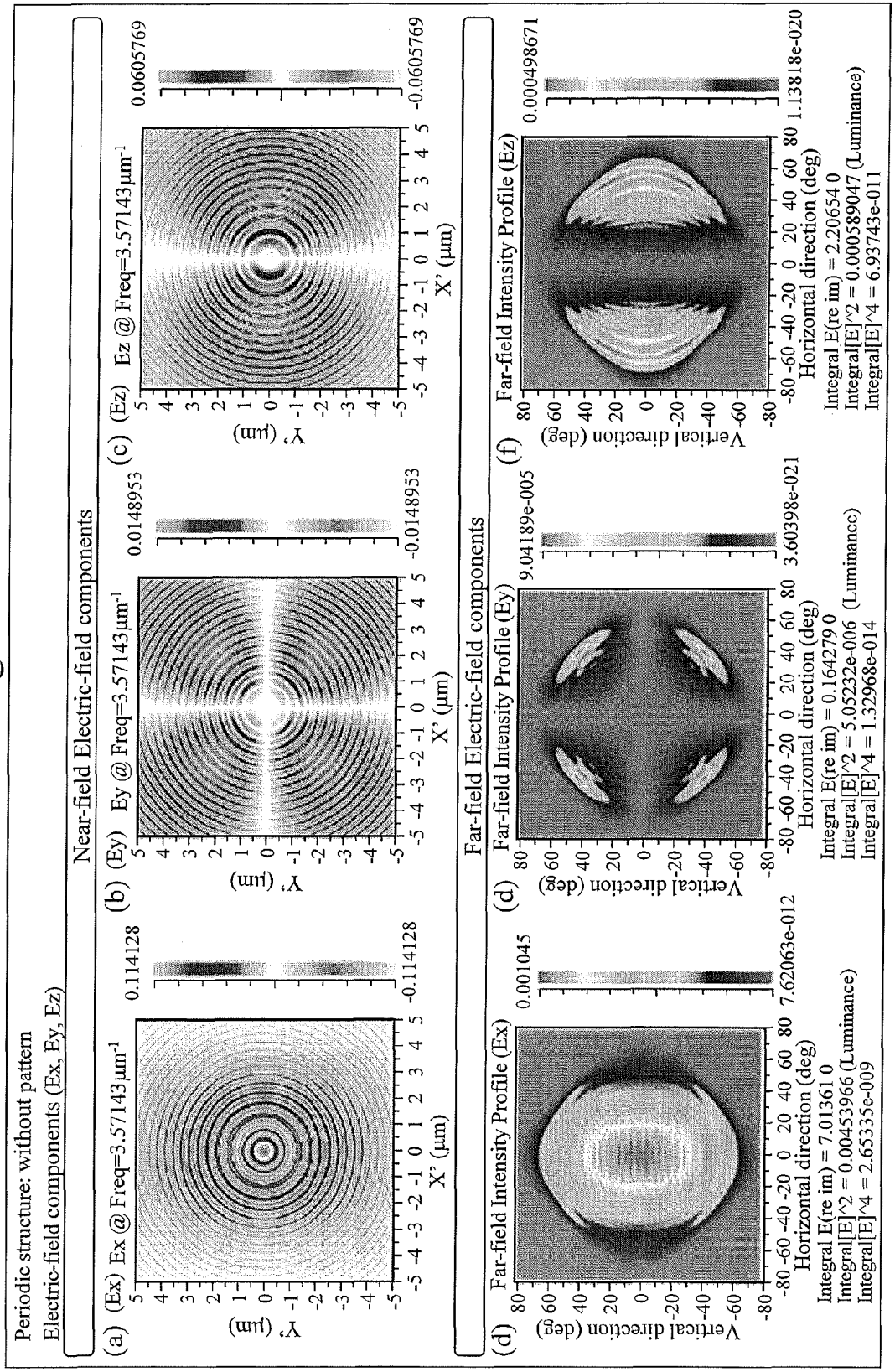
FIG. 14 is a view illustrating the distribution of intensity when a periodic structure is not provided.

The results herein are described below. The intensity I for when the periodic structure is provided in FIG. 15 is similarly determined, and the light extraction efficiency is determined from the intensity for when the periodic structure is provided/the intensity for when the periodic structure is not provided (FIG. 14).

Figure 15:
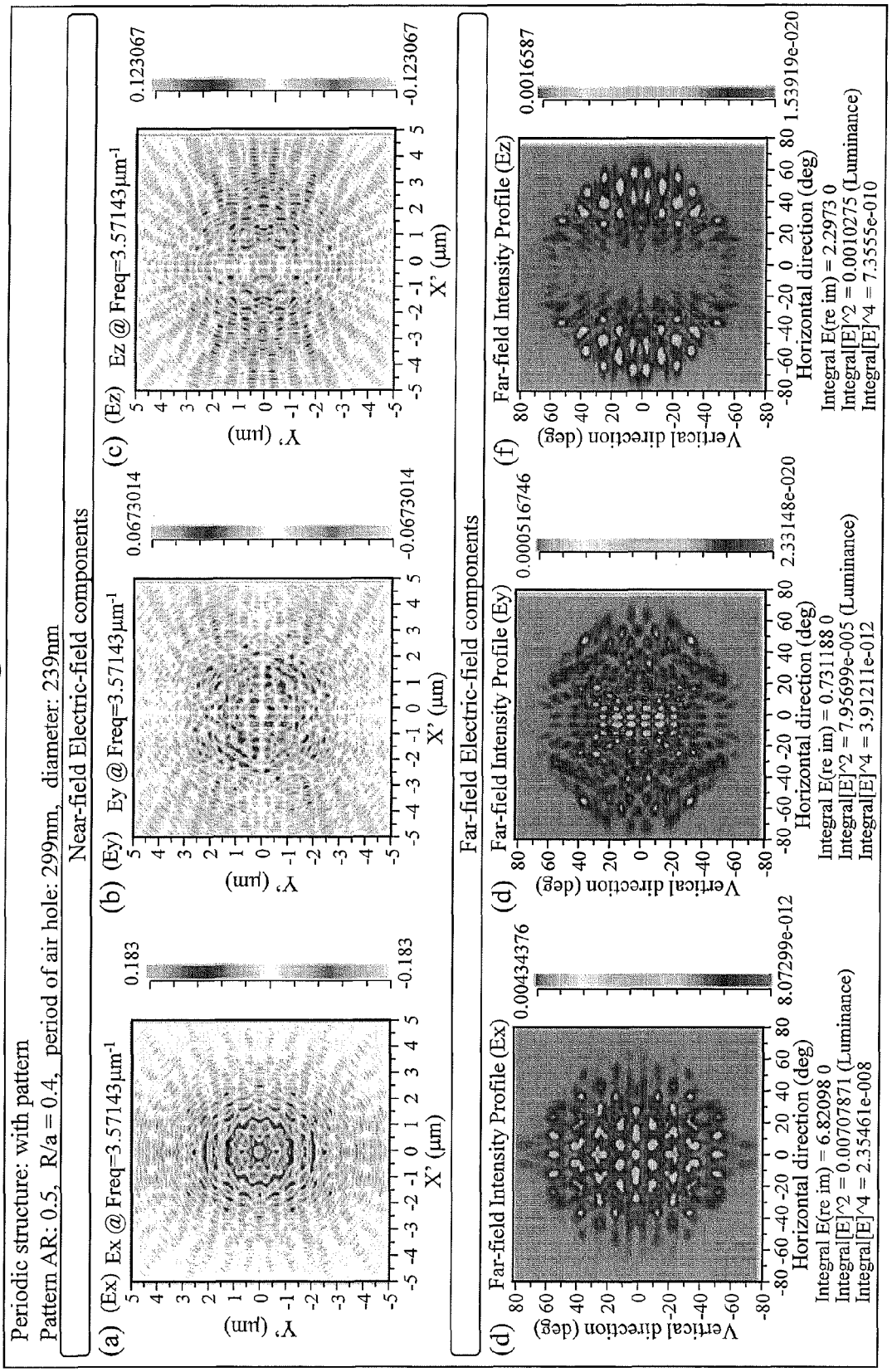
FIG. 15 is a view illustrating the distribution of intensity when a periodic structure is provided.

In addition, the light distribution property is shown in field intensity distribution diagrams corresponding to the angles of the far-field components Ex, Ey, and Ez in the lower parts of FIG. 15. Herein, the luminance of each electric field component is displayed with a numerical value of Integral[E]^2 on the lower part of each diagram, and the numerical value is higher than that when the periodic structure is not provided as in FIG. 14. Further, a portion with high luminance can be confirmed around the center of the far-field distribution diagram. This can also confirm that the front surface luminance is higher than that when the periodic structure is not provided.

Figure 5:
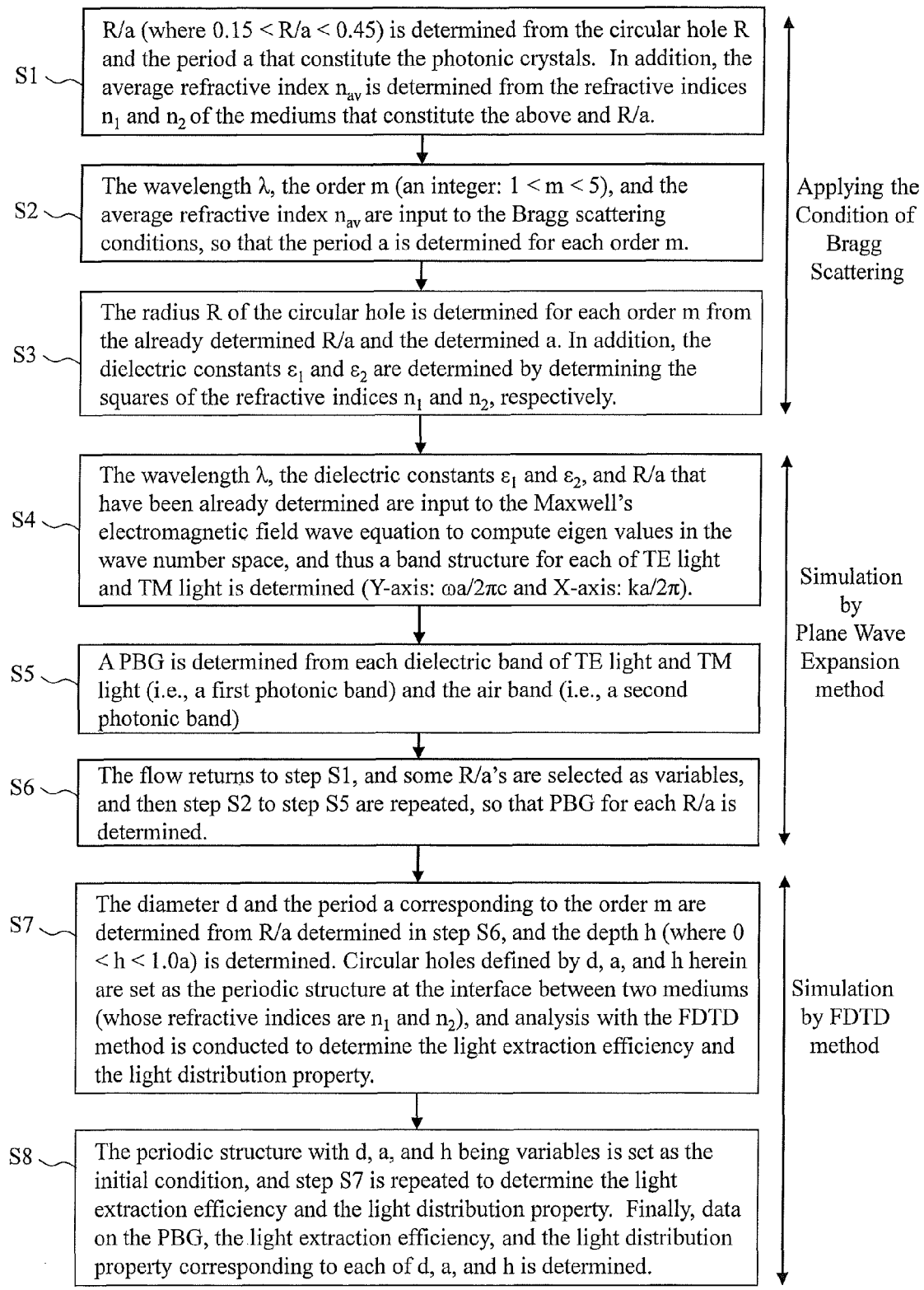
FIG. 5 is a flowchart illustrating an exemplary process for when the depth h in step 7 is a variable of the period a (where 0<h<1.0a).

FIG. 5 is a view illustrating an exemplary process for when the depth h in step 7 is a variable of the period a (where 0<h<1.0a). This is basically the same process as that in FIG. 5, but is different in that in step S7, the diameter d and the period a corresponding to the order m are determined from R/a determined in step S6, and then the depth h (where 0<h<1.0a) is determined.

TABLE 1

| R/a | Diameter: nm (m = 3) | Period: nm (m = 3) | PBG/TM | PBG/TE |
|---|---|---|---|---|
| 0.2 | 97 | 243 | X | X |
| 0.25 | 126 | 252 | X | ○/0.014 |
| 0.3 | 158 | 263 | X | ○/0.037 |
| 0.35 | 195 | 278 | ○/0.001 | ○/0.057 |
| 0.4 | 239 | 299 | ○/0.032 | ○/0.064 |

Table 1 is a table representing parameters that are selected to simulate the dispersion relation between the frequency and the wave number of light using the plane wave expansion method and, in the dispersion relation between the frequency w and the wave number k of light determined with such parameters (hereinafter referred to as a "band structure"), the presence or absence of a band gap due to the photonic crystal effect, and, if a band gap is present, the magnitude thereof.

As a pattern of the periodic structure, air holes are arranged in a triangular lattice pattern on the sapphire substrate. Parameters used for the simulation include the refractive index of sapphire (1.82), the refractive index of the air (1.0), R: radius (nm), a: period (nm), m: order, and PBG: photonic band gap (which has been converted into a non-dimensional parameter).

Figure 8:
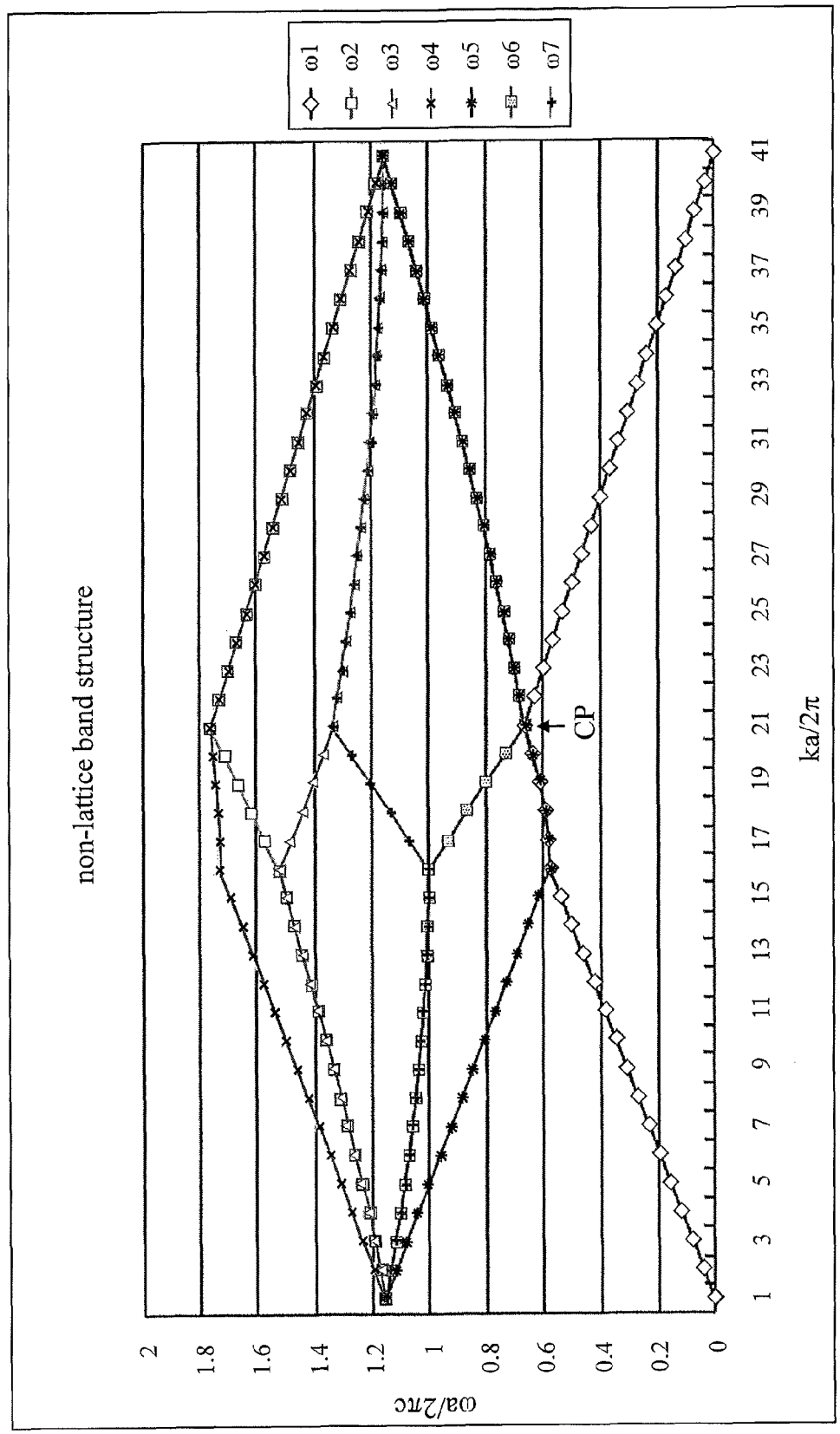
FIG. 8 is a view illustrating a non-lattice band structure when the surface of sapphire is flat as a comparison target.

FIG. 7 is a view illustrating a band structure computed as an example for when R/a=0.4, and FIG. 8 is a view illustrating, as a comparison target, a non-lattice band structure for when the surface of sapphire is flat.

In FIG. 7, TE indicates a TE (transversal electric) mode in which an electric field exists in the horizontal direction with respect to holes, and TM indicates a TM (transversal magnetic) mode in which a magnetic field exists in the horizontal direction with respect to holes. As is clear from FIG. 7, in each band of the TE mode and the TM mode, the dispersion relation between the frequency $\omega$ and the wave number k is discrete, and a photonic band gap PBG is observed between $\omega$1TE (i.e., the dielectric band) and $\omega$2TE (i.e., the air band). When the results in FIG. 7 are compared with the results of the non-lattice band structure in FIG. 8 for when the surface of sapphire is flat and an intersection CP is present, such difference is apparent.

Such phenomenon, which is apparent when FIG. 7 is compared with FIG. 8, results from the fact that in the TE mode, an electric field is present in parallel with the two-dimensional plane, and in a network structure having thin linear dielectrics connected together, the electric field in the TE mode is easily accumulated in the connected dielectrics. That is, the electric field can be said to be energetically stable, and thus a photonic band gap PBG will easily open in the TE mode.

Next, when the $\omega$2TE band is focused to study the properties that are obtained when the photonic band gap PBG opens, an abnormality in group velocity that is defined by the following equation is observed at an end of the band (i.e., the energy propagation velocity of light is determined by the group velocity Vg, and Vg=d$\omega$/dk) Vg=0), and thus, it can be seen that an increase in light transmissivity due to the photonic crystal effect can be expected.

Figure 9:
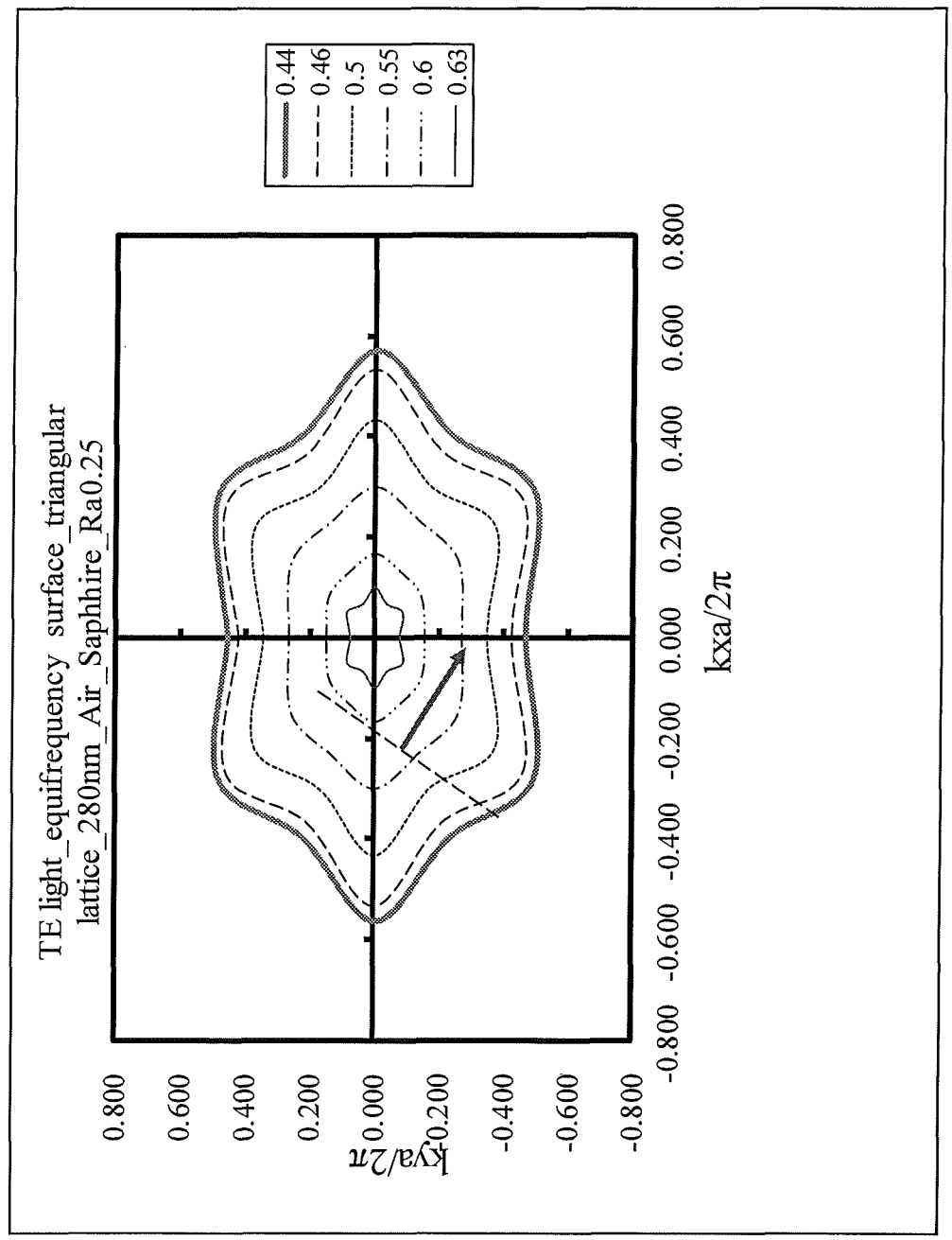
FIG. 9 is a view obtained when the entire first Brillouin zone is analyzed and an equifrequency surface with respect to a wave vector (kx,ky) of a ω2TE band is determined (R/a=0.25).
Figure 10:
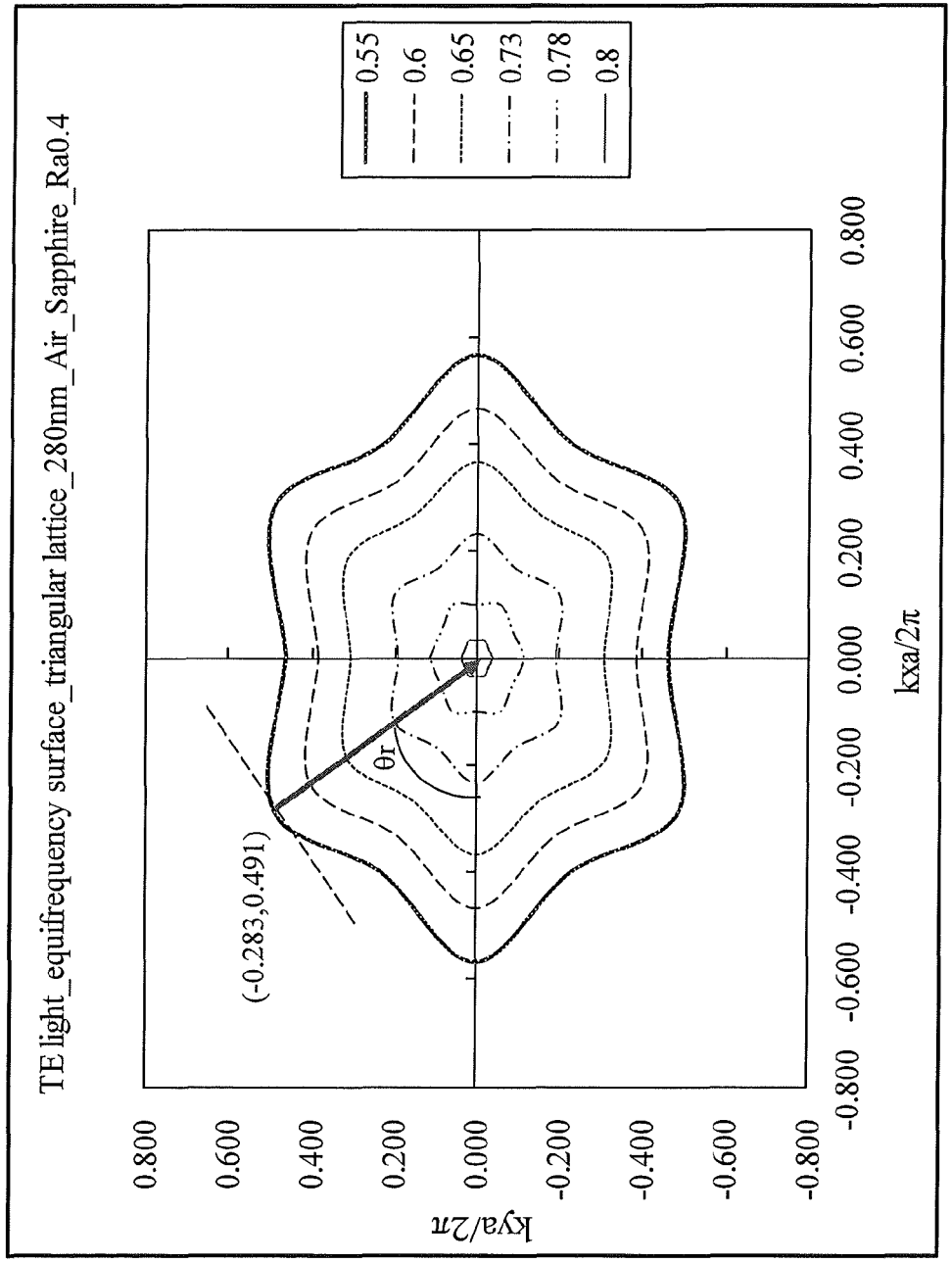
FIG. 10 is a view obtained when the entire first Brillouin zone is analyzed and an equifrequency surface with respect to a wave vector (kx,ky) of a ω2TE band is determined (R/a=0.4).

FIG. 7 is a view obtained by analyzing a part of an end of the band (a portion surrounded by a point F, a point M, and a point K) in the first Brillouin zone. Herein, the entire first Brillouin zone is analyzed and an equifrequency surface with respect to the wave vector (kx,ky) of the ω2TE band is determined. FIG. 9 shows the equifrequency surface when a=0.25, and FIG. 10 shows the equifrequency surface when R/a=0.4.

The propagation direction of light in photonic crystals is determined by the group velocity. In order to determine the group velocity, the wave number vector v should be determined. This can be known from the equifrequency surface as shown in FIG. 9 or 10. As shown in FIG. 3, when light with a frequency ω propagates through photonic crystals in the two-dimensional space (x,y) from the sapphire region 15$b$, the momentum in the direction of the tangent to the incident plane is preserved. When such a phenomenon is represented in the wave number space (kx,ky) (it should be noted that k=2πa, and a denotes the period), the ky components in the y direction of the wave number vector in the photonic crystals satisfy $ky_d/2\pi = \omega a/2\pi c \cdot \sin\theta i$.

The group velocity is, from the aforementioned equation: Vg=dω/dk, a gradient with respect to the wave number vector of the frequency. The direction that is normal to the equifrequency surface is the same as the direction in which the frequency increases, and the light propagation direction is the same as the direction of the arrow as shown in FIGS. 9 and 10. In particular, a point at which an abnormality in group velocity is observed is the coordinates (kx,ky)=(−0.283,0.491) on the equifrequency surface ωa/2πc=0.55 in FIG. 10. When ky=0.491 is substituted into the equation $ky_d/2\pi = \omega a/2\pi c \cdot \sin\theta i$, θi=63° is determined. Meanwhile, the light propagation direction is the direction of the arrow, and the magnitude of the refraction angle θr is determined as −60° from tan θr=(ky/kx). Thus, from the relationships of the incident angle and the refraction angle: θi>0 and θr<0, it can be seen that the refractive index is substantially n<0, and thus a negative refraction effect is exhibited.

Figure 11:
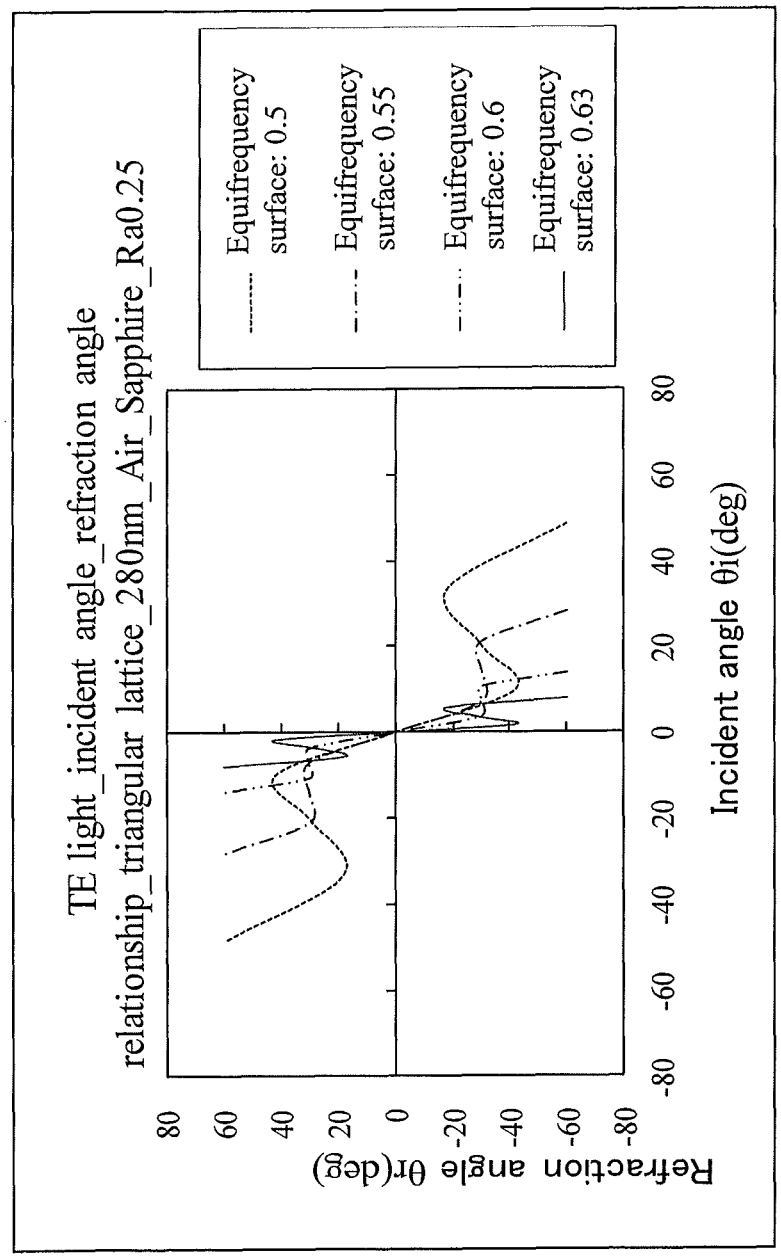
FIG. 11 is a view illustrating the incident angle vs. refraction angle relationship when R/a=0.25.
Figure 12:
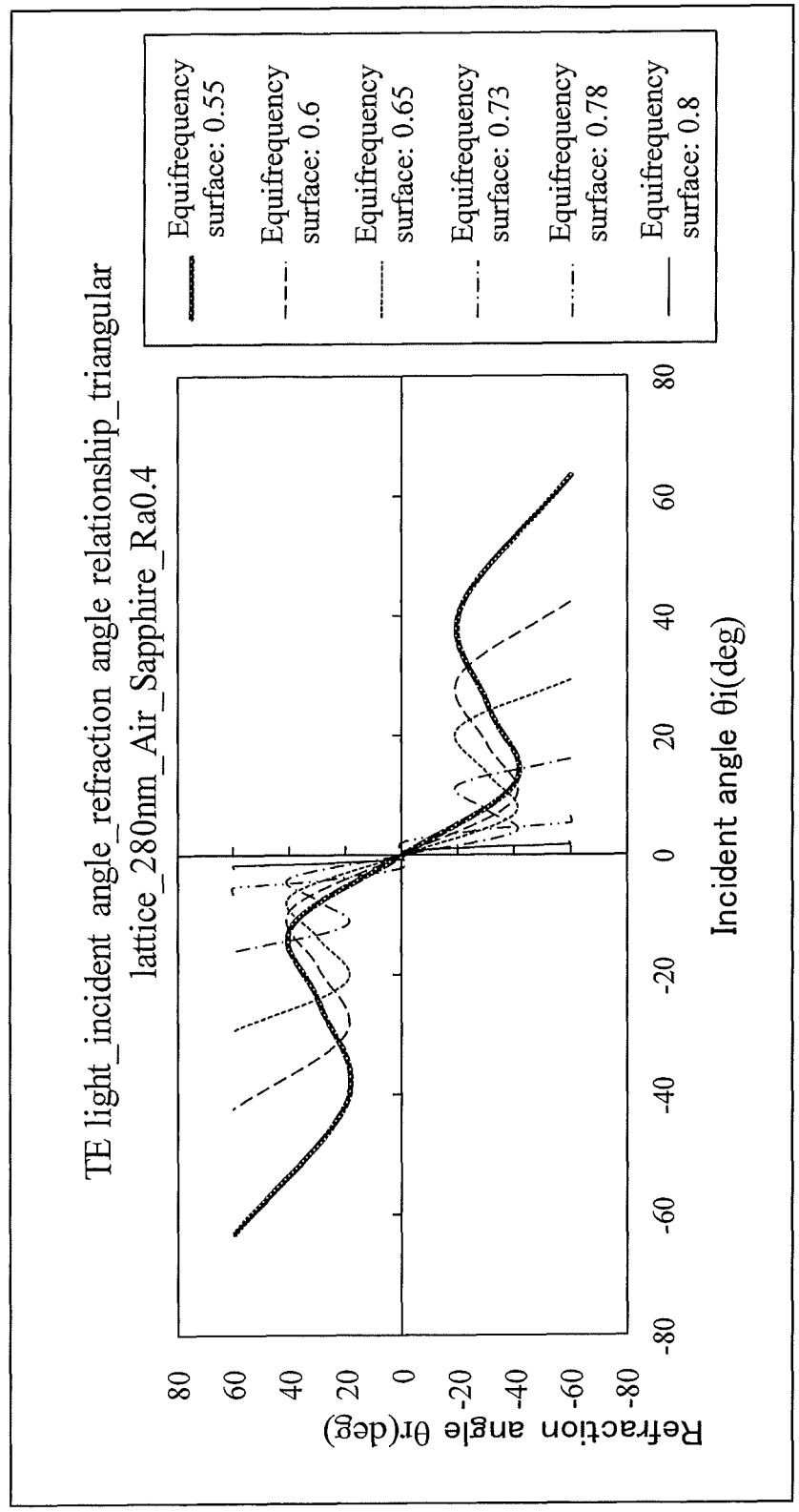
FIG. 12 is a view illustrating the incident angle vs. refraction angle relationship when R/a=0.4.

FIG. 11 illustrates the relationship of the refraction angle with respect to the incident angle when R/a=0.25, and FIG. 12 illustrates the relationship when R/a=0.4. In both FIGS. 11 and 12, $\theta_i$ and $\theta_r$ are always opposite, which show the negative refraction effect. Around the point F at an end of the band, a large change in refraction angle is observed with respect to a small change in incident angle, while at a point K, which is another end of the band, there is no large difference between changes in incident angle and refraction angle. However, the incident angle is far greater than the critical angle $\theta_c$=33.3°, which indicates an increase in transmissivity due to the photonic crystal effect. Further, since the incident angle when R/a=0.4 is larger than the incident angle when R/a=0.25, this indicates that there are a relative relationship between R/a and the transmissivity (i.e., light extraction efficiency) and a relative relationship between the magnitude of the PBG (photonic band gap) and the light extraction efficiency.

Figure 13:
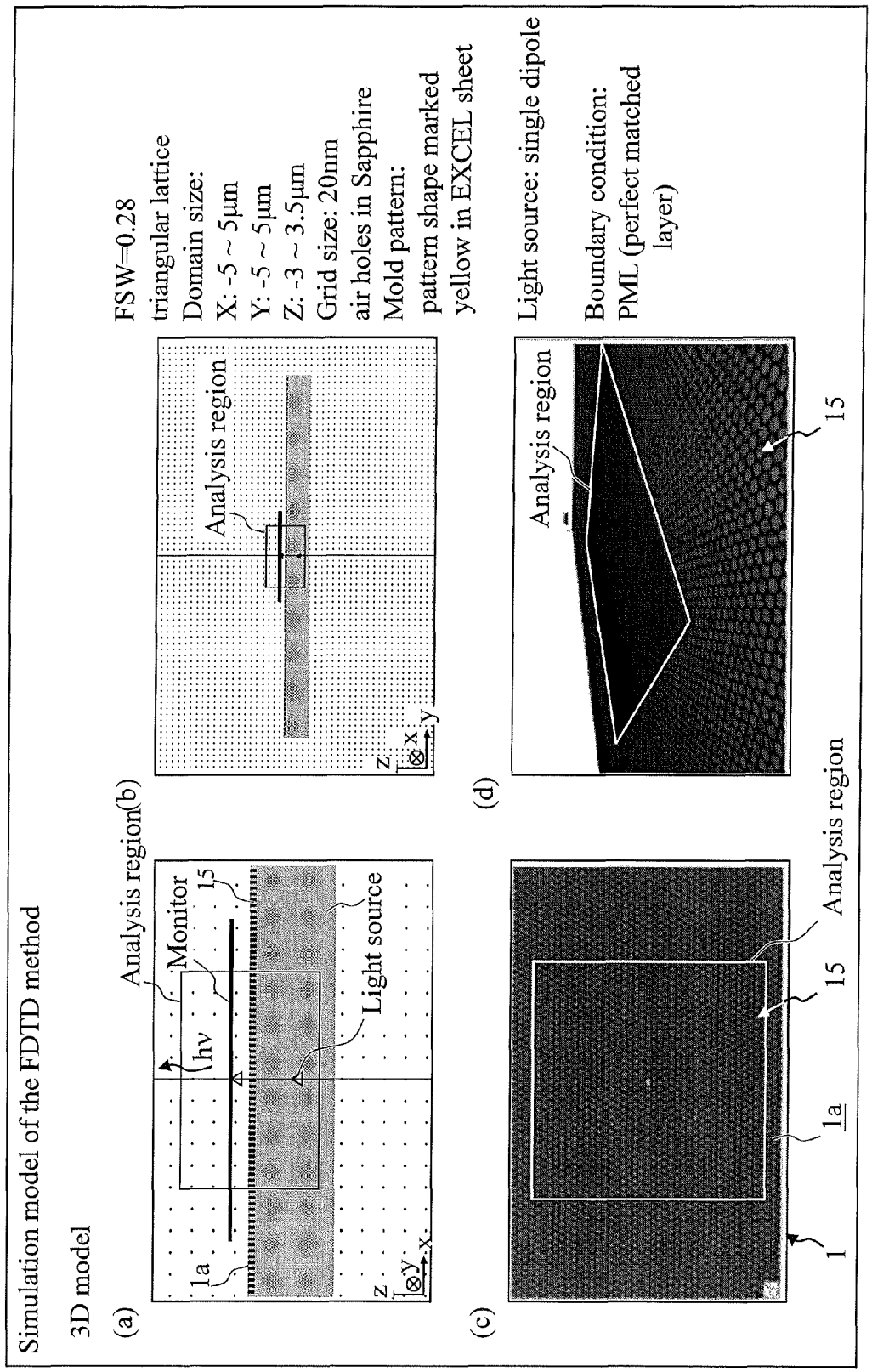
FIG. 13 is a view illustrating an example of a simulation model of the FDTD method.

Next, actual simulation results conducted with the FDTD method, using a pattern shape obtained with the aforementioned plane wave expansion method are shown. FIG. 13 is a view illustrating an example of a simulation model of the FDTD method. As shown in FIG. 13, light emission (hυ) is generated through the photonic crystal periodic structure 15, which is formed on the light extraction plane i.e., the rear surface 1$a$ of the substrate 1, from the light source in the sapphire substrate 1. Herein, optical monitors are arranged at positions away from the rear surface 1$a$ of the substrate 1 by a predetermined distance.

As an analysis region, a space of 10 μm×10 μm×6.5 μm was set, and photonic crystals, monitors, and a light source were arranged at adequate positions in the space. The grid size that divides the present space is 20 nm. Perfect matched layer conditions were set to avoid the influence of reflected waves at the spatial boundary, and a dipole single light source that is in principle close to a LED light source was used for the light source.

FIG. 14 shows the computation results for when a pattern of a periodic structure is not formed on the rear surface of sapphire. As the near-field components in (a) to (c), the field intensity of each of the Ex, Ey, and Ez components at a specific wavelength of 280 nm on a monitor is displayed. In addition, as the far-field components in (d) to (f), x,y of the near-field components were subjected to Fourier transform, and the resulting field distribution of each of the Ex, Ey, and Ez components in the wave number space (i.e., far field angular distribution) was displayed.

TABLE 2

| Order m = 3 | R/a: 0.25 Diameter/ Period/Depth (nm) | R/a: 0.3 Diameter/ Period/Depth (nm) | R/a: 0.35 Diameter/ Period/Depth (nm) | R/a: 0.4 Diameter/ Period/Depth (nm) |
| --- | --- | --- | --- | --- |
| Aspect Ratio: 0.5 | 126/252/63 | 158/263/79 | 195/278/98 | 239/299/120 |
| Aspect Ratio: 1.0 | 126/252/126 | 158/263/158 | 195/278/195 | 239/299/120 |
| Aspect Ratio: 1.5 | 126/252/189 | 158/263/237 | 195/278/293 | 239/299/359 |

In the FDTD simulation, as shown in Table 2, the luminance of a total of 12 photonic crystal patterns at an order of (m=3) was analyzed by changing R/a (0.25, 0.3, 0.35, 0.4) and the aspect ratio (depth/diameter: 0.5, 1.0, 1.5). FIG. 15 is a view illustrating, as an example thereof, the analysis result of a pattern at an order of m=3 and with an aspect ratio of 0.5, R/a=0.4, and diameter/period=(239 nm/299 nm). (a) to (c) are views illustrating the near-field components, (d) to (f) are views illustrating the far-field components. Typically, the light intensity I is represented by the following equation using the far-field components Ex, Ey, and Ez (where $\in_0$ denotes the dielectric constant in a vacuum and c denotes the light velocity).

$$I = \in_0 * c(Ex^2 + Ey^2 + Ez^2)$$

Figure 16:
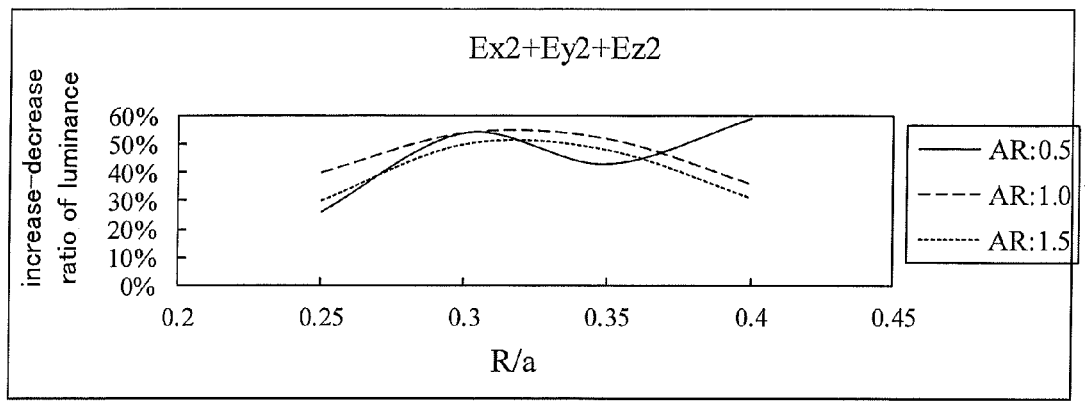
Figure 17:
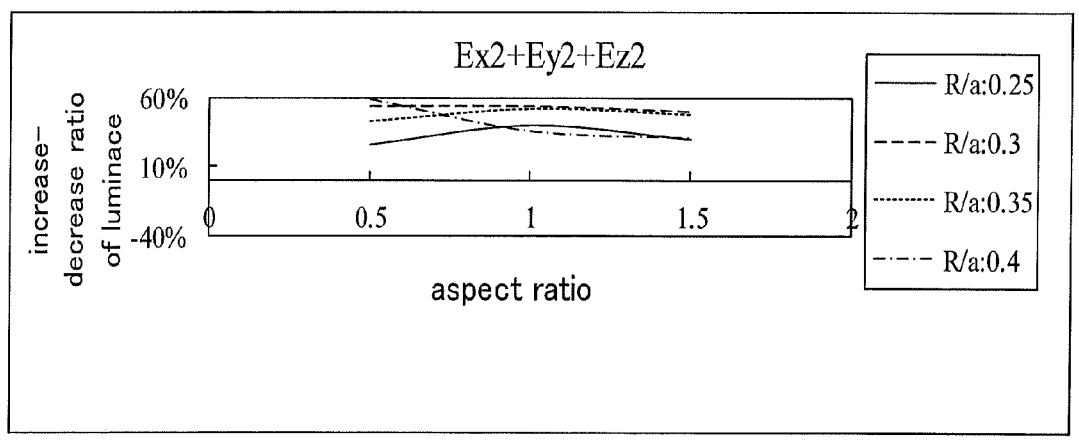
FIG. 17 is a view obtained by computing the luminance of each analyzed pattern, and converting the increase-decrease rate of luminance for when a photonic crystal pattern is provided as compared to when it is not provided, at an order of m=3, into a graph using the function of the aspect ratio.

FIGS. 16 and 17 illustrate views obtained by computing the luminance of each of the analyzed patterns using the above equation, and converting the luminance increase/decrease rate for when a photonic crystal pattern is provided as compared to when no pattern is provided at an order of m=3, into graphs using the functions of R/a and the aspect ratio.

In FIG. 16, when a graph at an aspect ratio of 0.5 is compared with the other graphs at aspect ratios of 1.0 and 1.5, there is an apparent difference in tendency. The pattern used herein is determined from an equation that satisfies the Bragg scattering conditions: $m\lambda/n_{av} = 2a$, where m denotes the order, a denotes the period, and λ denotes the wavelength.

In the aforementioned plane wave expansion method, there is a correlation between R/a and the magnitude of the photonic band gap, and when the photonic band gap is large, even when the incident angle is an angle at which total reflection would usually occur, light is refracted. Thus, an increase in luminance can be expected. Usually, in the case of two-dimensional triangular lattice photonic crystals, a photonic band gap opens at symmetric points. Two and three standing waves are created at the symmetric points M and K at that time, respectively. Herein, a standing wave results from the interference between two or more waves with an identical frequency that propagate in different directions, and the amplitude thereof is determined by the traveling directions of the two or more waves and the like. Thus, in this case, due to the influence of standing waves, a greater luminance increasing effect was obtained when R/a was 0.3 than when R/a was 0.35. Such a tendency can be seen in a wide range of aspect ratios, as shown in FIG. 17.

As described above, to summarize the rule related to photonic crystal patterns and luminance, the following can be said.

1) Regarding the depth direction, the luminance increase rate is the maximum at an aspect ratio of about 0.5.

2) Regarding the relationship of R/a, R/a of 0.3 or R/a of 0.4 is ideal. The fact that it becomes easier to obtain the photonic crystal effect as the R/a becomes closer to 0.4 is a reasonable result from the reason that the average refractive index herein is the intermediate value between the refractive index of sapphire and that of the air, and contributes to a large change in dielectric constant.

TABLE 3

| R/a | Diameter: nm (m = 3) | Period: nm (m = 3) | PBG/TM | PBG/TE |
|---|---|---|---|---|
| 0.2 | 195 | 487 | X | X |
| 0.25 | 249 | 498 | X | X |
| 0.3 | 308 | 514 | X | ○/0.001 |
| 0.35 | 374 | 535 | X | ○/0.01 |
| 0.4 | 450 | 562 | X | ○/0.008 |

TABLE 4

| R/a | Diameter: nm (m = 3) | Period: nm (m = 3) | PBG/TM | PBG/TE |
|---|---|---|---|---|
| 0.2 | 144 | 359 | ○/0.0003 | X |
| 0.25 | 174 | 347 | ○/0.009 | X |
| 0.3 | 200 | 334 | ○/0.01 | X |
| 0.35 | 224 | 320 | ○/0.006 | X |
| 0.4 | 245 | 307 | X | X |

Table 3 shows the magnitude of the photonic band gap between the protective film and the air layer that has been determined with the plane wave expansion method, and Table 4 shows the magnitude of the photonic band gap at the interface between the front surface of the sapphire substrate and the GaN layer that has been determined with the plane wave expansion method. For the protective film and the air layer, the photonic band gap is the maximum and the light extraction efficiency is thus improved when R/a is 0.35. Likewise, for the interface between the front surface of the sapphire substrate and the GaN layer, the photonic band gap is the maximum and the light extraction efficiency is thus improved when R/a is 0.3.

Figure 29B:
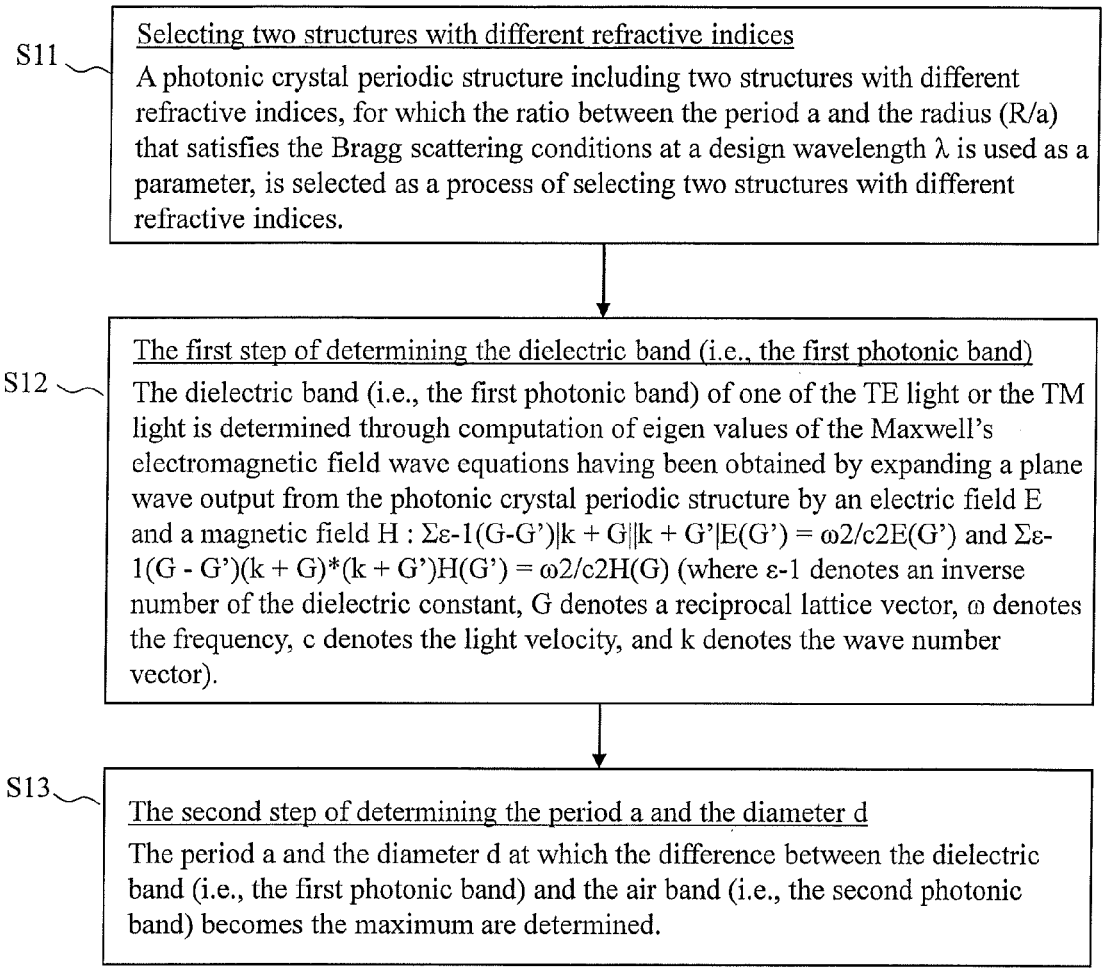
FIG. 29B is a flowchart illustrating a first step of determining a dielectric band, and a second step of determining the period a and the diameter d of a periodic structure from the difference between the dielectric band and an air band.
Figure 29C:
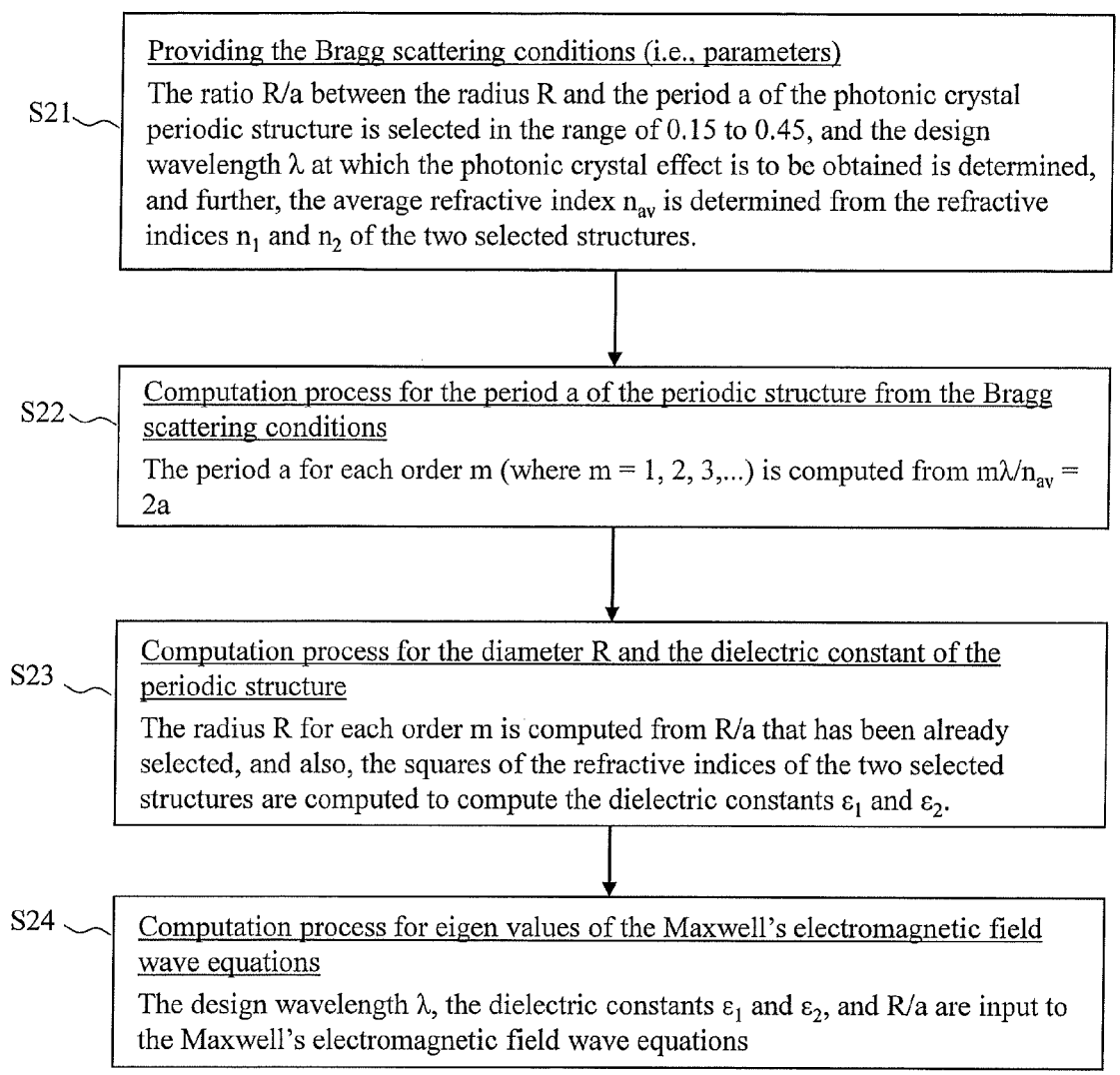
FIG. 29C is a flowchart in which the first step is further divided into four more detailed steps.

FIGS. 29A to 29C concern the processing depth h of the photonic crystal periodic structure, and further more optimum conditions were studied.

FIG. 29A is a flowchart illustrating an exemplary process for when the depth h in step S7 is a variable of the period a (where 0<h<5.0a). FIG. 29B is a flowchart illustrating a first step of determining a dielectric band, and a second step of determining the period a and the diameter d of the periodic structure from the difference between the dielectric band and the air band. FIG. 29C is a flowchart in which the first step is further divided into four more detailed steps.

In the process illustrated in FIG. 29A, with reference to the simulation flow described with reference to FIGS. 4 and 5, the range of simulation of the depth h conducted with the FDTD method in step S7 is expanded to 0<h<5.0a (step S7a in FIG. 29A).

In FIG. 29B, first, in step S11, a photonic crystal periodic structure including two structures with different refractive indices, for which the ratio between the period a and the radius (R/a) that satisfies the Bragg scattering conditions at a design wavelength λ is used as a parameter, is selected as a process of selecting two structures with different refractive indices. Then, in step S12, as the first step of determining the dielectric band (i.e., the first photonic band), the dielectric band (i.e., the first photonic band) of one of the TE light or the TM light is determined through computation of eigen values of the Maxwell's electromagnetic field wave equations: $\Sigma \in''^{-1}(G-G')|k+G||k+G'|E(G')=\omega 2/c2 E(G')$ and $\Sigma \in^{-1}(G-G')(k+G)^*(k+G')H(G')=\omega 2/c2 H(G)$ (where $\in^{-1}$ denotes an inverse number of the dielectric constant, G denotes a reciprocal lattice vector, ω denotes the frequency, c denotes the light velocity, and k denotes the wave number vector), the equations having been obtained by expanding a plane wave output from the photonic crystal periodic structure by an electric field E and a magnetic field H.

Next, in step S13, as the second step of determining the period a and the diameter d, the period a and the diameter d at which the difference between the dielectric band (i.e., the first photonic band) and the air band (i.e., the second photonic band) becomes the maximum are determined.

In FIG. 29C, the ratio R/a between the radius R and the period a of the photonic crystal periodic structure is selected in the range of 0.15 to 0.45 as a process of providing the Bragg scattering conditions (i.e., parameters) in step S21, and the design wavelength λ at which the photonic crystal effect is to be obtained is determined, and further, the average refractive index $n_{av}$ is determined from the refractive indices $n_1$ and $n_2$ of the two selected structures.

Next, in step S22, the period a for each order m (where m=1, 2, 3, ... ) is computed from $m\lambda/n_{av}=2a$ as a computation process for the period a of the periodic structure from the Bragg scattering conditions. In step S23, as a computation process for the diameter R and the dielectric constant of the periodic structure, the radius R for each order m is computed from R/a that has been already selected, and also, the squares of the refractive indices of the two selected structures are computed to compute the dielectric constants $\in^1$ and $\in^2$. In step S24, the design wavelength λ, the dielectric constants $\in^1$ and $\in^2$, and R/a are input to the Maxwell's electromagnetic field wave equations as a computation process for eigen values of the Maxwell's electromagnetic field wave equations.

Figure 30:
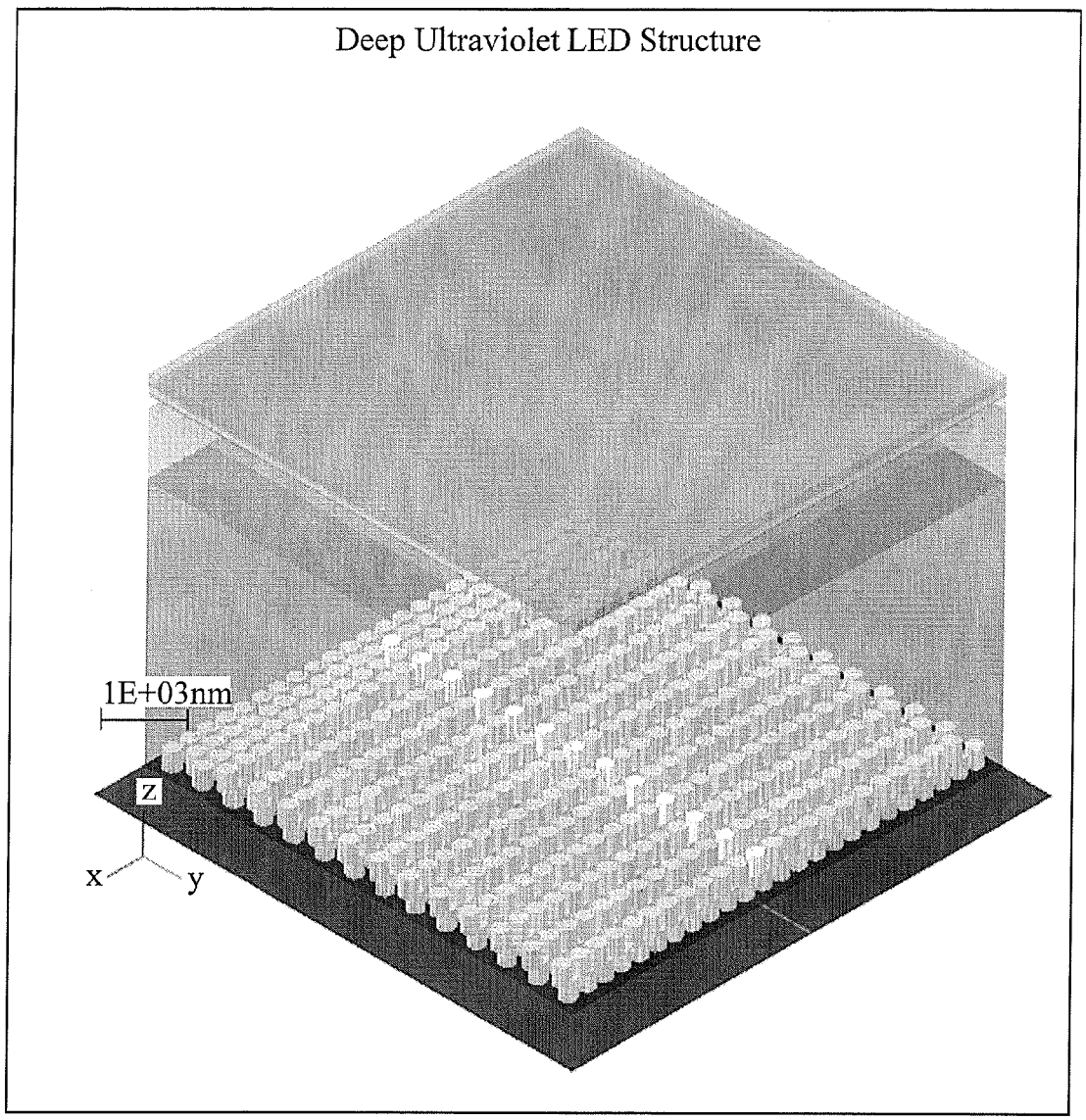
FIG. 30 is a view illustrating an example of a simulation model (of a deep ultraviolet LED) using the FDTD method.

FIG. 30 is a view illustrating an example of a simulation model of a deep ultraviolet LED structure using the FDTD method. A specific method of computing the diameter d, the period a, and the depth h of the periodic structure is omitted herein as they are the same as those in the aforementioned method. It should be noted that as long as the value of R/a is determined, a is uniquely determined from the relational expression d=2R. Thus, the depth h may be a variable of the diameter d as described above.

To study optimization of the depth h, in view of the structure of a semiconductor light emitting element, a total of five monitors for detecting the light intensity are arranged on the bottom front surface and the four sidewalls, except the top portion having a reflecting electrode, since light that has been emitted from the well layer propagates in all directions. The light intensity detected with the monitors equals the absolute value of the outer product of the electric field and the magnetic field, and is represented by the unit [W]. The monitors are arranged outside the LED structure in consideration of a phenomenon that is close to the phenomenon of the actual LED, that is, when light in the LED is released to the outside, a difference in refractive index is generated between the inside of the LED and the air, and thus, the light is totally reflected internally in accordance with the Snell's law.

In addition, since light emitted from the well layer will be absorbed by the p-type GaN contact layer, simulation is conducted by changing the p-type GaN contact layer to a p-type AlGaN contact layer without absorption. Thus, such a structure can obtain LEE that is equal to the LEE of a blue LED.

As an analysis region, a space of 8 μm×8 μm×6 μm was set. The grid size that divides the space was set to 10 nm. The perfect matched layer conditions were set outside the monitors with a view to avoid the influence of reflected waves. As a light source, a single dipole light source that is in principle close to a LED light source was used.

Figure 31:
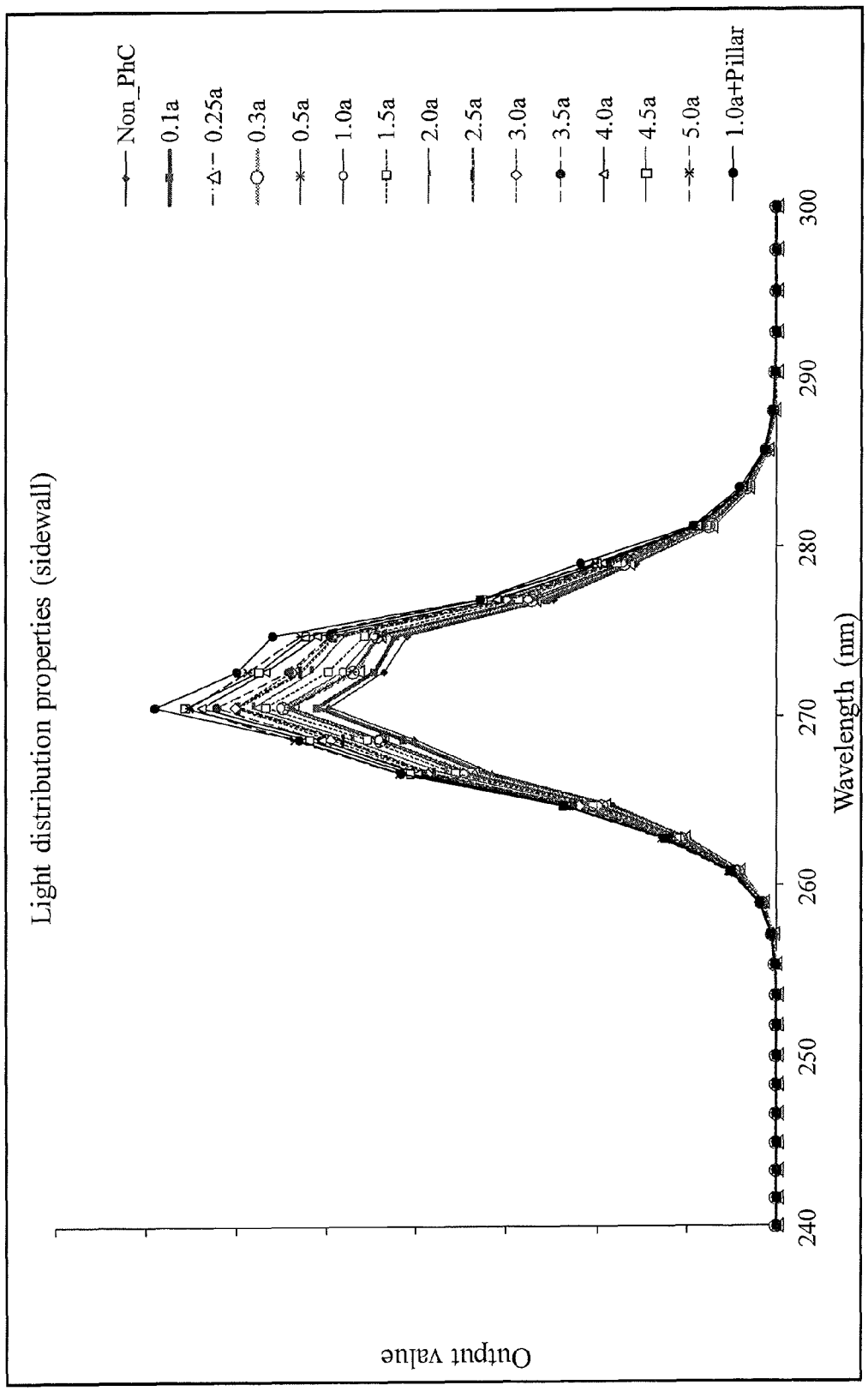
FIG. 31 is a view illustrating the output vs. wavelength characteristics (of the sidewalls), and is a view illustrating the relationship between the total value of outputs detected with monitors arranged outside the four external walls and the wavelength dispersion.
Figure 32:
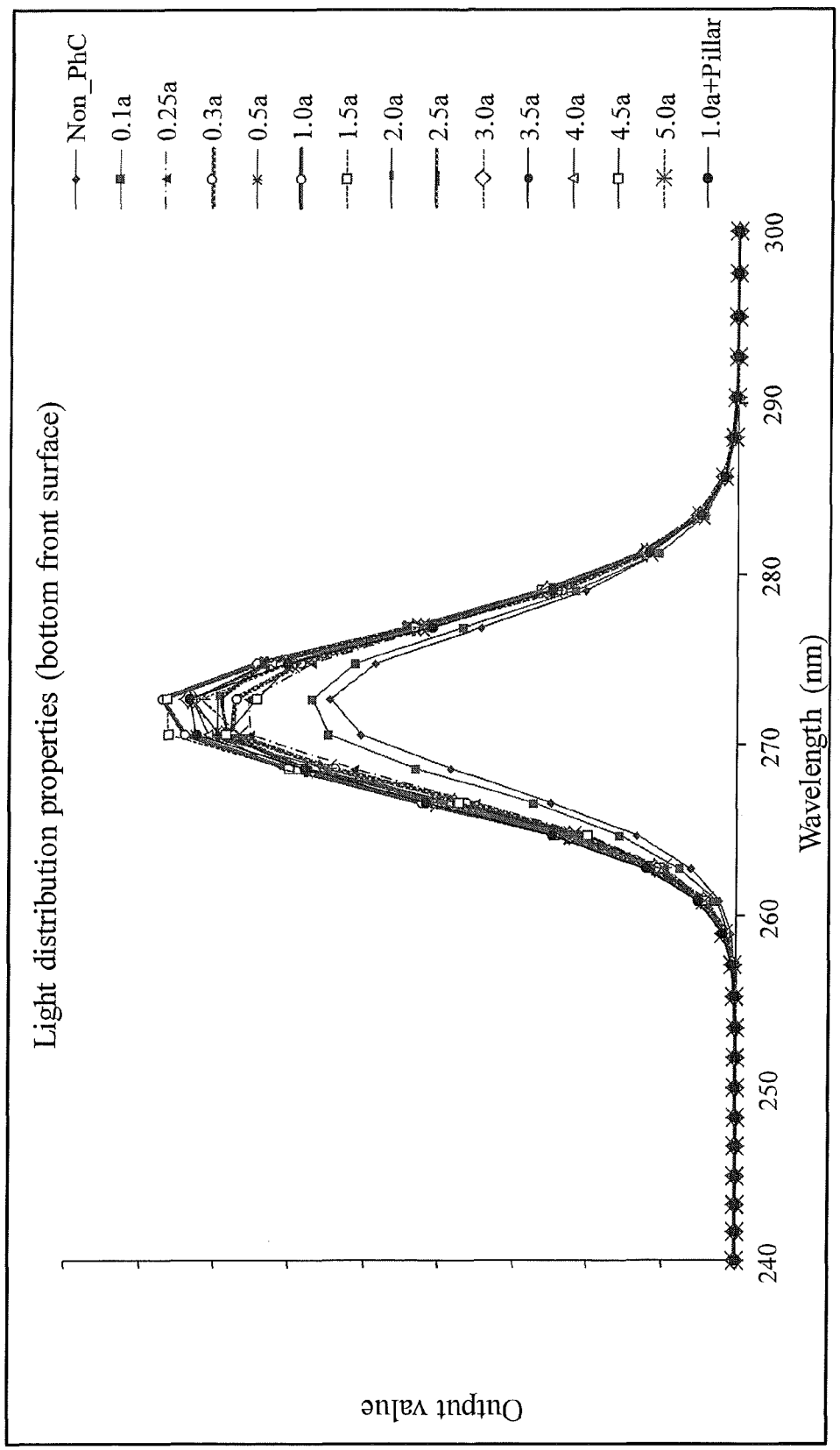
FIG. 32 is a view illustrating the output vs. wavelength characteristics (of the bottom front surface), and is a view illustrating the relationship between the output value detected with a monitor arranged on the bottom front surface and the wavelength dispersion.
Figure 33:
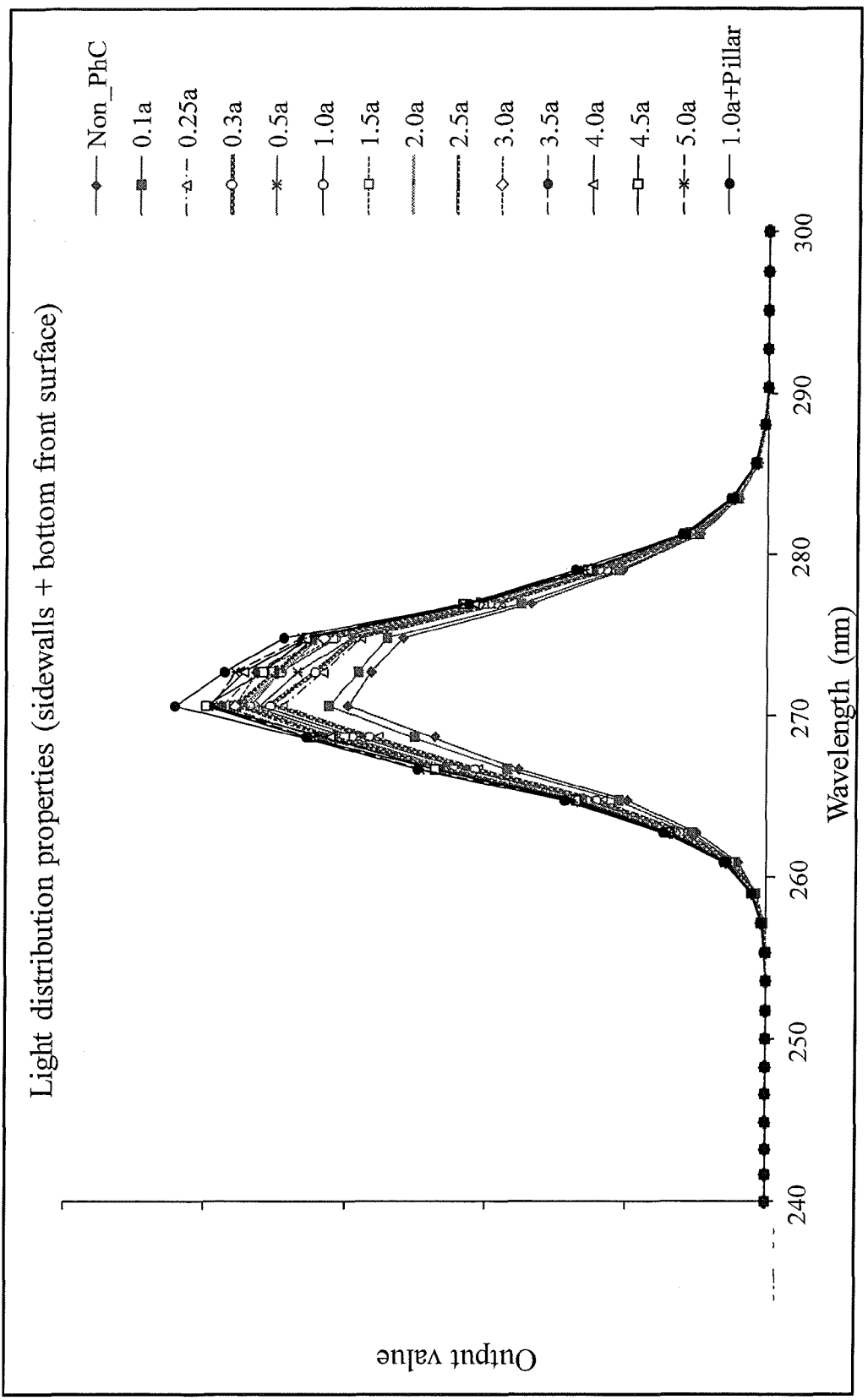
FIG. 33 is a view illustrating the output vs. wavelength characteristics (of the sidewalls+the bottom front surface), and is a view illustrating the relationship between the total value of outputs detected with monitors on the four sidewalls and the bottom front surface, and the wavelength dispersion.
Figure 34:
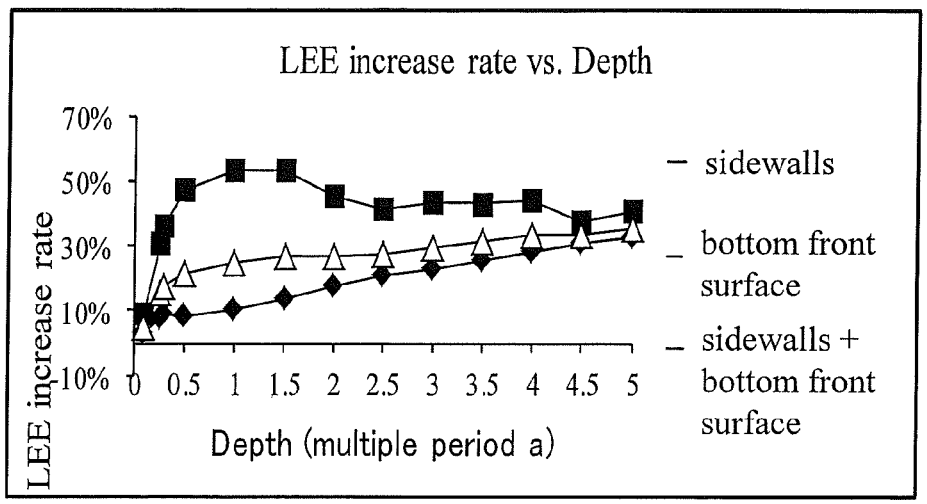
FIG. 34 is a view illustrating the relationship between the average LEE increase rate at the output center wavelength and a plurality of dispersed wavelengths (a total of 5 wavelengths) and the depth, and is a view illustrating data on each of the sidewalls, the bottom front surface, and the sidewalls+the bottom front surface.

The analysis results shown in FIGS. 31 to 33 illustrate the output values i.e., light distribution properties detected on the sidewalls and the bottom front surface. Light detected on the bottom portion represents the luminance on the front surface. FIG. 34 illustrates the relationship between the LEE increase rate of each of the sidewalls, the bottom front surface, and the sidewalls+the bottom front surface and the depth h represented by a variable of the period a of the periodic structure. The mainstream of the actual deep ultraviolet LED element is of a face-down (flip-chip) type. In this case, the top surface portion is fixed to a seat. Thus, light is extracted from the sidewall portions and the bottom front surface, and thus, the properties of the LEE increase rate of the bottom front surface, which becomes a front surface, in particular, are important.

As is apparent from FIG. 34, the greater the depth h of the periodic structure, the greater the LEE increase rate of the sidewalls. This is because as the depth h is greater, the surface area of a region where the Bragg scattering effect is obtained will also increase, and an increase in the LEE increase rate is substantially proportional to the depth h. Such phenomenon is also recognized for each wavelength.

Meanwhile, the LEE increase rate of the bottom front surface suddenly increases in the range in which the depth h of the periodic structure is up to 0.5 times the period a, and the value reaches almost 50%. After that, the LEE increase rate gently increases or decreases, and becomes constant at a depth h that is 2.0 or more times the period a. That is, the effect of increasing the LEE increase rate obtained from a phenomenon that is unique to the photonic crystal periodic structure with the photonic band gap is the maximum when the depth h of the periodic structure is in the range of 0.5 to 2.0 times the period a.

Accordingly, the LEE increase rate of the entire LED element, that is, the sum of the LEE increase rate of the sidewalls and the LEE increase rate of the bottom front surface is prominent when the depth h of the periodic structure is 0.5 or more times the period a.

Figure 35:
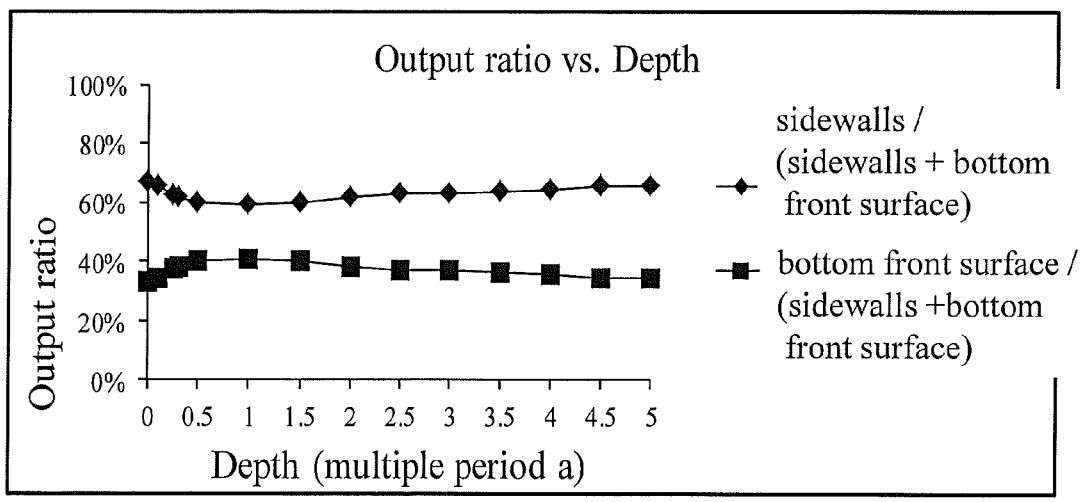
FIG. 35 is a view illustrating the output ratio vs. depth characteristics, and is a view illustrating data on each of the sidewalls/(the sidewalls+the bottom front surface) and the bottom front surface/(the sidewalls+the bottom front surface).

FIG. 35 shows each of the output ratios of the sidewalls/ (the sidewalls+the bottom front surface) and of the bottom front surface/(the sidewalls+the bottom front surface) when the depth h of the periodic structure is in the range of 0<h<5.0a. Herein, a case where the depth h=0 means a case where there is no periodic structure. This shows that each output ratio shifts substantially at 6:4 when the depth is in the range of 0.5a<h<5.0a. This ratio is related to the area ratio between the sidewalls and the bottom front surface. Thus, such ratio can be changed by changing the thickness of the sapphire substrate, for example. In order to more specifically increase the output ratio between the bottom front surface/ (the sidewalls+the bottom front surface), the area for dividing the substrate into elements in the plane may be increased, and the thickness of the sapphire substrate (i.e., several hundred μm) may be reduced. In such a case, the thickness of the sapphire substrate is desirably adjusted rather than the thickness of the semiconductor portion (several μm). Through such adjustment of the area ratio, the light distribution properties of the LED element can be adjusted.

Figure 36:
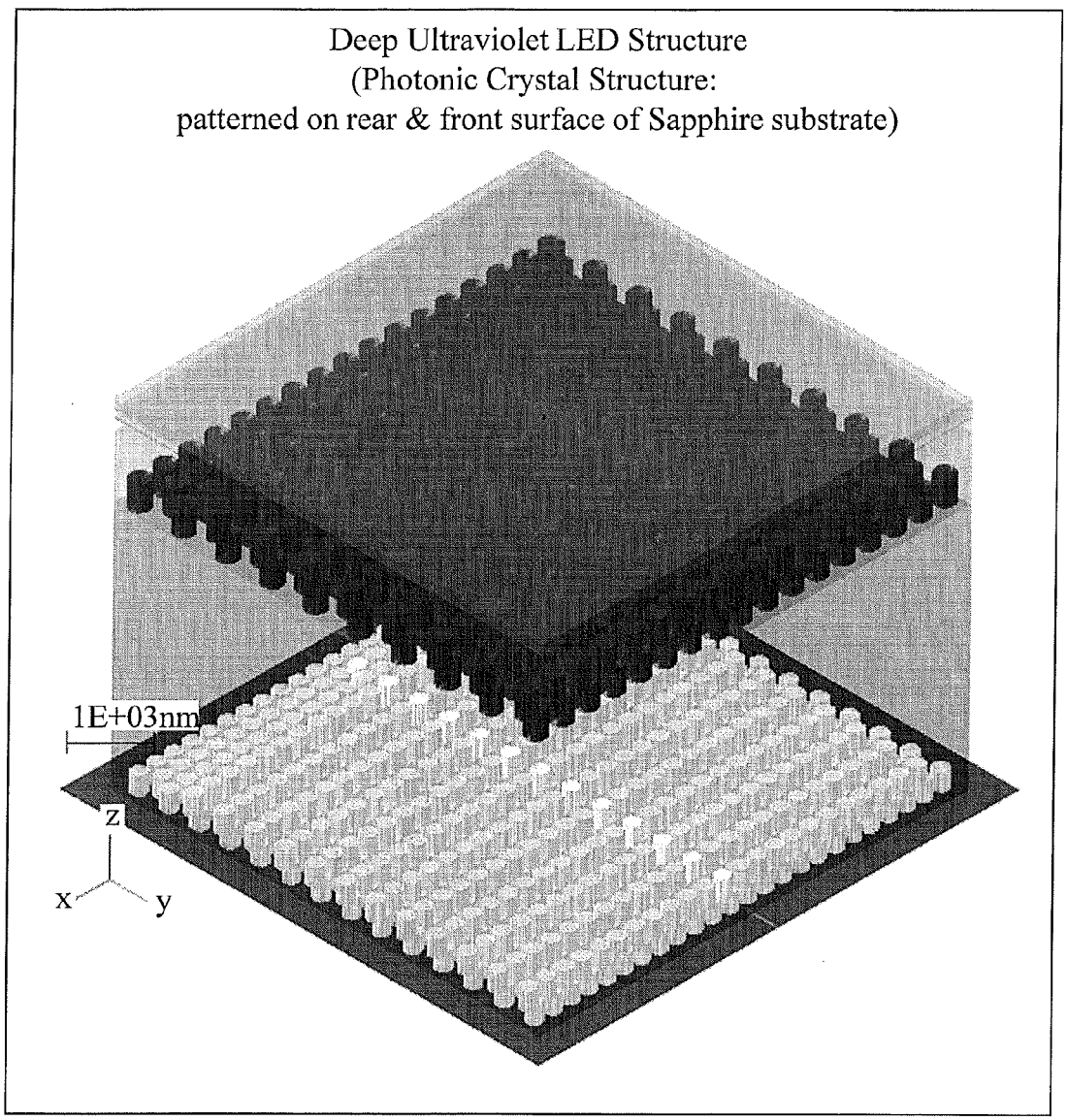
FIG. 36 is a view of a FDTD simulation model (of a deep ultraviolet LED) illustrating a model in which, in comparison with the photonic crystal periodic structure shown in FIG. 30 formed on the rear surface of the sapphire substrate, the photonic crystal periodic structure is also formed on the front surface of the substrate through processing.

FIG. 36 illustrates the model results obtained when simulation is conducted by adding a photonic crystal periodic structure on the front surface of a sapphire substrate with a deep ultraviolet LED structure in addition to the rear surface of the substrate. The pattern of each photonic crystal on the rear surface of the substrate has a hole shape with a diameter of 230 nm, a period of 287 nm, and a depth h of 1.0 times the period a, and the pattern of each photonic crystal on the front surface of the substrate has a pillar shape with a diameter of 299 nm, a period of 415 nm, and a depth h of 1.0 times the period.

As illustrated in the graph of 1.0a+Pillar in FIGS. 31 to 33, the output value of each of the sidewalls, the bottom front surface, and the sidewalls+the bottom front surface was almost higher than the output value of photonic crystals that have only holes 1.0a. The table below shows the LEE increase rate.

TABLE 5

|  | Sidewalls | Bottom Front Surface | Sidewalls + Bottom Front Surface |
|---|---|---|---|
| Hole 1.0a | 10% | 53% | 25% |
| Hole 1.0a + Pillar 1.0a | 35% | 49% | 40% |

From the results in Table 5, it is seen that when the photonic crystal periodic structure is formed through processing on each surface of a sapphire substrate, the LEE increase rate of the entire LED element has further increased by 15 points, that is, up to 40%, in comparison with when the photonic crystal periodic structure is formed through processing only on the rear surface of the substrate.

Figure 37:
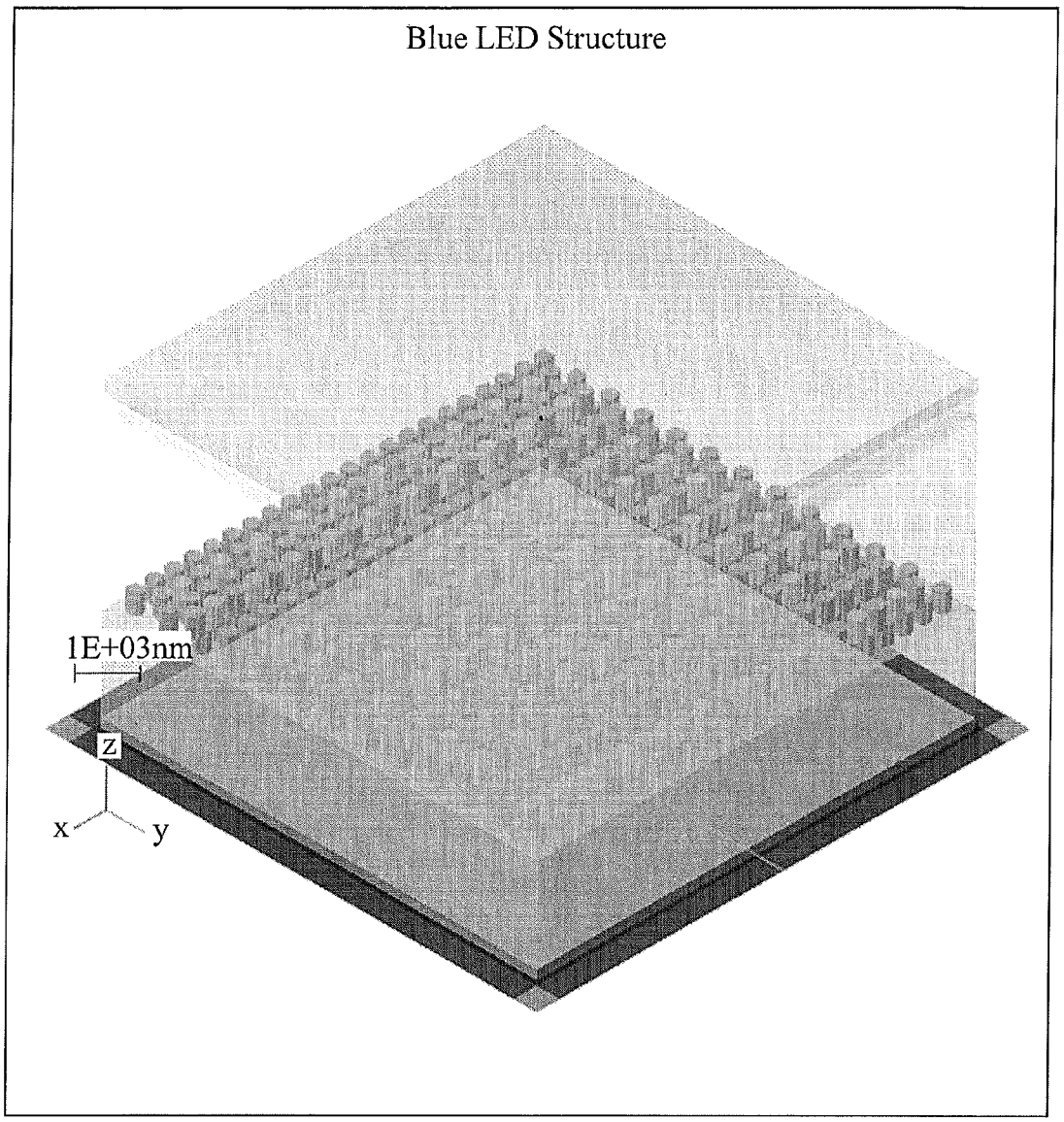
FIG. 37 is a view illustrating an example of a simulation model (of a blue LED) of the FETD method.
Figure 38:
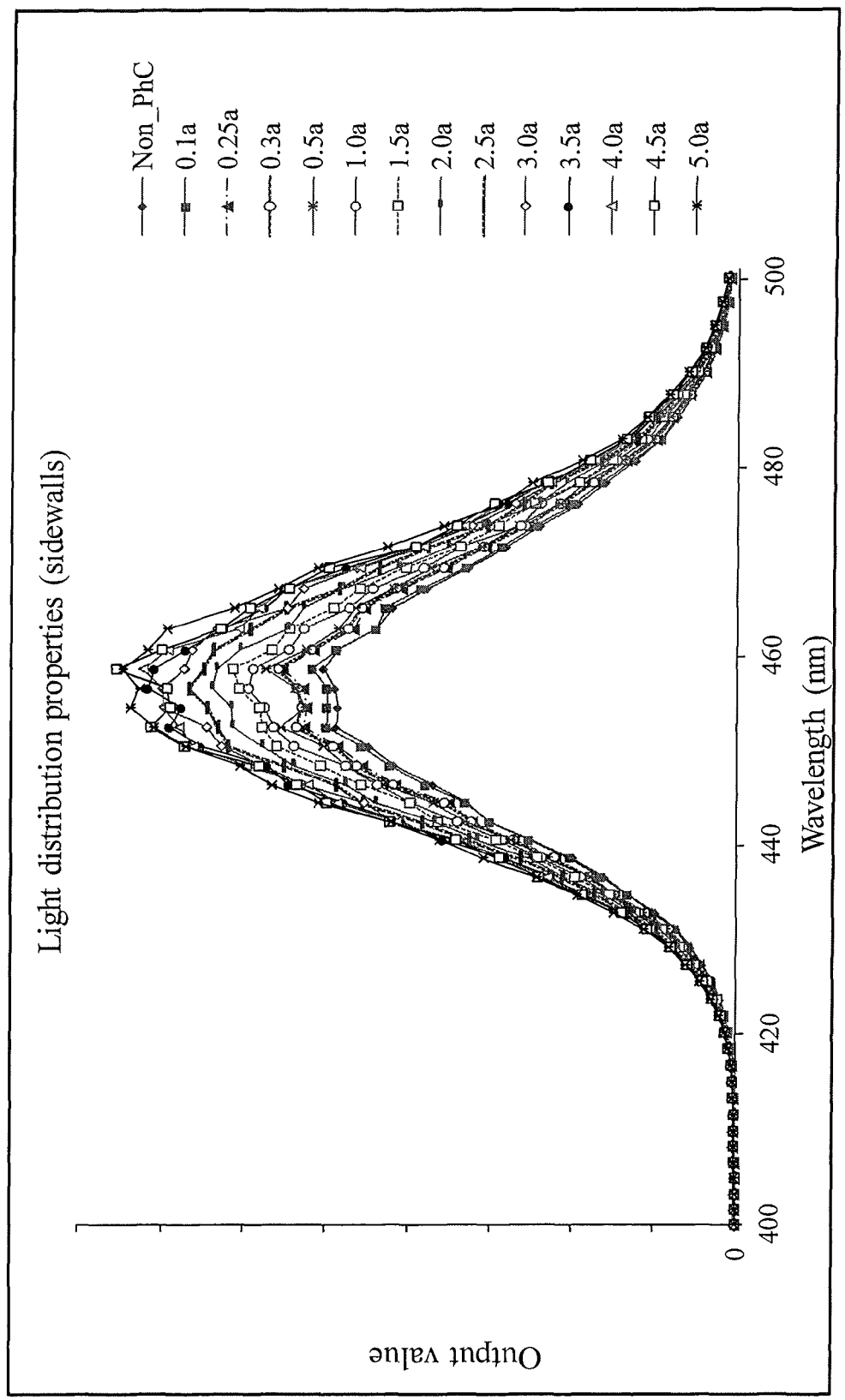
FIG. 38 is a view illustrating the output vs. wavelength characteristics (of the sidewalls), and is a view illustrating the relationship between the total value of the outputs detected with monitors arranged outside the four sidewalls and the wavelength dispersion.
Figure 39:
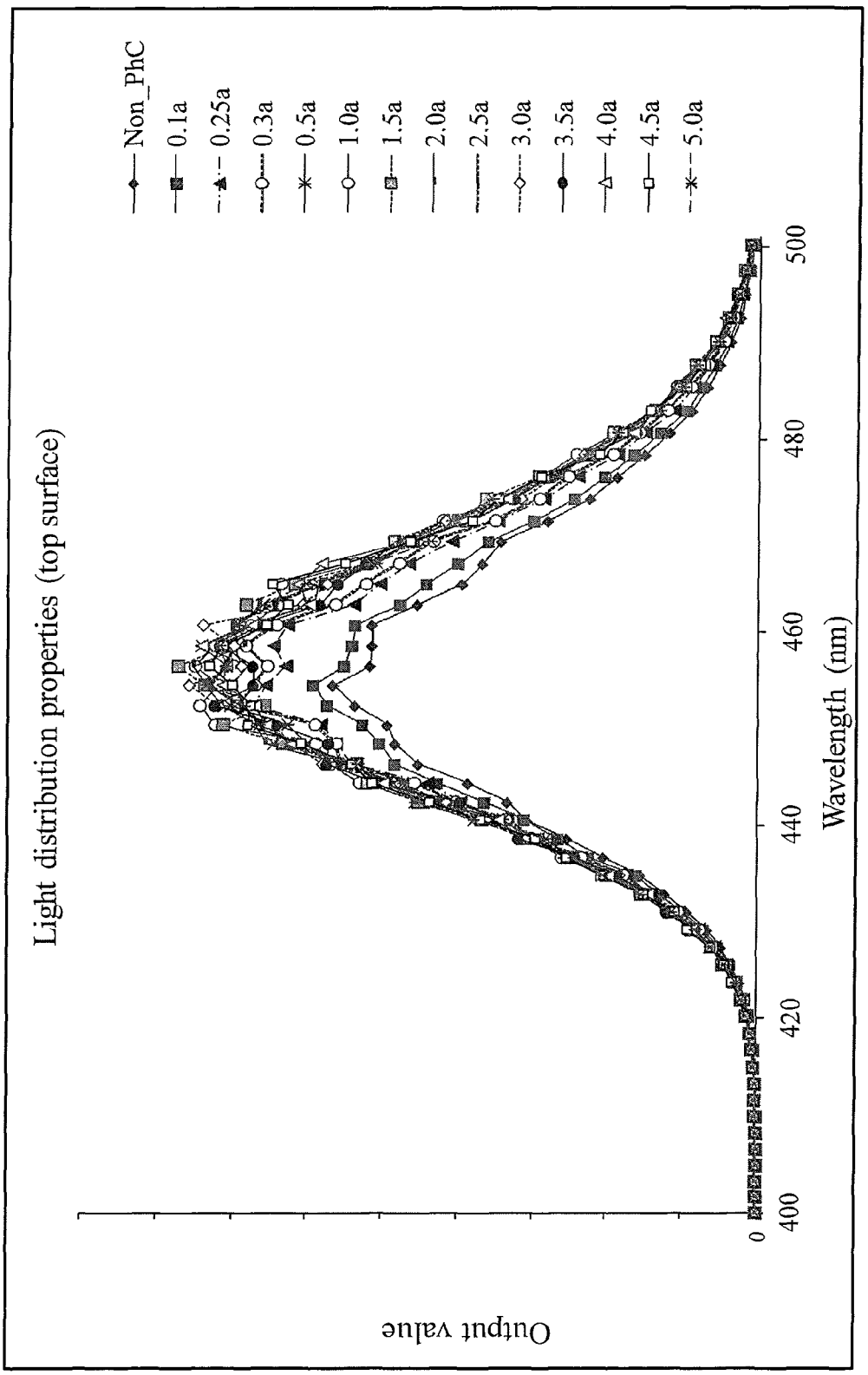
FIG. 39 is a view illustrating the output vs. wavelength characteristics (of the top front surface), and is a view illustrating the output value detected with a monitor arranged on the top front surface and the wavelength dispersion.
Figure 40:
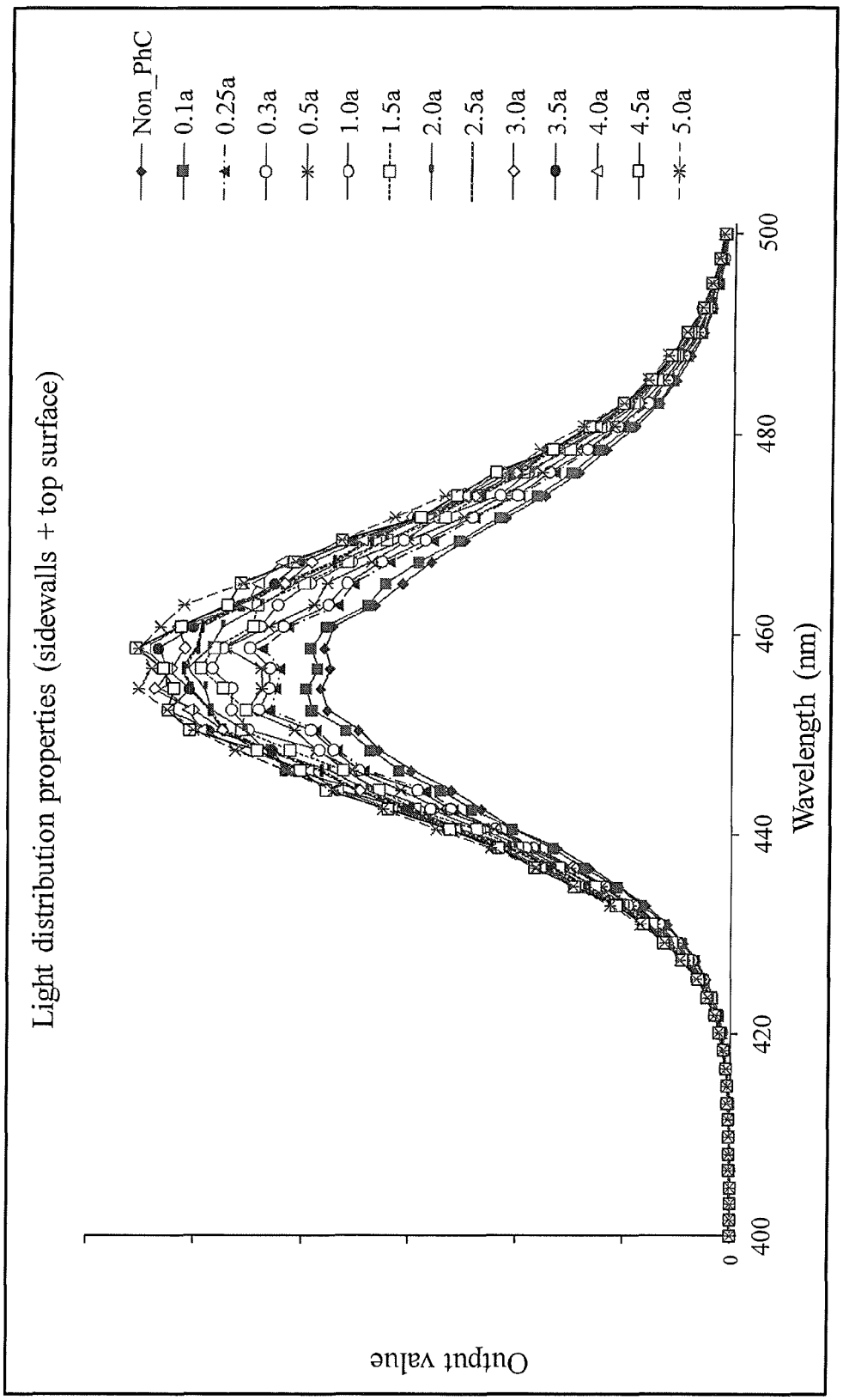
FIG. 40 is a view illustrating the output vs. wavelength characteristics (of the sidewalls+top front surface), and is a view illustrating the total value of outputs detected with monitors on the four sidewalls and the top front surface and the wavelength dispersion.

Likewise, FDTD simulation for a blue LED structure was conducted. FIG. 37 shows the structure thereof. The analysis results shown in FIGS. 38 to 40 were obtained through analysis with the plane wave expansion method and the FDTD method through steps S1 to S8 in FIG. 29 in the same way as the above. The center wavelength is 455 nm, and the periodic structure of the photonic crystals has a period a=415 nm, a diameter d=299 nm, and an order m=4. The output values detected on the sidewalls and the top front surface represent the light distribution properties, and light detected on the top front surface represents the luminance of the front surface.

Figure 41:
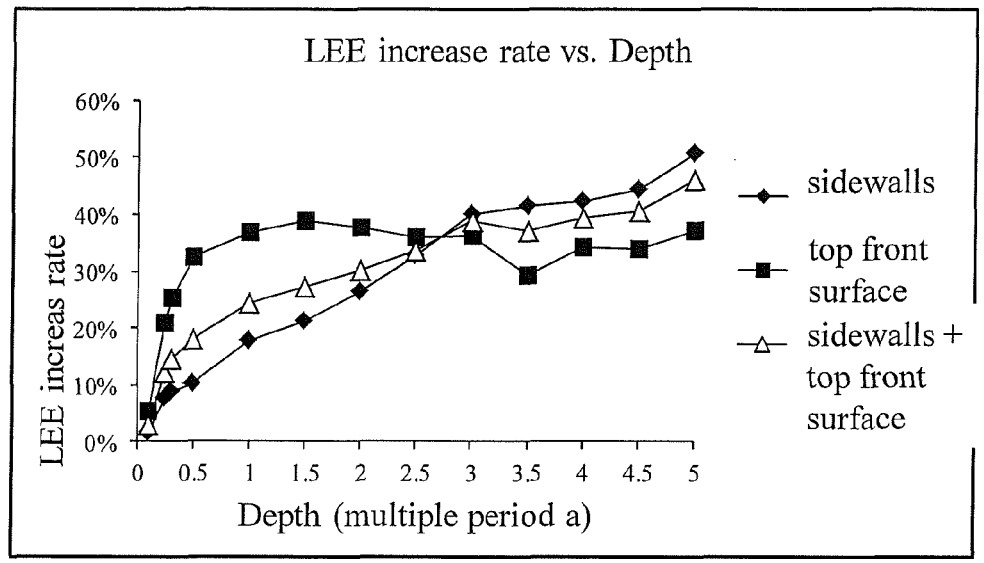
FIG. 41 is a view illustrating the LEE increase rate vs. depth characteristics, and describing data on the sidewalls, the top front surface, and the sidewalls+top front surface.

The mainstream structure of the actual blue LED element is a face-up structure. In this case, the bottom portion is fixed to a seat. Thus, light is extracted from the sidewall portions and the top front surface. FIG. 41 illustrates the relationship between the LEE increase rate of each of the sidewalls, the top front surface, and the sidewalls+top front surface and the depth h.

Figure 42:
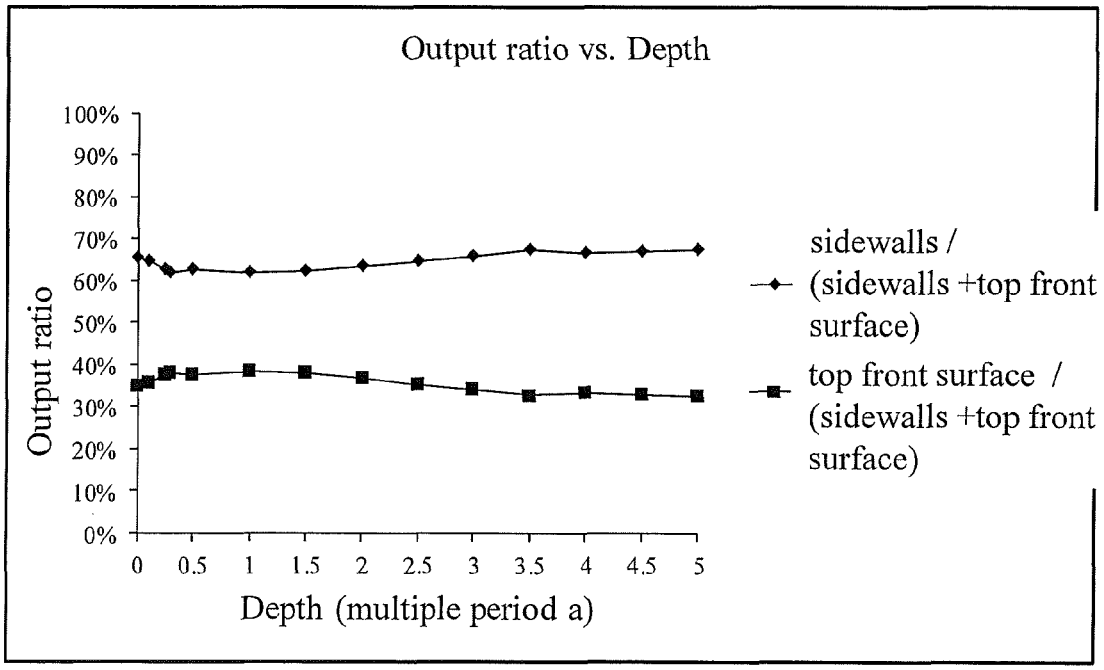
FIG. 42 is a view illustrating the output ratio vs. depth characteristics, and describing data on the sidewalls/(the sidewalls+the top front surface) and on the top front surface/(the sidewalls+the top front surface).

As is apparent from FIG. 41, the LEE increase rate of the sidewalls increases substantially in proportion to the depth h when at least the depth h is in the range of 0.5a to 5.0a. Thus, the LEE increase rate of the sidewalls+the top front surface, that is, the LEE increase rate of the entire LED element increases substantially in proportion to the processing depth h of the photonic crystal periodic structure without being greatly influenced by the correlation between the depth h and the LEE increase rate of the top front surface. In addition, the output ratio vs. depth characteristics of the sidewalls and the top front surface are roughly 35:65 as shown in FIG. 42.

Figure 43:
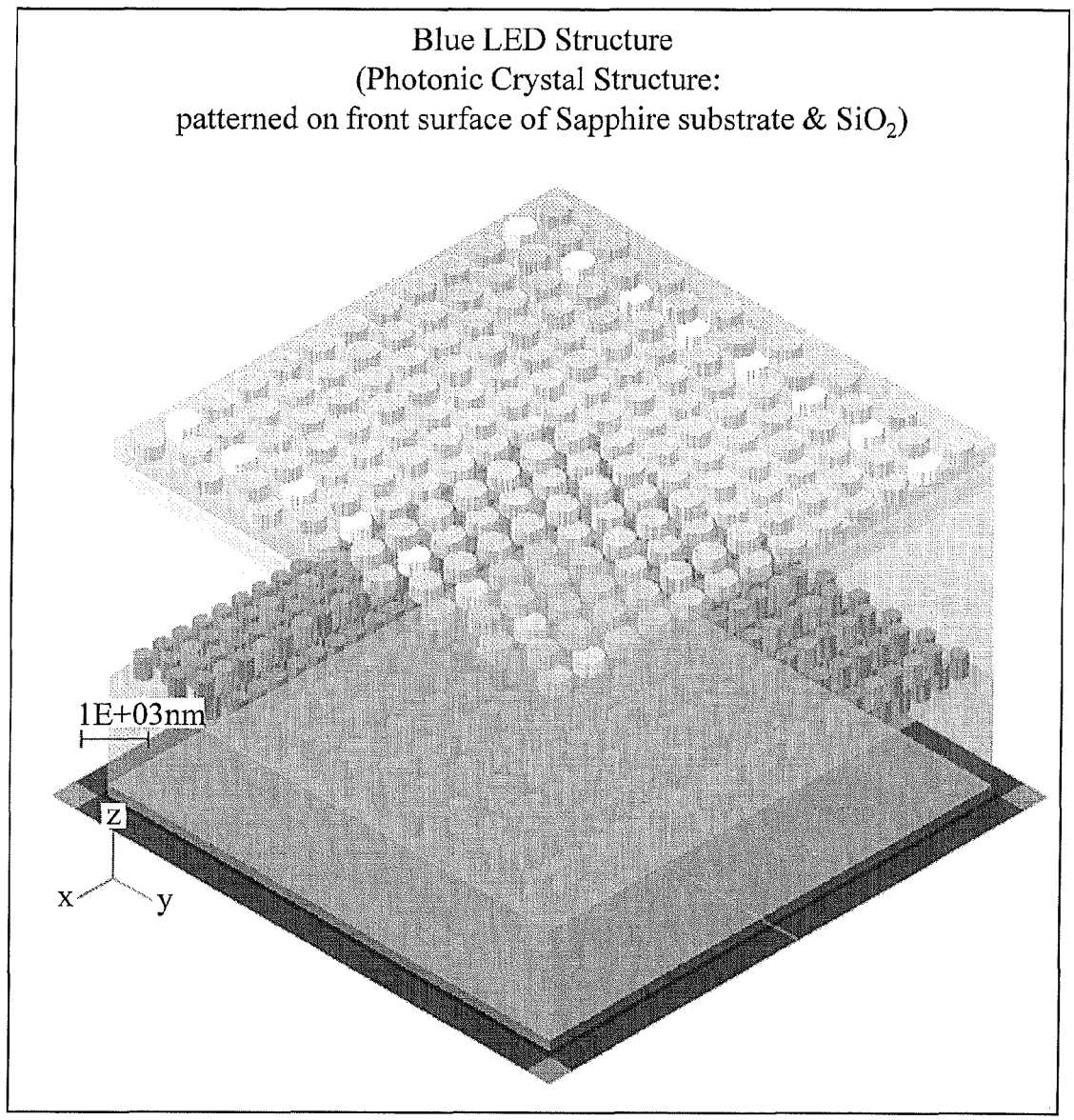
FIG. 43 is a view illustrating the FDTD simulation model (of a blue LED) shown in FIG. 37, in which photonic crystals are formed on two surfaces that are the front surface of the sapphire substrate and $SiO_2$.

Further, FIG. 43 illustrates a model of simulation conducted by adding photonic crystals on a SiO₂ protective film with a blue LED structure. The pattern of each photonic crystal on the front surface of the substrate has a pillar shape with a diameter of 299 nm, a period of 415 nm, and a depth h of 1.0 times the period a, and the pattern of each photonic crystal on the SiO₂ protective film has a hole shape with a diameter of 499 nm, a period of 713 nm, and a depth h of 260 nm as it is limited to be within the thickness (300 nm) of the SiO₂ protective film. Table 6 shows the LEE increase rate.

TABLE 6

|  | Sidewalls | Bottom Front Surface | Sidewalls + Bottom Front Surface |
|---|---|---|---|
| Pillar 1.0a | 18% | 37% | 24% |
| Pillar 1.0a + Hole 260 nm | 17% | 45% | 27% |

From the results in Table 6, it is seen that when photonic crystals are formed through processing on two surfaces that are the front surface of the sapphire substrate and the SiO₂ protective film, the LEE increase rate of the entire LED element has further increased by 3 points, that is, up to 27%, in comparison with when photonic crystals are formed through processing only on the front surface of the substrate.

Next, a manufacturing process for a photonic crystal-mounted LED will be described.

EXAMPLES

Example 1

FIGS. 18 to 22 are views exemplary illustrating part of a manufacturing process for the semiconductor light emitting element (LED) shown in FIG. 1 (procedures for creating a photonic crystal structure).

First, as shown in FIG. 18, a quartz die (i.e., a master mold) 100 for creating a periodic structure is prepared. A die pattern 103 of a substrate 101 has an R/a of 0.3, a diameter of 155 nm, a period of 263 nm, and a depth of 361 nm.

The photonic crystal processing on the sapphire substrate is performed by patterning a resist through nanoimprinting, and dry-etching the sapphire through ICP etching using the resist as a mask. By the way, performing fine patterning on the order of 100 nm involves the use of a stepper such as KrF, which is problematic in that the cost will increase and failures may occur during exposure if the substrate is warped.

Meanwhile, in the nanoimprinting step, if the sapphire substrate or the nitride semiconductor layer is warped, there is a possibility that the die pattern may become damaged if pressurization and UV transfer are directly performed on the resist on the sapphire substrate using the quartz die. Thus, as shown in FIG. 18, herein, a method of (b) creating a film (resin) mold 110 (111 and 113) once, and transferring a pattern 125 to a resist 123 applied to a sapphire substrate 121 using the film mold 110 was adopted. FIGS. 18 (d) to (g) are SEM photographs showing the actual pattern shapes.

Figure 19:
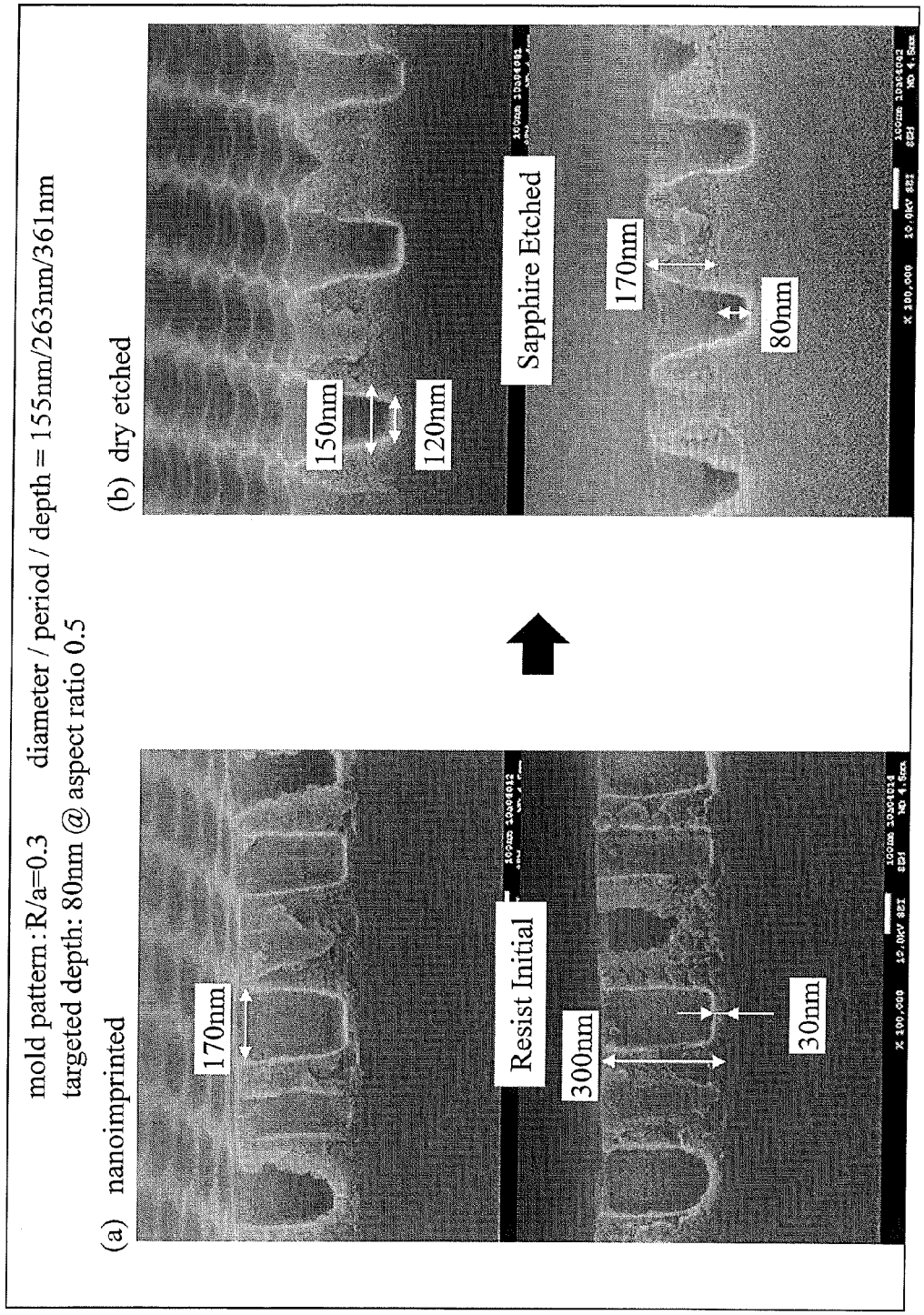
FIG. 19 is a view illustrating an exemplary manufacturing process for the semiconductor light emitting element (LED) shown in FIG. 1.

According to such a method, it becomes possible to perform transfer that can sufficiently accommodate warping of the substrate and minute protrusions. Etching of the sapphire after transfer of the pattern is performed through ICP etching as shown in FIGS. 19 and 20, but high-accuracy processing is quite difficult to perform. Single-crystalline sapphire will not dissolve in either acid or alkali, and the etch selectivity of a resist to sapphire is often insufficient. Typically, the selectivity is about 0.5 to 0.7 when a common photoresist for exposure is used. In addition, in the UV thermosetting nanoimprinting, the fluidity of a resist and the selectivity of the resist after it is cured are in a trade-off relationship, and the selectivity is less than or equal to 0.5, which is not sufficient.

In Example 1, optimization of the die pattern, optimization of resist patterning through nanoimprinting, and optimization of sapphire processing through ICP dry etching are conducted. Then, as shown in FIG. 18, a pattern of photonic crystals that is a triangular lattice arrangement of air holes and has an aspect ratio of 0.5 to 1.0 as designed can be obtained on the rear surface of the sapphire substrate, and thus, a process technology can be established (e.g., a diameter of 127 nm/a period of 252 nm/a height of 359 nm).

When a cross section of the actually dry-etched photonic crystals is observed, it is seen that the cross-section is not a perfect rectangle, and has a taper angle of about 75° to 80° as shown in FIG. 18. Since a cross-section in the simulation is a perfect rectangle, there is a slight change in the numerical value.

Figure 23:
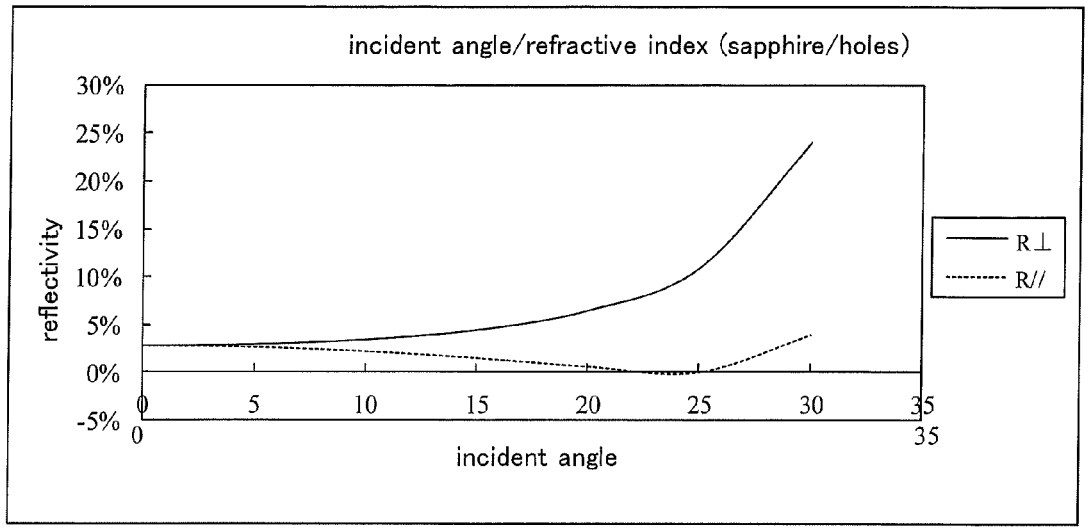
FIG. 23 is a view illustrating a graph of the incident angle/refractive index when holes are formed in sapphire through photonic crystal processing.

FIG. 23 is a view illustrating a graph of the incident angle/refractive index when holes are formed in sapphire through photonic crystal processing. When the cross-section of photonic crystals is a perfect rectangle, it is seen that a reflection of about 3 to 5% is generated. This is because a sudden change in refractive index is generated at the interface between the air and the sapphire (in this case, the average refractive index is computed as 1.4 at an R/a of 0.4), and thus light is partially reflected. Meanwhile, when protrusions/recesses have a taper angle in a period that is close to the wavelength, it is felt for the light as if the refractive index gently changes from the sapphire toward the air. Thus, since there is no interface at which the refractive index suddenly changes, light will not be reflected, and thus, the luminance will increase correspondingly.

Figure 24:
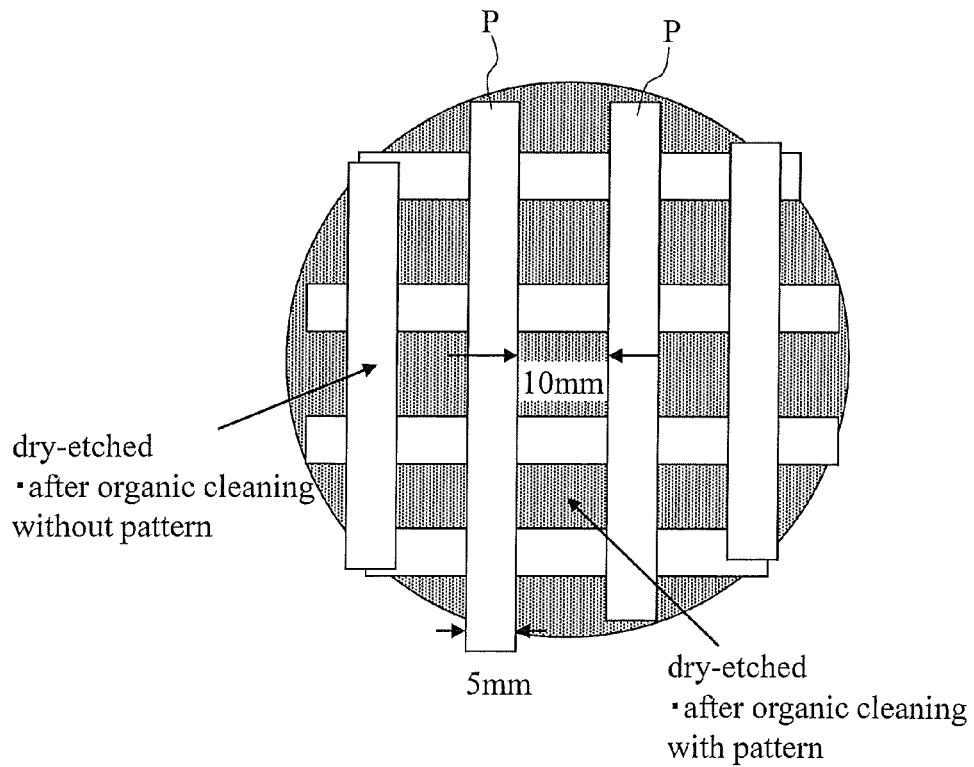
FIG. 24 is a view illustrating the state in which dry etching is conducted with a polyimide tape P attached in a lattice shape in a wafer.

It should be noted that in the dry etching process, as shown in FIG. 24, dry etching is performed with a polyimide tape P attached in a grid pattern in a wafer. A region with the polyimide tape P attached thereto is not dry-etched, and a resist pattern will disappear when organic cleaning is performed. This is in order to, in creating and evaluating a LED later after the crystal growth, observe the difference in luminance due to the presence or absence of a photonic crystal pattern through comparison in the wafer.

Next, the substrate after the dry etching is cleaned to be put into a state ready for the epitaxial control. After that, crystal growth is performed with a recipe that describes a set of predetermined growth conditions, using a MOCVD method, for example. Electrodes are formed on the substrate after the crystal growth, and the element is divided to measure the wavelength and the luminance of LED using an integrating sphere.

Figure 28:
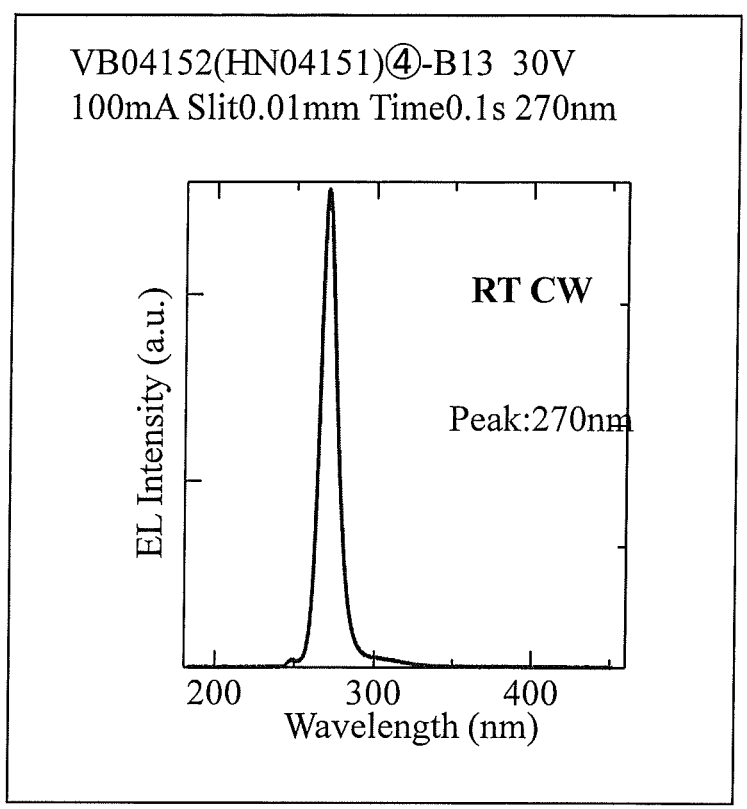
FIG. 28 is a spectral view illustrating the wavelength distribution of light emitted from an active layer of a LED.

The wavelength of light emitted from the active layer of the LED is 270 nm, and FIG. 28 shows the spectrum thereof. FIG. 26 are views illustrating the measurement results in Example 1. In FIG. 26, the presence or absence of a photonic crystal pattern is represented in terms of the I-V, I-L, and EQE characteristics (where I denotes current, V denotes voltage, L denotes output, and EQE denotes the external quantum efficiency).

TABLE 7

| Period (nm) | Mold R/a | Top Portion Diameter (nm) | Bottom Portion Diameter (nm) | Depth (nm) | Average R/a after DE |
|---|---|---|---|---|---|
| 263 | 0.3 | 150 | 120 | 80 | 0.257 |
| 263 | 0.3 | 150 | 70 | 160 | 0.209 |

As shown in Table 7, the average R/a after dry etching (DE) of holes after dry etching is smaller than R/a of the die. Thus, the average R/a after the DE is used to evaluate the luminance.

In Table 1, the photonic band gap is sufficiently open if the average R/a after the DE is 0.257, and thus the effect of luminance is expected. However, in the measurement result of when the depth is 80 nm, correlation was not observed regardless of the presence or absence of a photonic crystal pattern. This is considered to be due to a factor of the depth direction. Meanwhile, when the depth is 160 nm, the average R/a after the DE is 0.209, and it is uncertain if the photonic band gap in Table 1 opens or not. However, a slight correlation is found between the presence and absence of a photonic crystal pattern. The output has increased by about 10%. Since there is also a possibility that the depth direction also has a slight influence, determination is made from a result of comparison with Example 2 below.

Example 2

Figure 21:
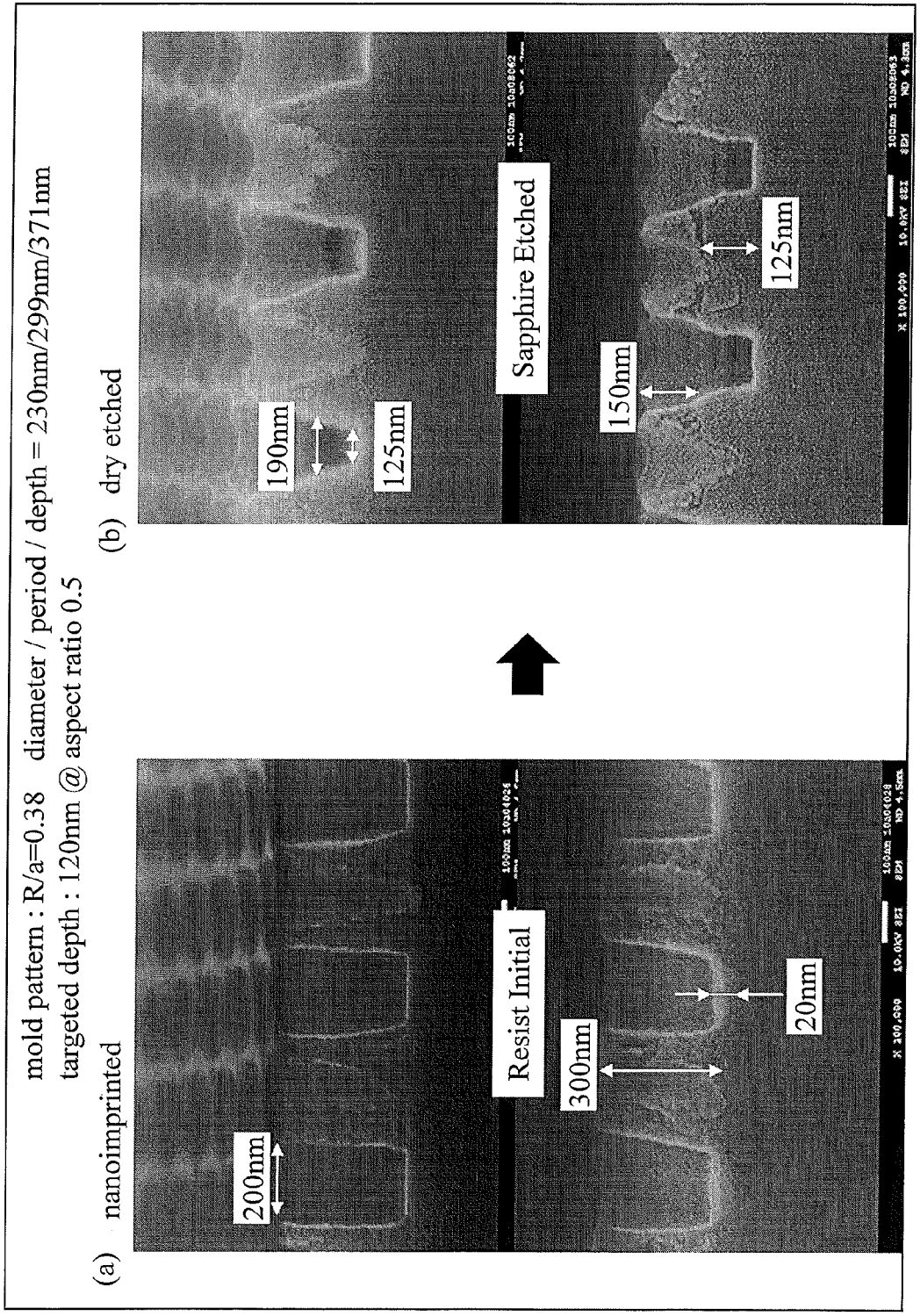
FIG. 21 is a view illustrating an exemplary manufacturing process for the semiconductor light emitting element (LED) shown in FIG. 1.
Figure 22:
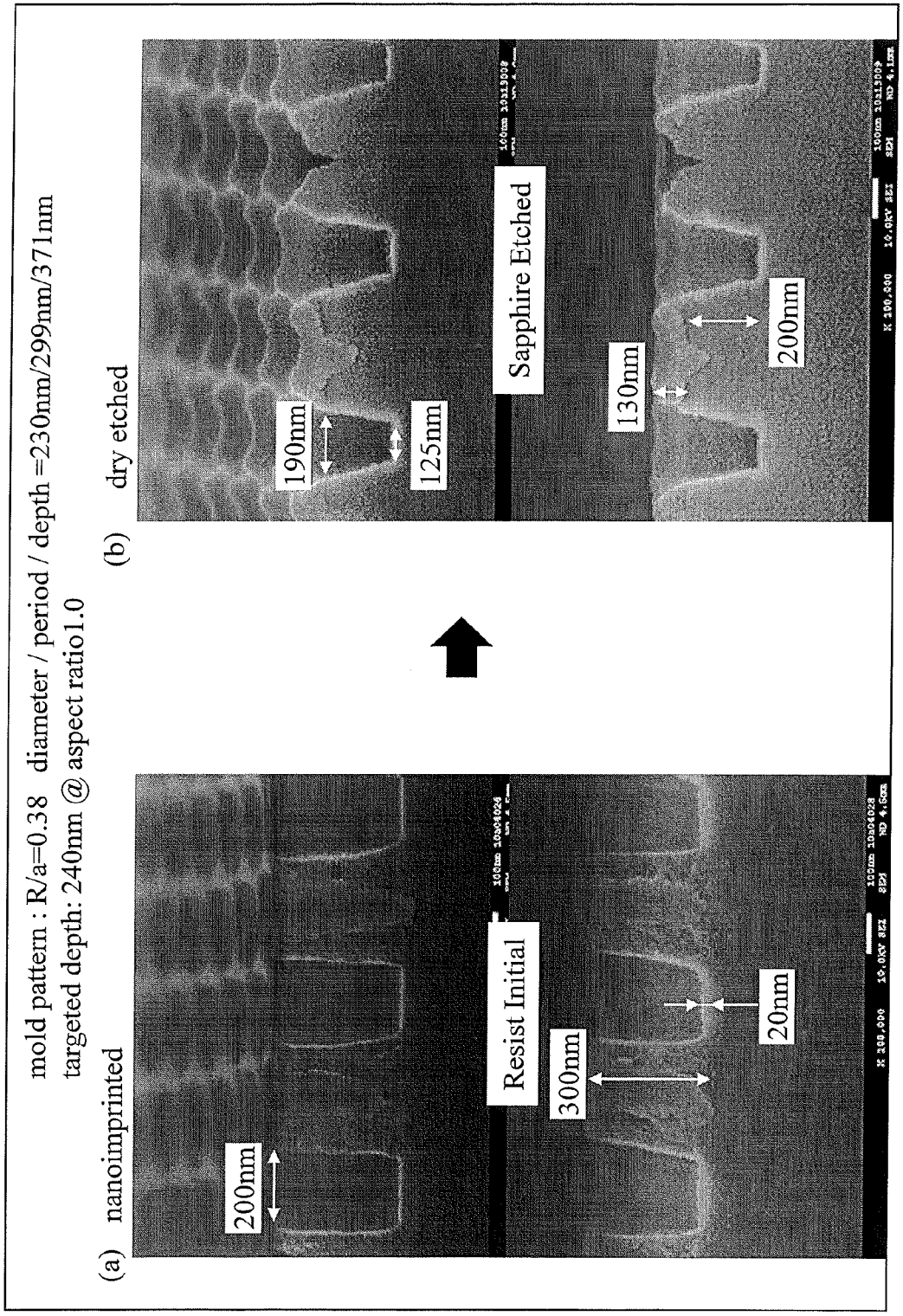
FIG. 22 is a view illustrating an exemplary manufacturing process for the semiconductor light emitting element (LED) shown in FIG. 1.

Likewise, a quartz die 100 is prepared as shown in FIG. 18. The die pattern 103 has an R/a of 0.38, a diameter of 230 nm, a period of 299 nm, and a depth of 371 nm. As in Example 1, for the photonic crystal processing of the sapphire substrate, patterning through nanoimprinting is performed, and then, the sapphire is dry-etched through ICP dry etching using a resist as a mask. Then, as shown in FIGS. 21 and 22, it becomes possible to obtain a photonic crystal pattern with an aspect ratio of 0.5 or 0.8, as designed, that has air holes in triangular lattice arrangement on the rear surface of the sapphire substrate, and thus, a process technology was able to be established.

Figure 25:
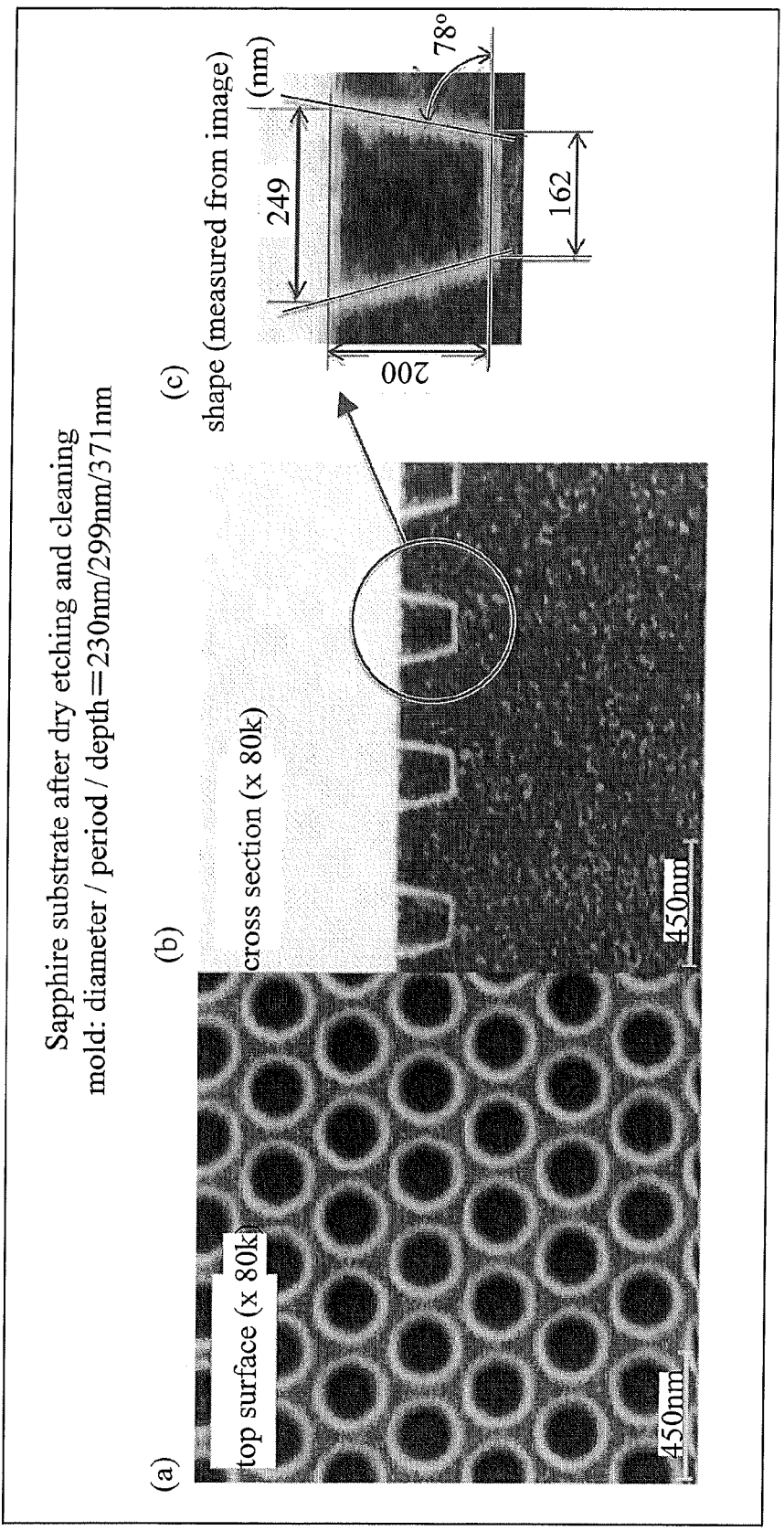
FIG. 25 are views illustrating photographs of the shapes of the top surface and the cross section of a sapphire substrate, respectively, in an epitaxial-growth ready state that has been obtained by washing the dry-etched substrate.

Next, the substrate after the dry etching is cleaned to be put into an epitaxial-growth ready state. FIG. 25 are views illustrating photographs of the shapes of the top surface and the cross section of a sapphire substrate, respectively, in the epitaxial-growth ready state. After that, crystal growth is performed with a predetermined recipe using a MOCVD method. Electrodes are formed on the substrate after the crystal growth, and the element is divided to measure the luminance of the LED using an integrating sphere.

FIG. 27 illustrate the measurement results of LED in Example 2.

TABLE 8

| Period (nm) | Mold R/a | Top Portion Diameter (nm) | Bottom Portion Diameter (nm) | Depth (nm) | Average R/a after DE |
|---|---|---|---|---|---|
| 299 | 0.385 | 190 | 125 | 125 | 0.263 |
| 299 | 0.385 | 190 | 125 | 200 | 0.263 |

First, the value of the average R/a after the DE in Table 8 is 0.263 both when the depth is 125 nm and 200 nm. With such values, it is seen even from Table 1 that the photonic band gap will sufficiently open. Thus, correlation between the presence or absence of photonic crystals and the luminance can be expected. In practice, when the measurement results in FIG. 27 are seen, both when the depth of holes is 125 nm and 200 nm, the luminance increasing effect obtained due to the provision of a photonic crystal periodic structure sufficiently appears. The output value seen in terms of current has increased by about 20% in each case. Regarding the difference in the depth direction, it is also seen that the applied voltage and current, and naturally, the output value are larger when the depth is 200 nm than when the depth is 125 nm.

The top portion diameter and the bottom portion diameter in FIG. 25 are 249 nm and 162 nm, respectively, that are greater than the top portion diameter and the bottom portion diameter in Table 6 by 59 nm and 37 nm, respectively. For dry etching of the sapphire substrate, reactive ion etching is performed using a chlorine gas, and the etching progresses while the bonds between aluminum and oxygen, which are the components of the sapphire, are broken, and the oxygen is reduced. Thus, aluminum is stuck to the etched sidewalls, and consequently, the top portion and bottom portion diameters immediately after the dry etching are measured to be a little large. Assuming that the amount of the substance stuck to the sidewalls is proportional to the etching time, the results in Tables 7 and 8 that are corrected are shown in Table 9.

TABLE 9

| Period (nm) | Mold R/a | Top Portion Diameter (nm) | Bottom Portion Diameter (nm) | Depth (nm) | Average R/a after DE |
|---|---|---|---|---|---|
| 263 | 0.3 | 174 | 135 | 80 | 0.29 |
| 263 | 0.3 | 197 | 100 | 160 | 0.28 |
| 299 | 0.385 | 227 | 148 | 125 | 0.31 |
| 299 | 0.385 | 249 | 162 | 200 | 0.34 |

To sum up the correction results in Table 9 and the results in Examples 1 and 2, it was found that substantial proportional correlation exists between the magnitude of the photonic band gap and the light extraction efficiency, and further, the correlation is more effective when the value of the depth direction is about equal to the value of the diameter.

From the results obtained so far, it was found that when the sapphire substrate is dry-etched, the shape of the die and the shape of the substrate after removal of the resist residue after the dry etching have etching bias values. In order to obtain effects as designed, the results of simulation conducted for when a master mold is created by correcting the etching bias values are shown in Table 10, assuming a case where the period is 299 nm and the die has an R/a of 0.385.

TABLE 10

| (nm) | Period | Top Portion Diameter | Intermediate Diameter | Bottom Portion Diameter | Depth | θ(°) | R/a |
|---|---|---|---|---|---|---|---|
| Design Values of Die | 299 | 267 | 260 | 253 | 390 | 89.0 | 0.435 |

TABLE 10-continued

| (nm) | Period | Top Portion Diameter | Intermediate Diameter | Bottom Portion Diameter | Depth | θ(°) | R/a |
|---|---|---|---|---|---|---|---|
| Shape of Mask Resist | 299 | 230 | 230 | 230 | 351 | 90.0 | 0.385 |
| Shape after Removal of Resist | 299 | 275 | 230 | 185 | 213 | 78.0 | 0.385 |

It was found from Table 10 that the intermediate diameter at a sidewall angle of 78° after removal of the resist residue after the dry etching was 230 nm, and the intermediate diameter of the design values of the die that ensures an R/a of 0.385 was larger than the intermediate diameter after removal of the resist residue by 30 nm, and the sidewall angle of the die should be set to 89.0° to achieve such design values. Accordingly, it was possible to manage the entire process including designing of photonic crystals, creation of a die, selection of a resist, nanoimprinting transfer, and dry etching (i.e., process integration).

According to this embodiment, protrusion/recess portions including two-dimensional photonic crystals with a period that is equal to the wavelength of light in a medium are formed through processing on the rear surface of the sapphire substrate, at the interface between the front surface of the sapphire substrate and the GaN layer, or on the protective film, whereby a band structure is formed for light at the interface, and an energy region (i.e., a photonic band gap) through which light cannot propagate is provided. Light with a wavelength in the photonic band gap cannot propagate through a plane in which a periodic structure is formed, and propagates only in a direction that is perpendicular to the plane. Thus, light that has been emitted from the active layer and arrived at the rear surface of the sapphire substrate, the interface between the front surface of the sapphire substrate and the GaN layer, or the protective film is released to the air without being totally reflected by the interface with the air. Consequently, the light extraction efficiency improves, which results in increased external quantum efficiency and luminance. In addition, a light emitting element with high front surface luminance is obtained.

In the aforementioned embodiment, structures and the like shown in the attached drawings are not limited thereto, and can be adequately changed within the range in which the advantageous effects of the present invention can be achieved. Besides, such structures and the like can be implemented by being adequately changed within the scope of the objects of the present invention.

For example, the present invention also includes the aforementioned designing program, a die designed with the program, and the like. In addition, the periodic structure including different systems (structures) may include not two, but three or more systems (structures). The system may include not only air and crystals, but also two different types of crystals.

In the aforementioned embodiment, structures and the like shown in the attached drawings are not limited thereto, and can be adequately changed within the range in which the advantageous effects of the present invention can be achieved. Besides, such structures and the like can be implemented by being adequately changed within the scope of the objects of the present invention.

Each component of the present invention can be freely selected, and an invention with a freely selected structure is also included in the present invention.

For example, as a material of a LED, the following materials can be used to create light emitting diodes of various colors.

Aluminum gallium arsenide (AlGaAs)—infrared rays/red
Gallium Arsenic Phosphide (GaAsP)—red/orange/yellow
Indium gallium nitride (InGaN)/gallium nitride (GaN)/aluminum gallium nitride (AlGaN)—(Orange/yellow/) green/blue/purple/ultraviolet rays
Gallium phosphide (GaP)—red/yellow/green
Zinc selenide (ZnSe)—green/blue
aluminium gallium indium phosphide (AlGaInP) orange/yellowish orange/yellow/green
Diamond (C)—ultraviolet rays
Zinc oxide (ZnO)—Blue/purple/near ultraviolet rays
The following is used as a substrate.
Silicon carbide (SiC) as a substrate—blue
Sapphire ($Al_2O_3$) as a substrate—blue/ultraviolet rays
Silicon (Si) as a substrate—blue

INDUSTRIAL APPLICABILITY

The present invention is applicable to a semiconductor light emitting element. A deep ultraviolet LED is advantageous for sterilization/water purification purposes, and the process technology is advantageous for mass production.

REFERENCE SIGNS LIST

1 Sapphire substrate
1*a* Rear surface (i.e., light extraction plane) of sapphire substrate 1
3 AlN buffer layer
5 n-type AlGaN layer
7 n-type AlGaN active layer
9 p-type AlGaN layer
15 Photonic crystal periodic structure
15*a* Hole portion
15*b* Rear surface portion of substrate
21 Sapphire substrate
23 n-type GaN layer
25 n-type GaN active layer
27 p-type GaN layer
29 Transparent electrode layer
31 Protective film The present specification incorporates all publications, patents, and patent applications that are cited in the present specification as references.

The invention claimed is:
1. A semiconductor light emitting element comprising, in a light extraction layer thereof, a photonic crystal periodic structure including first and second structures, each of which includes two substructures with different refractive indices formed along a X direction and a Y direction of a XY two-dimensional plane, wherein one of the first and second structures comprises a different material from the material of the other of the first and second structures, a design wavelength λ, a period a, and radius R that determine the photonic crystal periodic structure satisfy Bragg conditions at an interface between the two systems (structures), a ratio (R/a) between the period a and the radius R is a value at which the photonic crystal periodic structure has the maximum photonic band gap, and an order m of the Bragg conditions is an order m (where 1 <m <5) with which light extraction efficiency at the design wavelength λ is determined to be maximum from a result of simulation analysis conducted with a FDTD method.

2. The semiconductor light emitting element according to claim 1, wherein a depth h of the photonic crystal periodic structure is greater than or equal to 0.5 times a period a of the photonic crystal periodic structure.

3. The semiconductor light emitting element according to claim 1, wherein the light extraction layer is one of a substrate of the semiconductor light emitting element or a protective film formed on a surface of the semiconductor light emitting element on a side opposite to the substrate.

4. The semiconductor light emitting element according to claim 3, wherein the photonic crystal periodic structure is formed in a region of the substrate at a given depth position.

5. The semiconductor light emitting element according to claim 3, wherein the photonic crystal periodic structure is formed to include holes that are periodically formed on a rear surface of the substrate.

6. The semiconductor light emitting element according to claim 1, wherein the photonic crystal periodic structure includes two or more photonic crystal periodic structures that are formed in regions of one or more light extraction layers at a given depth position(s).

7. The semiconductor light emitting element according to claim 1, wherein the photonic crystal periodic structure with the photonic band gap is a photonic crystal periodic structure whose period a and diameter d, which are parameters of the structure, are determined by a difference between a dielectric band (a first photonic band) of one of TE light or TM light and an air band (a second photonic band), the dielectric band (the first photonic band) having been determined through computation of eigen values of Maxwell's electromagnetic field wave equations $\Sigma\epsilon^{-1}(G-G')|k+G||k+G'|E(G')=\omega^2/c^2 E(G')$ and $\Sigma\epsilon^{-1}(G-G')(k+G)^*(k+G')H(G')=\omega^2/c^2 H(G)$ (where $\epsilon^{-1}$ denotes an inverse number of a dielectric constant, G denotes a reciprocal lattice vector, ω denotes frequency, c denotes light velocity, and k denotes a wave number vector), the equations have been obtained by expanding a plane wave output from the photonic crystal periodic structure by an electric field E and a magnetic field H.

8. The semiconductor light emitting element according to claim 7, further comprising a photonic crystal periodic structure whose depth h is determined with a FDTD method.

9. The semiconductor light emitting element according to claim 1, wherein the photonic crystal periodic structure of the light extraction layer is formed through processing using a nanoimprinting lithography method.

10. The semiconductor light emitting element according to claim 9, wherein the photonic crystal periodic structure of the light extraction layer is formed through processing using a process of transferring a pattern of a die via a resin mold.

11. The semiconductor light emitting element according to claim 1, wherein the substrate includes sapphire.

12. The semiconductor light emitting element according to claim 1, wherein a semiconductor layer of the semiconductor light emitting element includes a nitride semiconductor.

13. The semiconductor light emitting element according to claim 9, wherein the nanoimprinting lithography method includes the following steps 1) to 3):
   1) in creating a master die for nanoimprinting, creating a resin mold to accommodate warping of the substrate, and transferring a pattern of the resin mold to a resist on the substrate, thereby preventing inversion between a pattern on the substrate and a pattern of the master die;
   2) after the nanoimprinting, performing etching of the substrate through dry etching, wherein the die is created based on a period a, a diameter d, and a depth h, and the resin mold is obtained from the die, and then the pattern is transferred to the resist on the substrate through nanoimprinting, and further, the substrate is dry-etched and a residue of the resist is removed to measure the actual shape; and
   3) creating a master die again by reflecting an etching bias value that is a difference between a measured value of the actual shape and a design value, performing the transfer and the dry etching, and removing a residue of the resist.

* * * * *